(12) United States Patent
Kim et al.

(10) Patent No.: US 11,735,632 B2
(45) Date of Patent: Aug. 22, 2023

(54) SEMICONDUCTOR DEVICE

(71) Applicant: SAMSUNG ELECTRONICS CO., LTD., Suwon-si (KR)

(72) Inventors: Seokhoon Kim, Suwon-si (KR); Dongmyoung Kim, Suwon-si (KR); Kanghun Moon, Hwaseong-si (KR); Hyunkwan Yu, Suwon-si (KR); Sanggil Lee, Ansan-si (KR); Seunghun Lee, Hwaseong-si (KR); Sihyung Lee, Hwaseong-si (KR); Choeun Lee, Pocheon-si (KR); Edward Namkyu Cho, Seongnam-si (KR); Yang Xu, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 17/546,690

(22) Filed: Dec. 9, 2021

(65) Prior Publication Data
US 2022/0102498 A1    Mar. 31, 2022

Related U.S. Application Data

(63) Continuation of application No. 16/806,629, filed on Mar. 2, 2020, now Pat. No. 11,217,667.

(30) Foreign Application Priority Data
Jul. 23, 2019  (KR) .......................... 10-2019-0089217

(51) Int. Cl.
*H01L 29/08*  (2006.01)
*H01L 29/78*  (2006.01)
*H01L 27/088*  (2006.01)
*H01L 29/06*  (2006.01)

(52) U.S. Cl.
CPC ...... *H01L 29/0847* (2013.01); *H01L 27/0886* (2013.01); *H01L 29/0653* (2013.01); *H01L 29/0673* (2013.01); *H01L 29/785* (2013.01); *H01L 29/7853* (2013.01)

(58) Field of Classification Search
CPC .......... H01L 29/0847; H01L 29/78696; H01L 27/0886; H01L 29/66795; H01L 21/823468; H01L 29/42392; H01L 29/0673; H01L 29/0653
See application file for complete search history.

(56) References Cited

U.S. PATENT DOCUMENTS

| | | |
|---|---|---|
| 9,287,382 B1 | 3/2016 | Lee et al. |
| 9,595,611 B2 | 3/2017 | Kim et al. |
| 9,728,645 B2 | 8/2017 | Kim et al. |
| 9,761,719 B2 | 9/2017 | Kim et al. |
| 9,786,783 B2 | 10/2017 | Hafez et al. |
| 9,905,676 B2 | 2/2018 | Kim et al. |

(Continued)

*Primary Examiner* — Changhyun Yi
(74) *Attorney, Agent, or Firm* — Sughrue Mion, PLLC

(57) ABSTRACT

A semiconductor device includes a substrate, a fin structure on the substrate, a gate structure on the fin structure, a gate spacer on at least on side surface of the gate structure, and a source/drain structure on the fin structure, wherein a topmost portion of a bottom surface of the gate spacer is lower than a topmost portion of a top surface of the fin structure, and a topmost portion of a top surface of the source/drain structure is lower than the topmost portion of the top surface of the fin structure.

21 Claims, 53 Drawing Sheets

(56) References Cited

U.S. PATENT DOCUMENTS

| | | | |
|---|---|---|---|
| 10,115,823 B2 | 10/2018 | Ching et al. | |
| 10,163,724 B2 | 12/2018 | Wang et al. | |
| 10,170,370 B2 | 1/2019 | Cheng et al. | |
| 10,204,984 B1 | 2/2019 | Stoker et al. | |
| 10,243,045 B2 | 3/2019 | Yu et al. | |
| 11,217,667 B2* | 1/2022 | Kim | H01L 21/823468 |
| 2014/0151639 A1* | 6/2014 | Chang | H01L 29/0673 |
| | | | 257/27 |
| 2016/0087104 A1 | 3/2016 | Lee et al. | |
| 2017/0148797 A1 | 5/2017 | Kim et al. | |
| 2017/0229558 A1 | 8/2017 | Anderson et al. | |
| 2017/0345911 A1 | 11/2017 | Yu et al. | |
| 2018/0151698 A1 | 5/2018 | Sung et al. | |
| 2018/0175172 A1 | 6/2018 | Chang et al. | |
| 2019/0058052 A1* | 2/2019 | Frougier | H01L 29/0665 |
| 2019/0123163 A1* | 4/2019 | Yang | H01L 21/02603 |
| 2019/0131181 A1* | 5/2019 | Van Dal | H01L 27/0886 |
| 2020/0105889 A1* | 4/2020 | Liaw | H01L 21/823418 |

\* cited by examiner

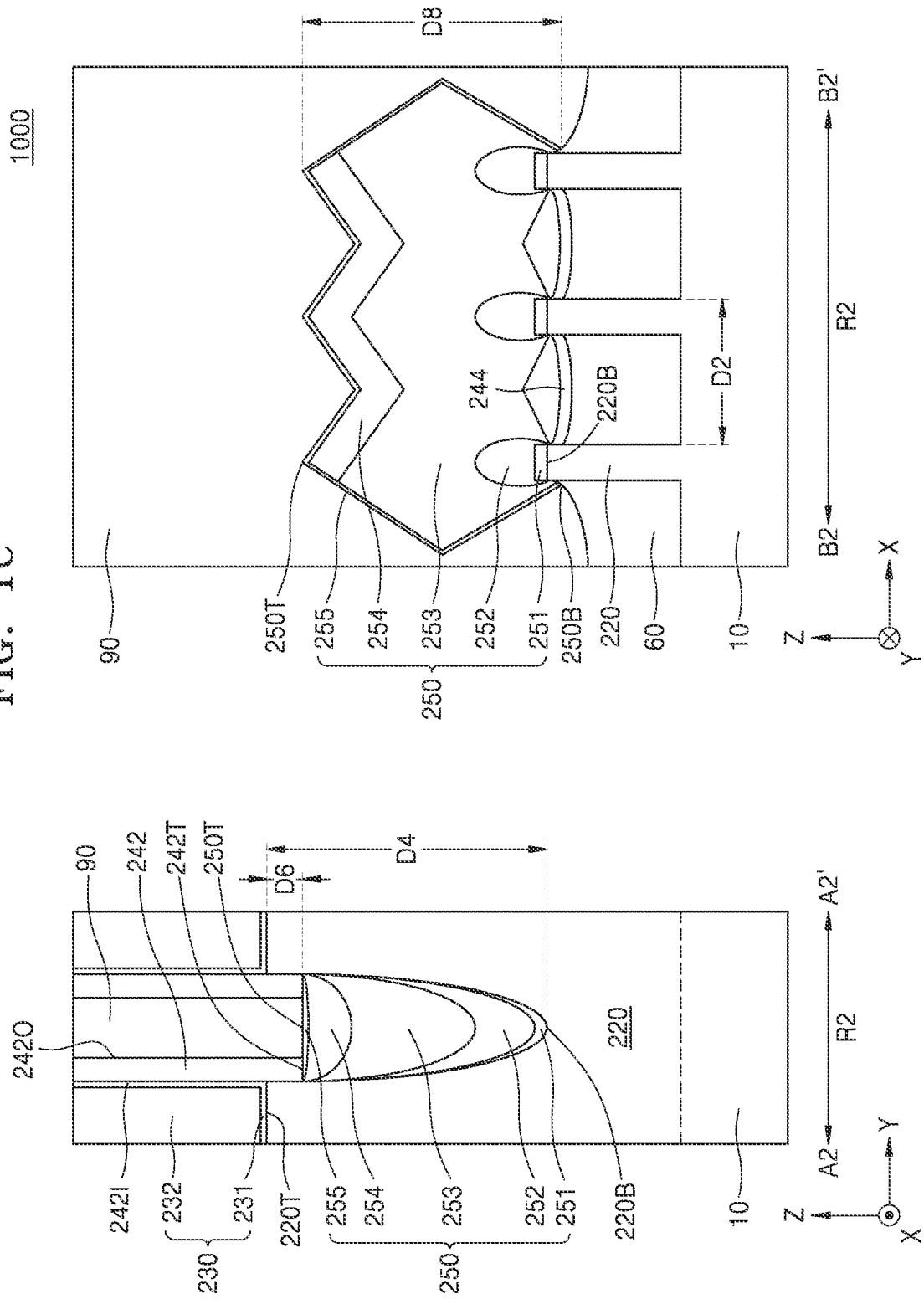

FIG. 2
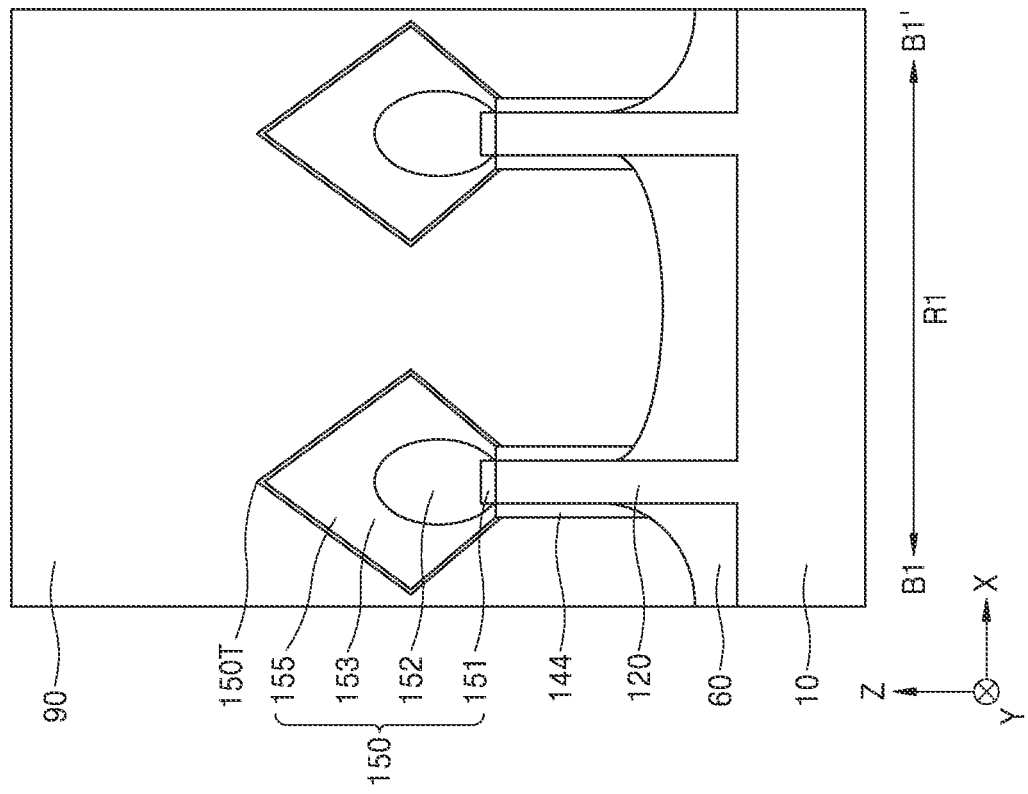
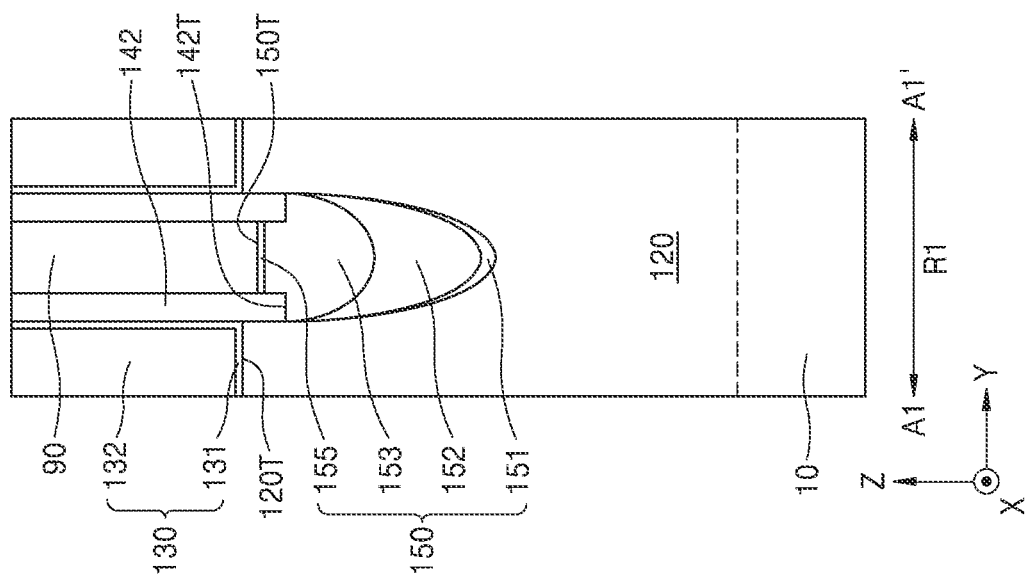

FIG. 3
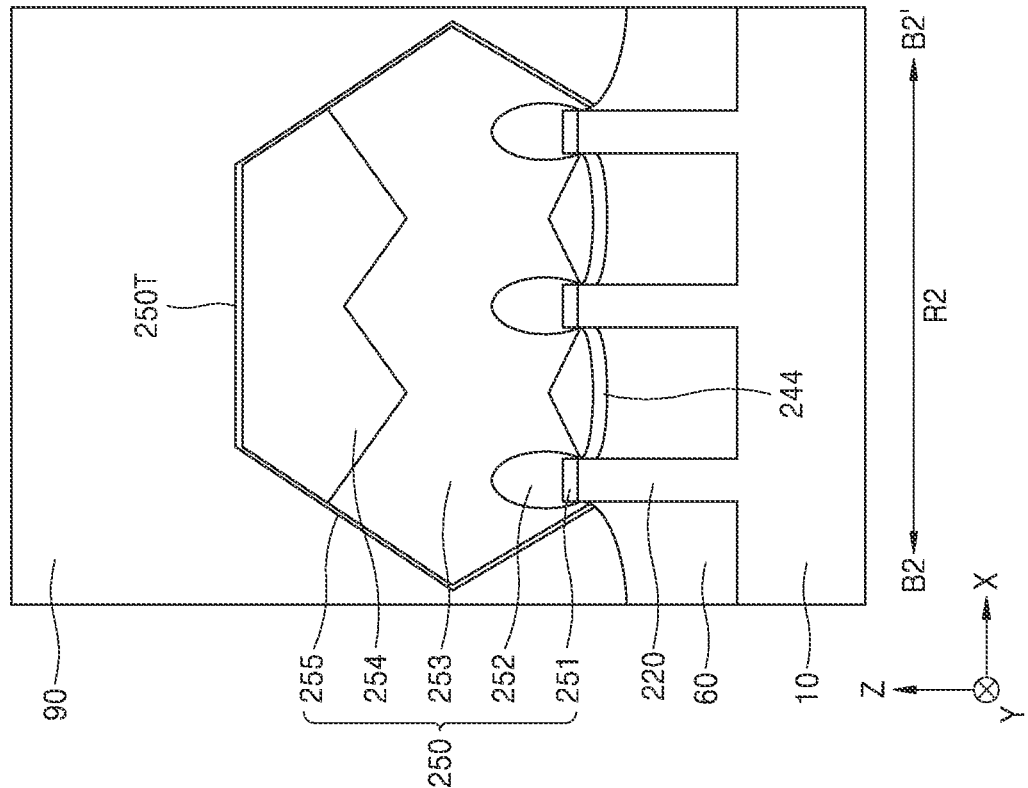
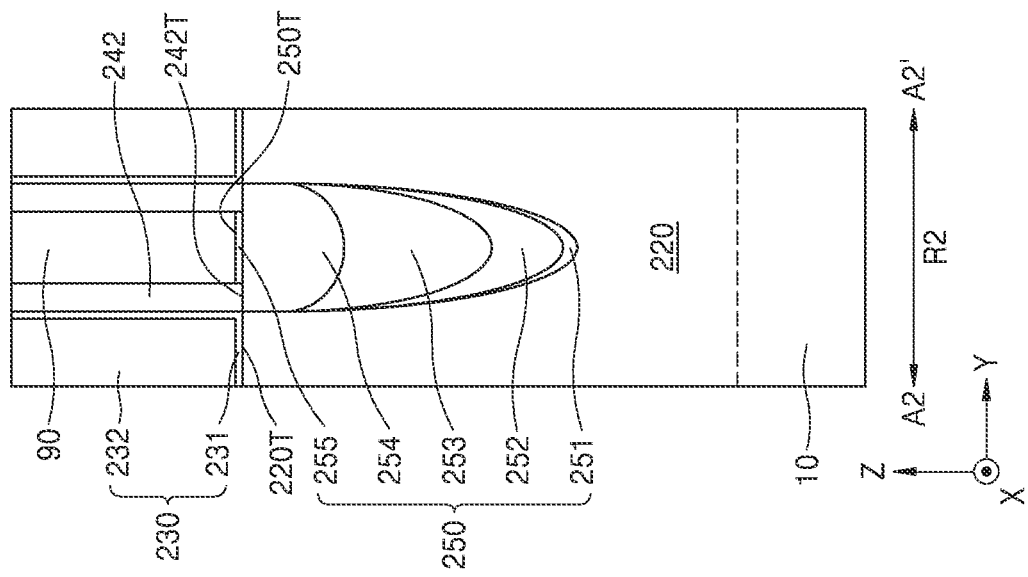

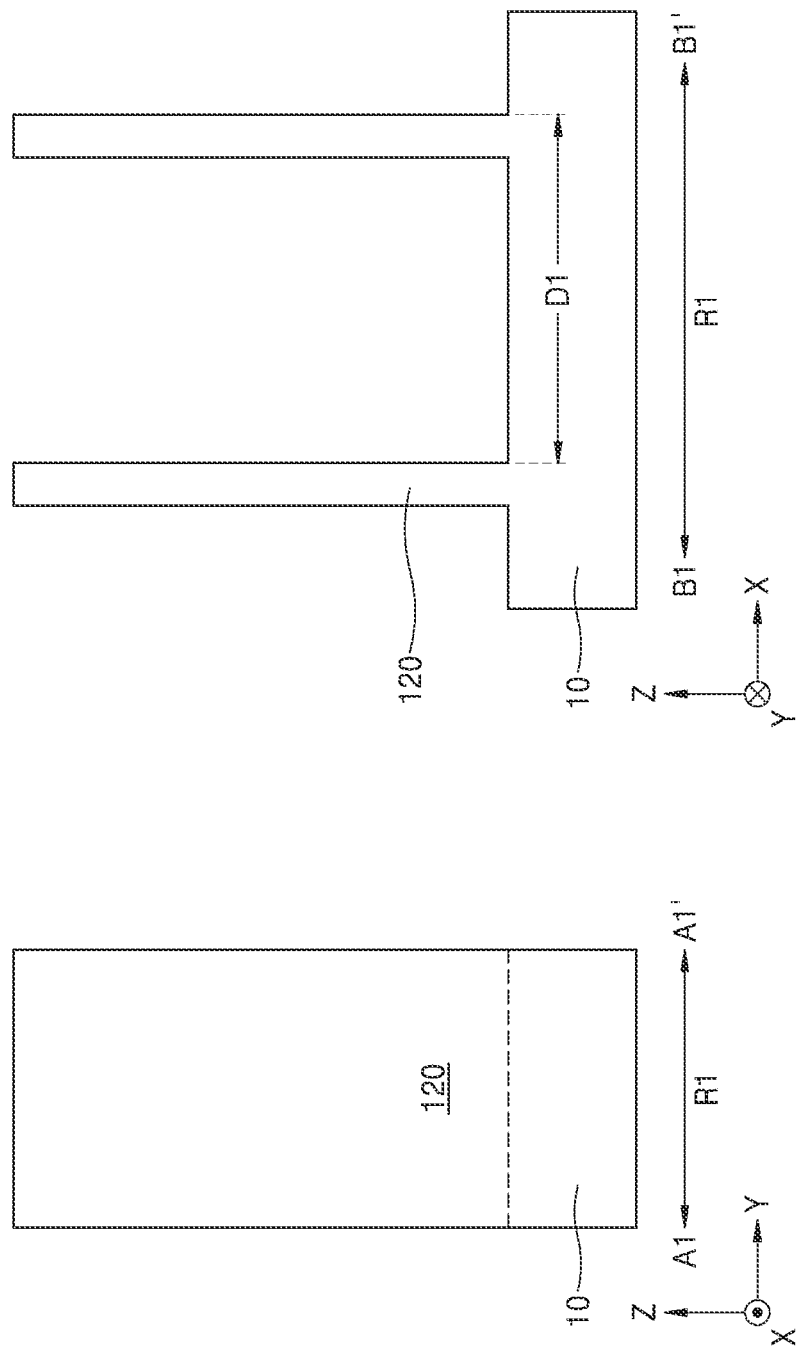

FIG. 7A
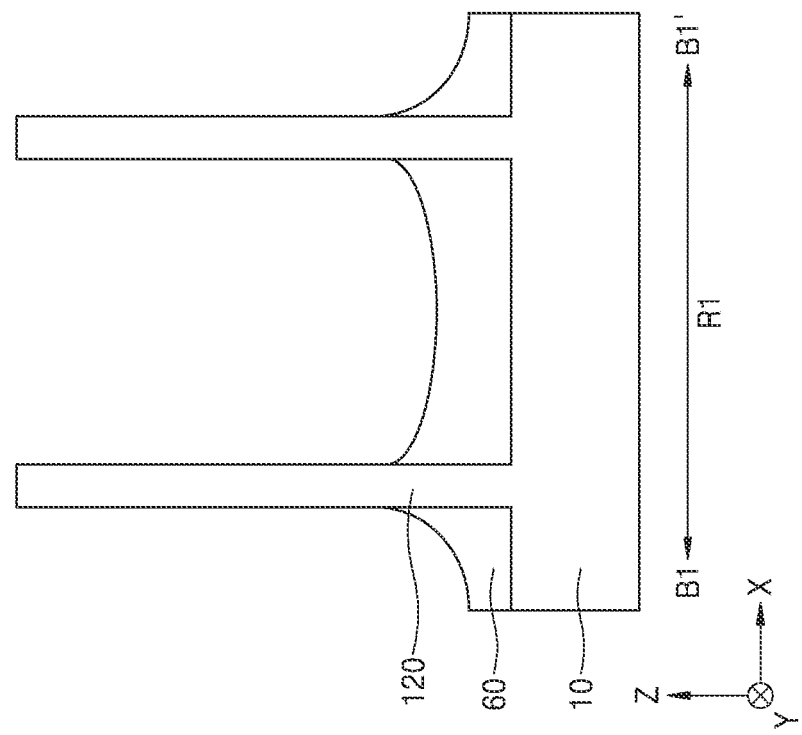
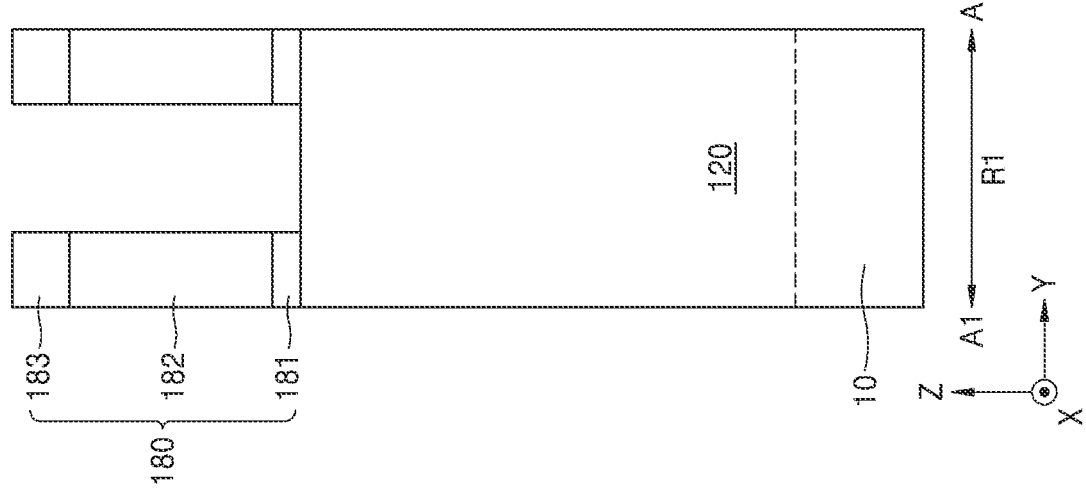

FIG. 8A
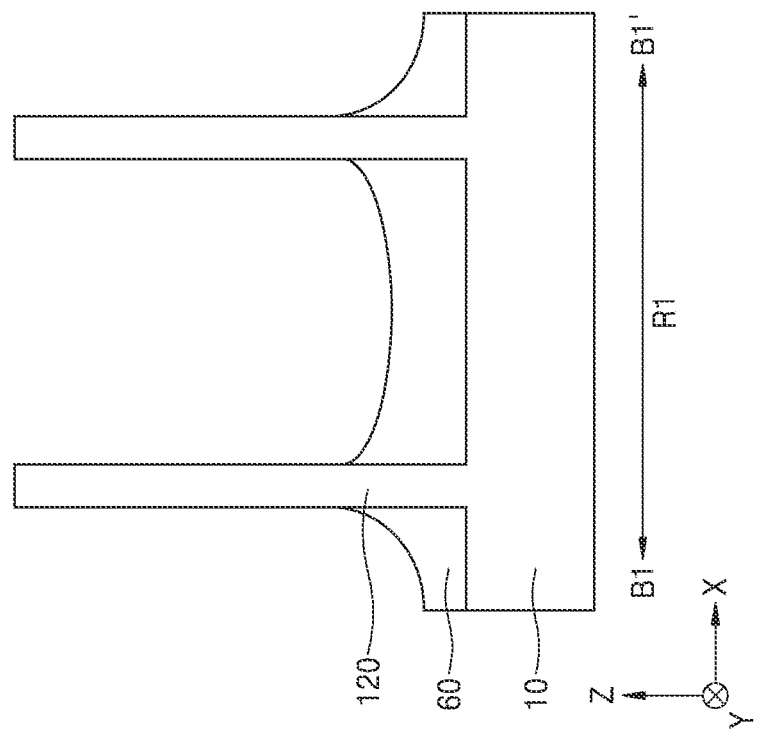
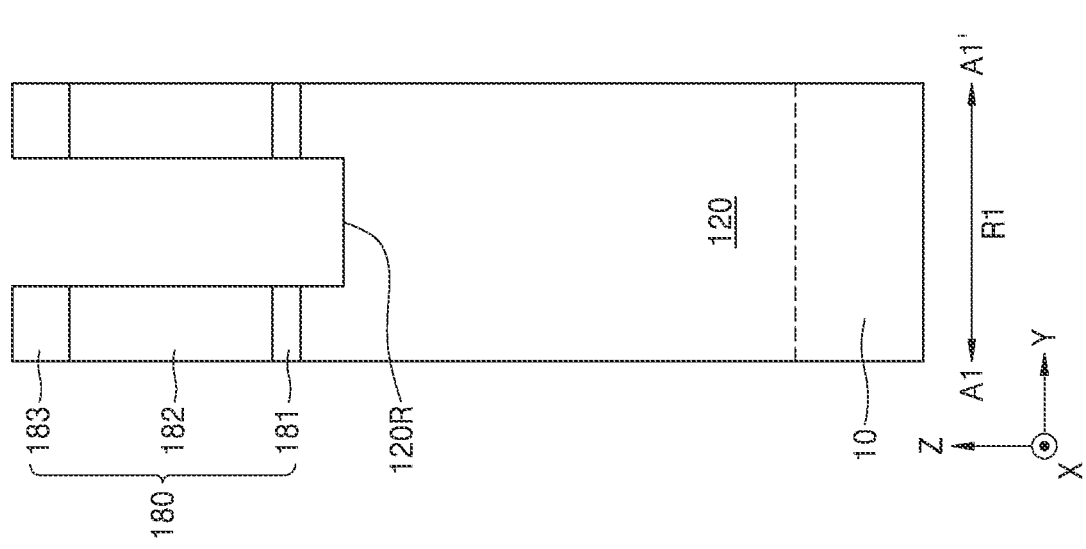

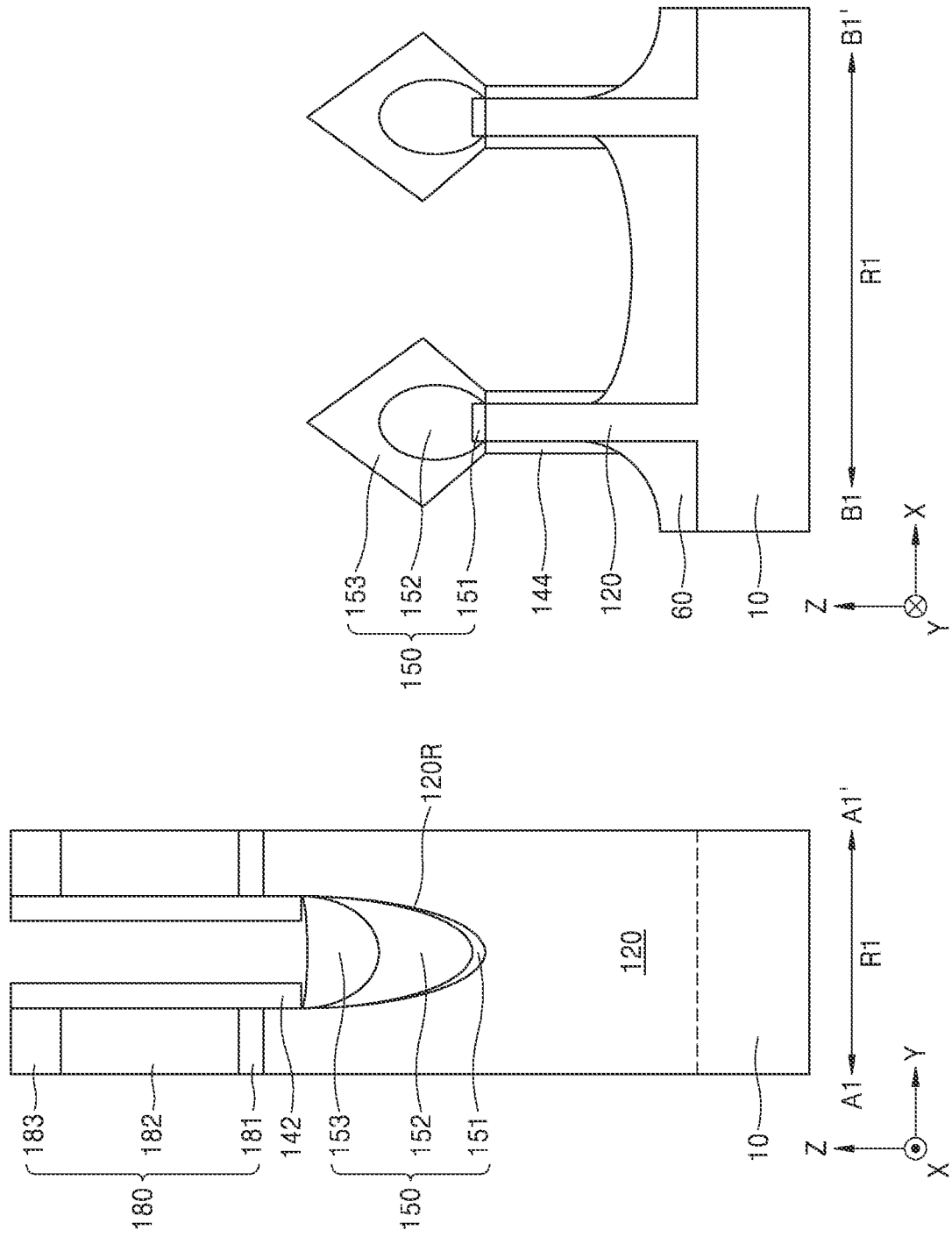

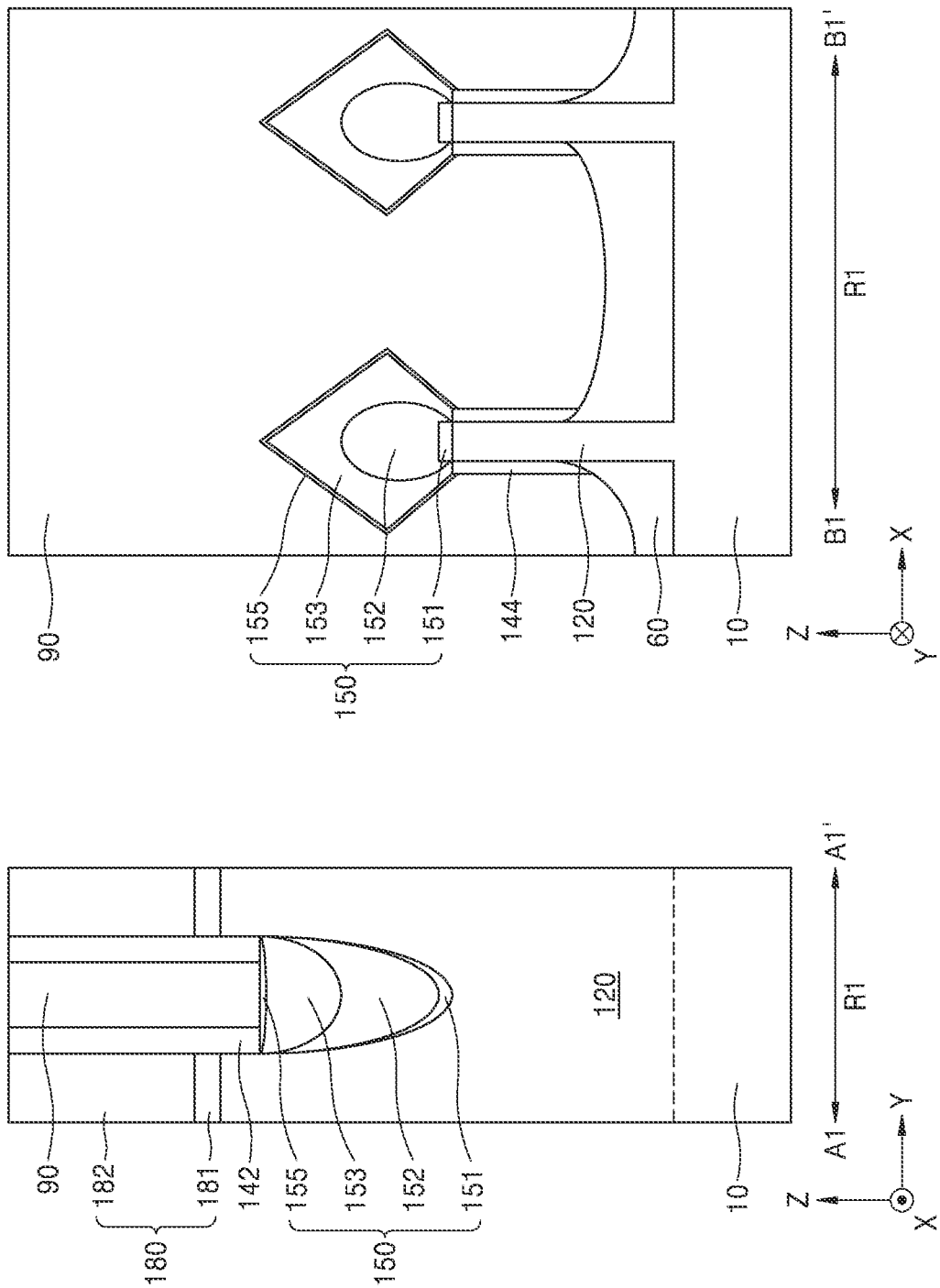

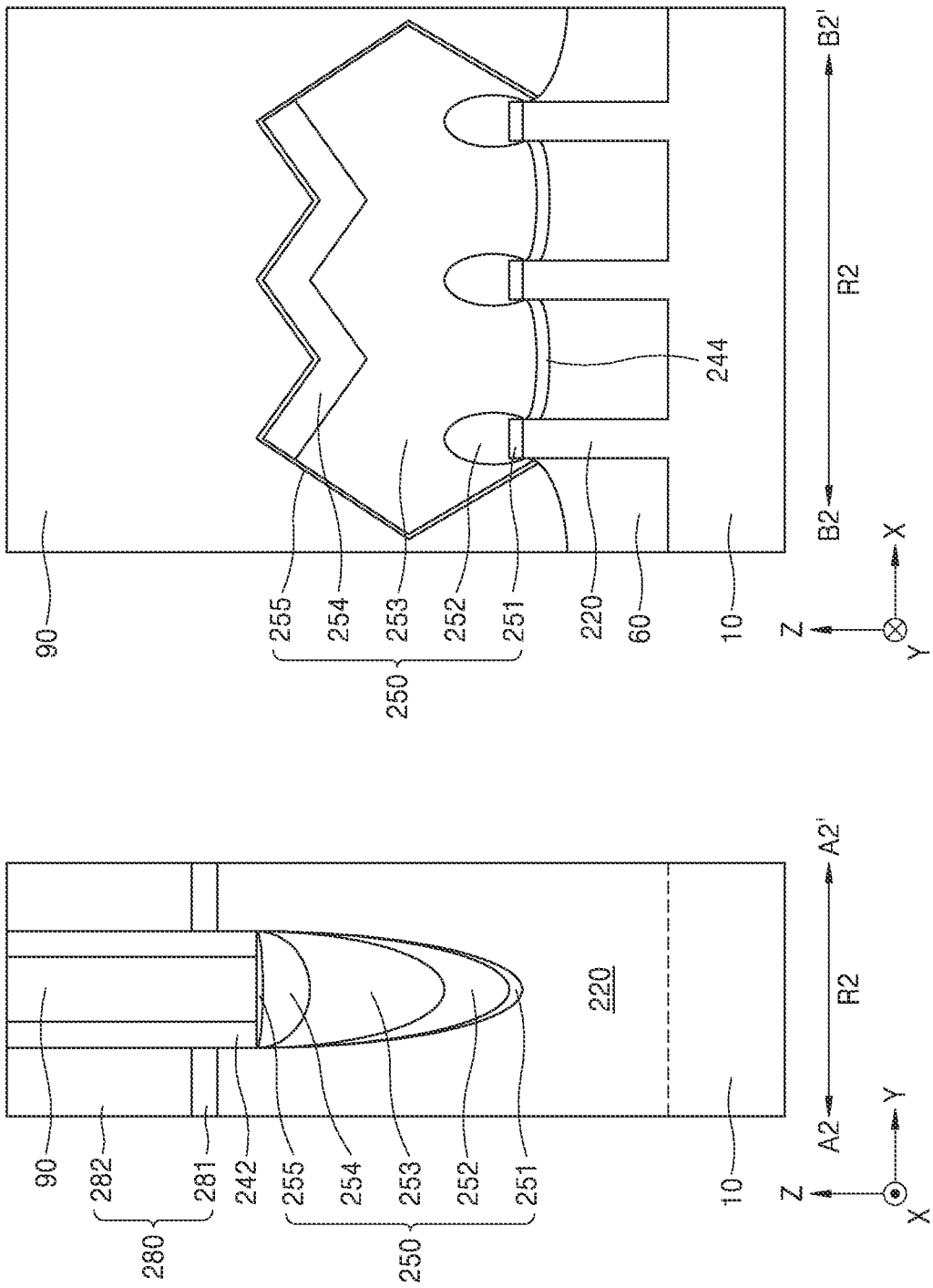

FIG. 14A
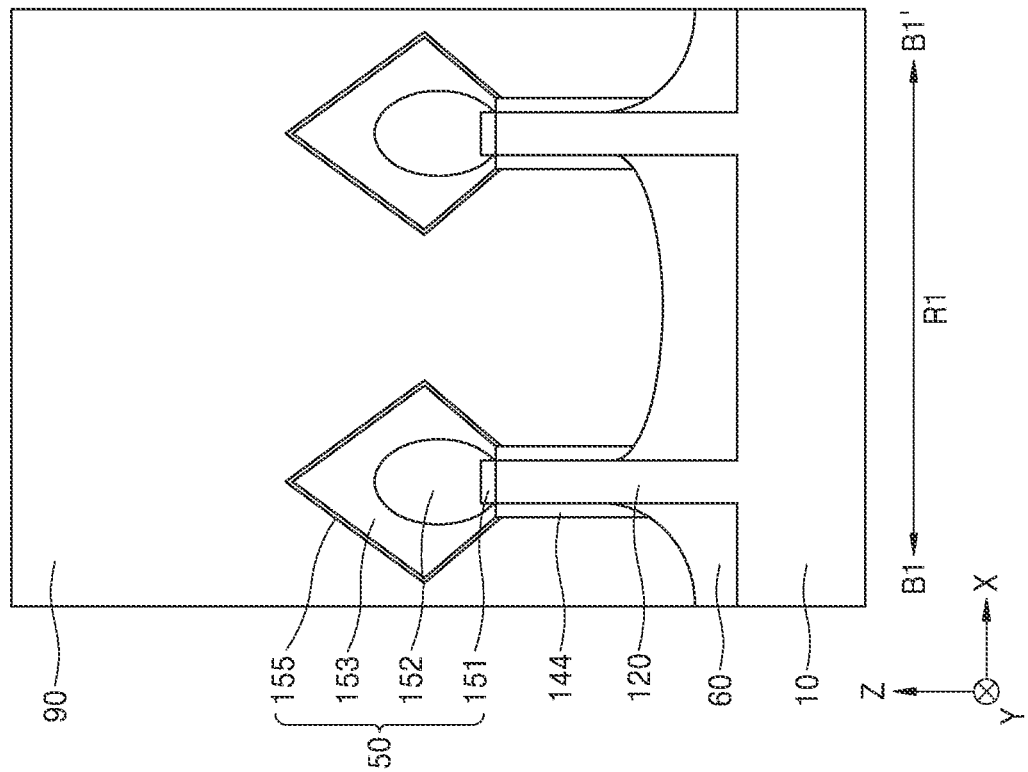
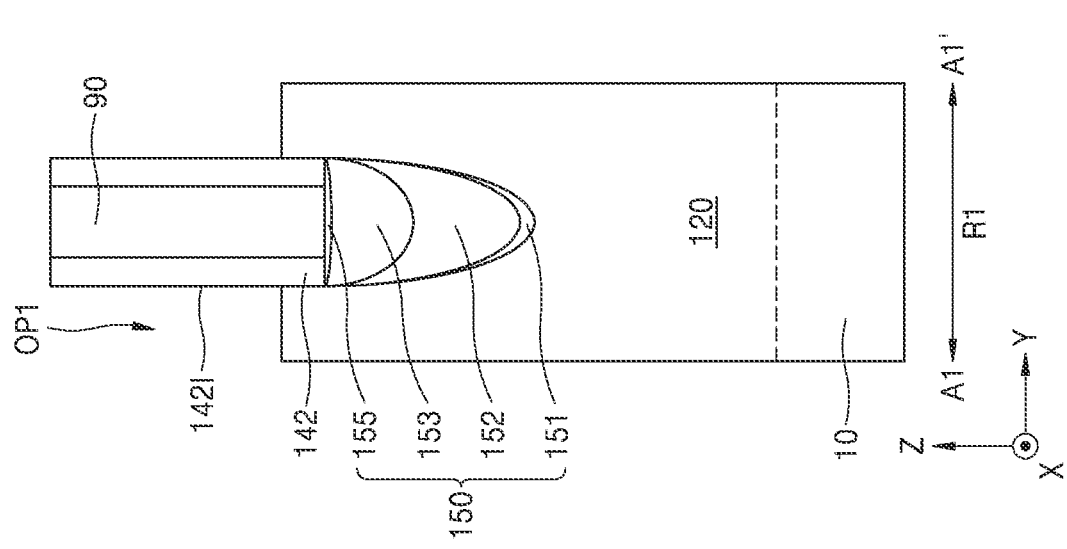

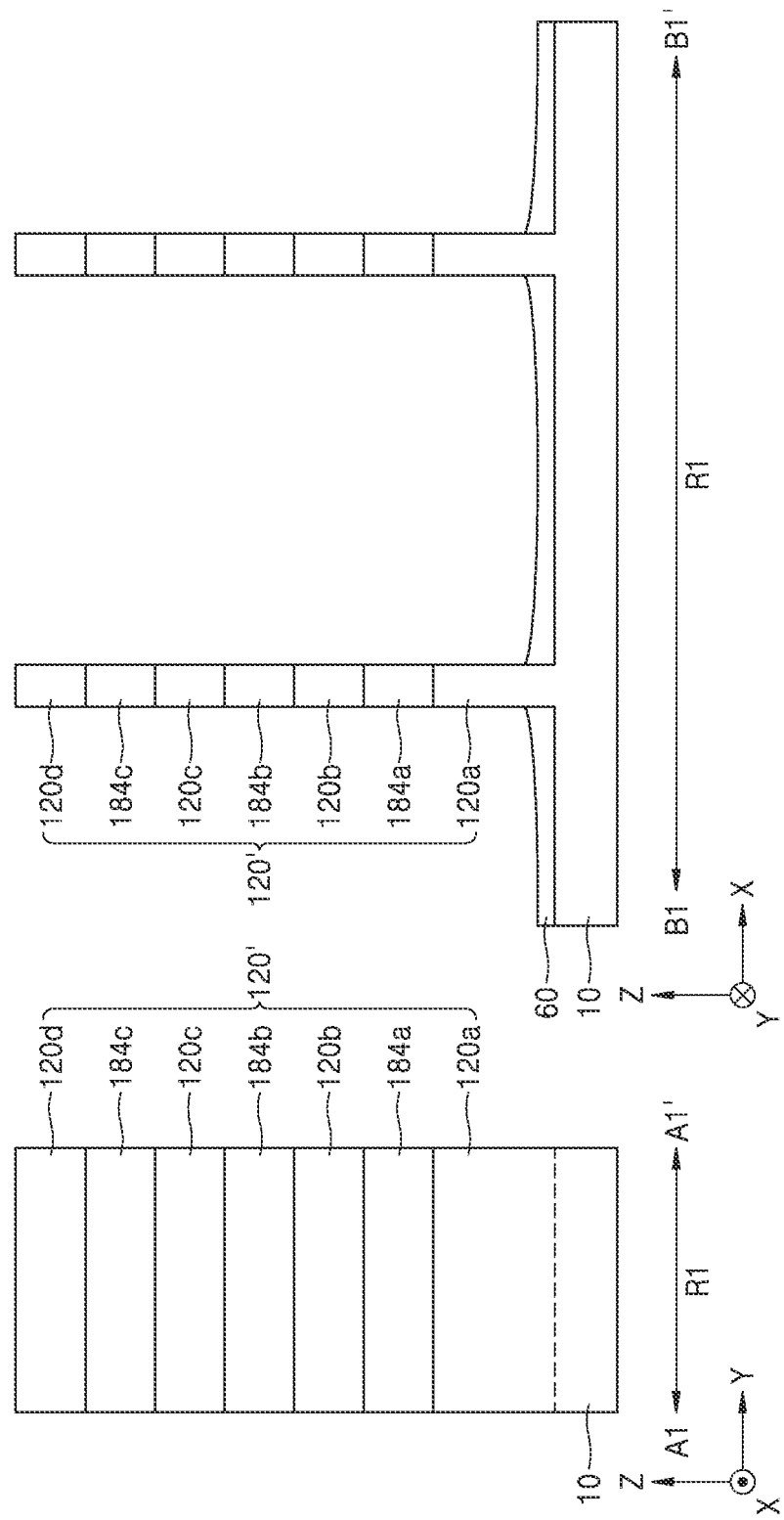

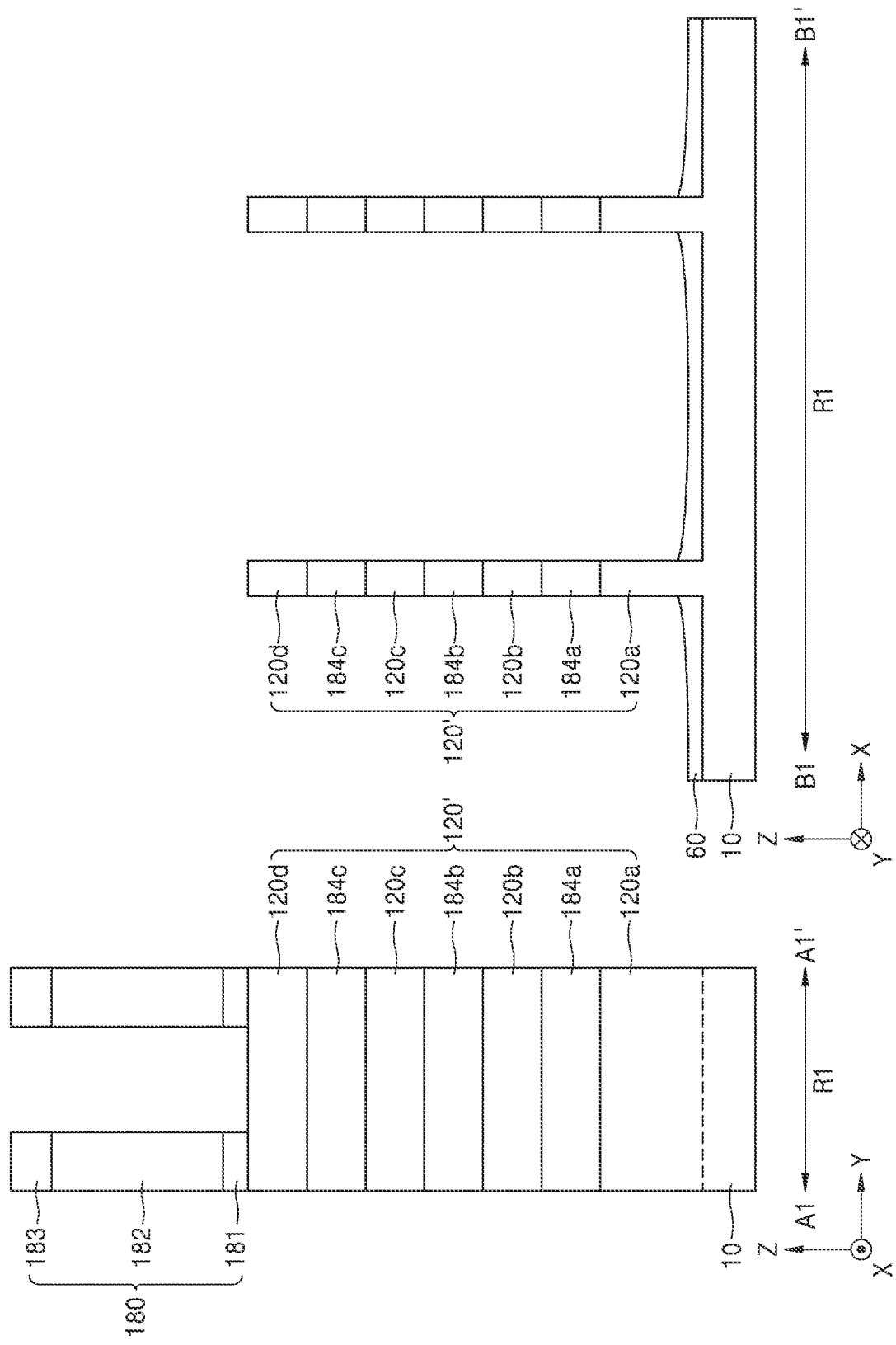

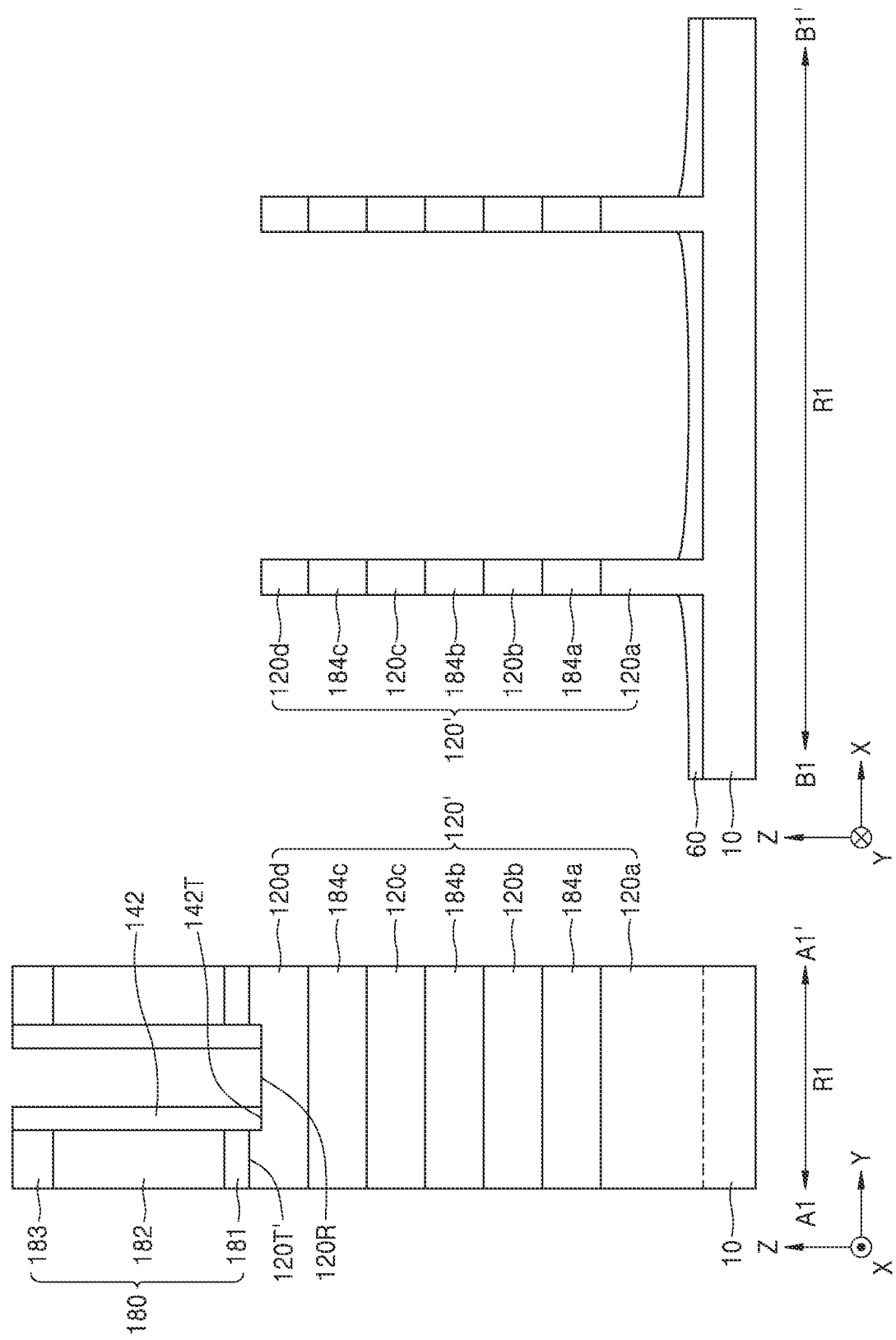

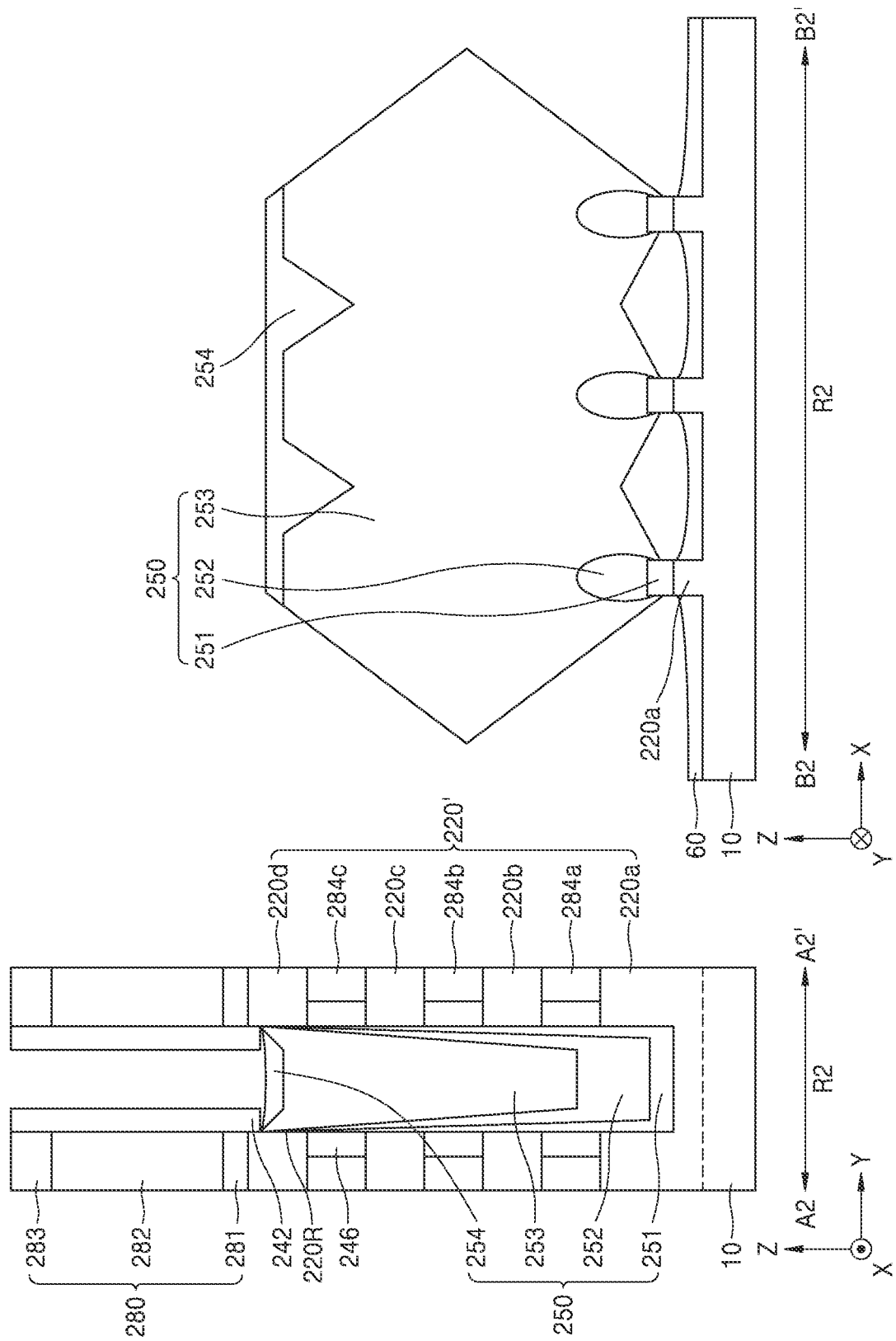

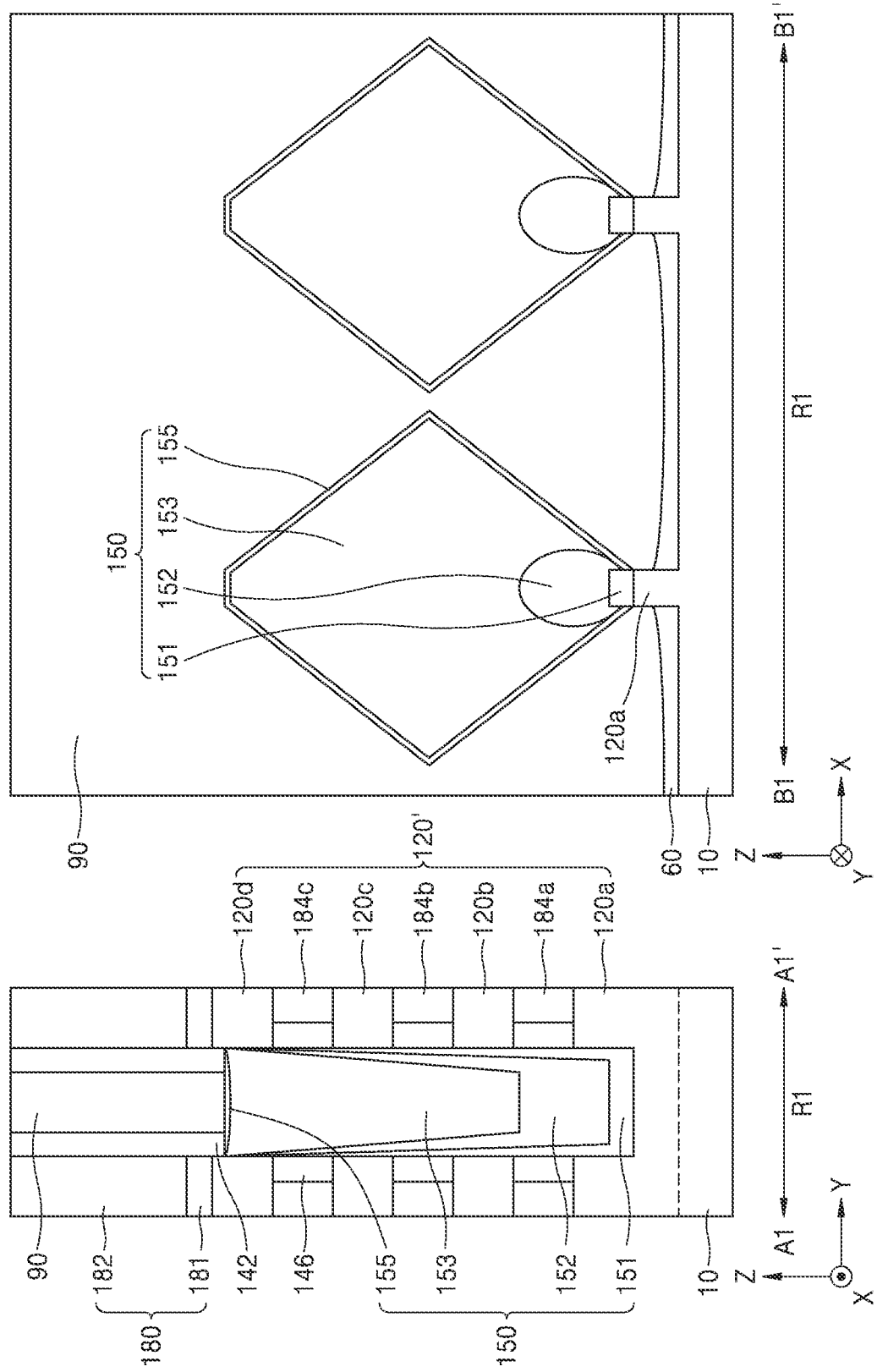

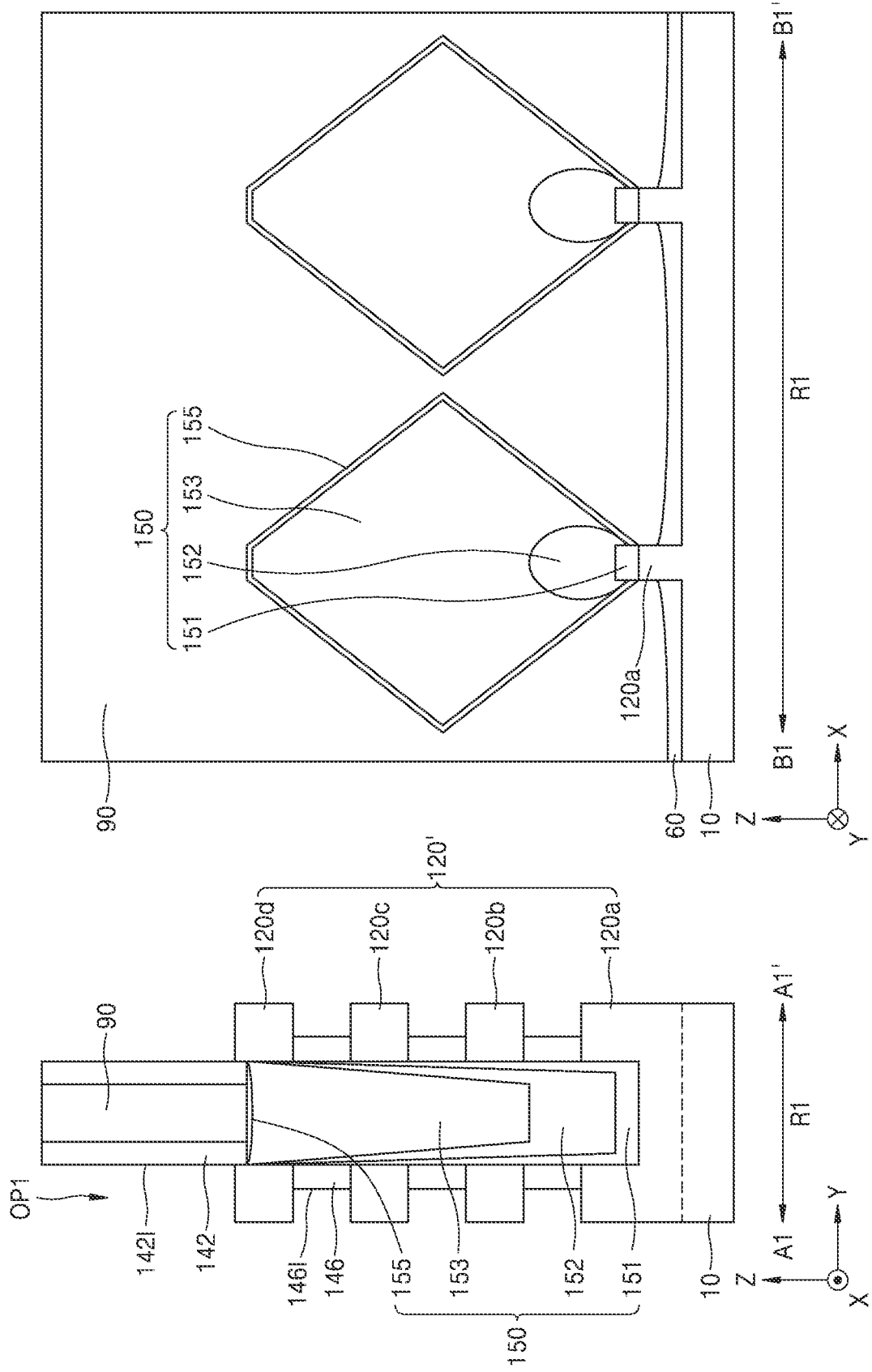

SEMICONDUCTOR DEVICE

CROSS-REFERENCE TO RELATED APPLICATION

This application is a Continuation Application of U.S. patent application Ser. No. 16/806,629 filed Mar. 2, 2020, which is based on and claims priority under 35 U.S.C. § 119 to Korean Patent Application Nos. 10-2019-0089217 filed on Jul. 23, 2019, in the Korean Intellectual Property Office, the disclosure of which is incorporated by reference herein in its entirety.

BACKGROUND

1. Field

The disclosure relates to a semiconductor device, and more particularly, to a semiconductor device including a transistor and a method of manufacturing the same.

2. Description of Related Art

Fin field effect transistors (finFETs) including fin-shaped channels have been developed to achieve high integration, high operation speed, and low power consumption of semiconductor devices. Recently, gate-all-around field effect transistors (GAAFETs) including a plurality of channels spaced in the vertical direction and multi-bridge channel field effect transistors (MBCFETs) have been developed to achieve higher integration, faster operation speed, and lower power consumption.

SUMMARY

The disclosure provides a semiconductor device having excellent performance without defects.

In accordance with an aspect of the disclosure, a semiconductor device includes a substrate; a fin structure on the substrate; a gate structure on the fin structure; a gate spacer on at least one side surface of the gate structure; and a source/drain structure on the fin structure, wherein a topmost portion of a bottom surface of the gate spacer is lower than a topmost portion of a top surface of the fin structure, and a topmost portion of a top surface of the source/drain structure is lower than the topmost portion of the top surface of the fin structure.

The gate spacer may include an inner side surface contacting the gate structure and an outer side surface opposite to the inner side surface, and the source/drain structure may include a portion such that a distance from the portion of the source/drain structure to the gate structure in a horizontal direction is smaller than a distance from the outer side surface of the gate spacer to the gate structure in the horizontal direction.

The topmost portion of the bottom surface of the gate spacer may be higher than a bottommost portion of the top surface of the fin structure.

The source/drain structure may be doped with a p-type dopant.

The fin structure may include a plurality of channels separated from each other in a vertical direction, the topmost portion of the bottom surface of the gate spacer may be lower than a topmost portion of a top surface of a topmost channel from among the plurality of channels, and the topmost portion of the top surface of the source/drain structure may be lower than the topmost portion of the top surface of the topmost channel.

In accordance with an aspect of the disclosure, a semiconductor device includes a substrate comprising a first region and a second region; a first fin structure on the first region; a second fin structure on the second region; a first gate structure on the first fin structure; a second gate structure on the second fin structure; a first gate spacer on at least one side surface of the first gate structure; a second gate spacer on at least one side surface of the second gate structure; a first source/drain structure on the first fin structure; and a second source/drain structure on the second fin structure, wherein a topmost portion of a bottom surface of the first gate spacer is lower than a topmost portion of a top surface of the first fin structure, and wherein a topmost portion of a top surface of the first source/drain structure is lower than the topmost portion of the top surface of the first fin structure.

The first source/drain structure may include a first source/drain layer and a first capping layer directly on the first source/drain layer, and the second source/drain structure may include a second source/drain layer, a third source/drain layer on the second source/drain layer, and a second capping layer on the third source/drain layer.

A Si concentration of the first source/drain layer may be lower than a Si concentration of the first capping layer, and a Si concentration of the second source/drain layer may be lower than a Si concentration of the second capping layer.

A Si concentration of the third source/drain layer may be lower than a Si concentration of the second source/drain layer.

The first source/drain layer and the second source/drain layer may include a substantially same first composition, and the first capping layer and the second capping layer may include a substantially same second composition.

The first source/drain layer, the second source/drain layer, and the third source/drain layer may include SiGe.

The first source/drain layer, the second source/drain layer, and the third source/drain layer may include a p-type dopant.

A distance from the topmost portion of the top surface of the first fin structure to a bottommost portion of the top surface of the first fin structure in a vertical direction may be less than a distance from a topmost portion of a top surface of the second fin structure to a bottommost portion of the top surface of the second fin structure in the vertical direction.

A topmost portion of a bottom surface of the second gate spacer may be lower than a bottommost portion of a top surface of the second fin structure.

A height of a topmost portion of a bottom surface of the second gate spacer may be greater than or equal to a height of a bottommost portion of a top surface of the second fin structure.

In accordance with an aspect of the disclosure, a semiconductor device includes a substrate comprising a first region and a second region; a plurality of first fin structures on the first region; a plurality of second fin structures on the second region; a plurality of first gate structures, each first gate structure from among the plurality of first gate structures being on a respective first fin structure from among the plurality of first fin structures; a second gate structure on the plurality of second fin structures; a plurality of first gate spacers, each first gate spacer from among the plurality of first gate spacers being on side surfaces of a respective first gate structure from among the plurality of first gate structures; a second gate spacer on side surfaces of the second gate structure; a plurality of first source/drain structures, each first source/drain structure being on a respective first fin structure from among the plurality of first fin structures; and a second source/drain structure on the plurality of second fin structures, wherein a topmost portion of a bottom surface of each first gate spacer from among the plurality of first gate spacers is lower than a topmost portion of a top surface of a respective first fin structure from among the plurality of first fin structures, and a topmost portion of a top surface of each first source/drain structure from among the plurality of first source/drain structures is lower than a topmost portion of a top surface of a respective first fin structure from among the plurality of first fin structures.

The plurality of first source/drain structures may be separated from one another, and the second source/drain structure may contact all of the plurality of second fin structures.

A pitch between adjacent first fin structures from among the plurality of first fin structures may be greater than a pitch between adjacent second fin structures from among the plurality of second fin structures.

A length of each first source/drain structure from among the plurality of first source/drain structures in a vertical direction may be less than a length of the second source/drain structure in the vertical direction.

Each first source/drain structure from among the plurality of first source/drain structures may include a first predetermined number of layers, and the second source/drain structure may include a second predetermined number of layers, the second predetermined number being greater than the first predetermined number.

BRIEF DESCRIPTION OF THE DRAWINGS

The above and other aspects, features, and advantages of certain embodiments of the disclosure will be more apparent from the following detailed description taken in conjunction with the accompanying drawings, in which:

FIG. 1C is a cross-sectional view of a semiconductor device according to an embodiment, taken along lines A2-A2' and B2-B2' of FIG. 1A;

FIG. 2 is a cross-sectional view of a semiconductor device according to an embodiment, taken along the lines A1-A1' and B1-B1' of FIG. 1A;

FIG. 3 is a cross-sectional view of a semiconductor device according to an embodiment, taken along the lines A2-A2' and B2-B2' of FIG. 1A;

FIGS. 5A to 14B are diagrams showing a method of manufacturing a semiconductor device according to an embodiment;

FIGS. 15A to 26B are diagrams showing a method of manufacturing a semiconductor device according to an embodiment.

DETAILED DESCRIPTION OF EMBODIMENTS

Figure 27:
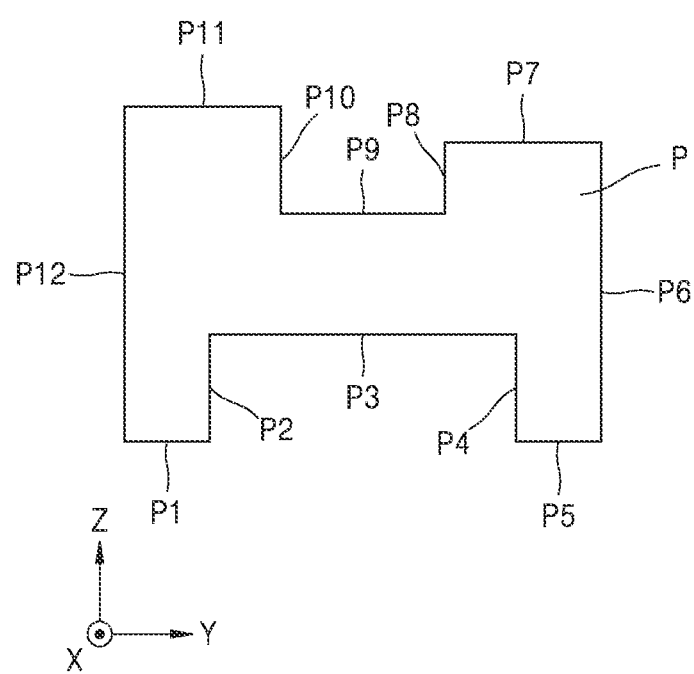
FIG. 27 is a conceptual diagram for describing terms described in the disclosure.

FIG. 27 is a conceptual diagram for describing terms described in the disclosure.

Referring to FIG. 27, in this specification, a vertical direction refers to a Z direction indicated throughout the drawings. Z coordinates may also be referred to as heights. The expression that a first point is higher than a second point means that the Z coordinate of the first point is greater than the Z coordinate of the second point, regardless of the X and Y coordinates of the first point and the second point, and the expression that a first point is lower than a second point means that the Z coordinate of the first point is smaller than the Z coordinate of the second point, regardless of the X and Y coordinates of the first point and the second point. The expression that a first point is at the same height as a second point means that the Z coordinate of the first point and the Z coordinate of the second point are the same regardless of the X and Y coordinates of the first point and the second point.

In the conceptual example shown in FIG. 27, the bottom surface of an object P may include first to fifth surfaces P1 to P5. The top surface of the object P may include seventh to eleventh surfaces P7 to P11. The third surface P3 may be referred to as the topmost portion of the bottom surface of the object P, and the first surface P1 and the fifth surface P5 may be referred to as bottommost portions of the bottom surface of the object P. The eleventh surface P11 may be referred to as the topmost portion of the top surface of the object P, and the ninth surface P9 may be referred to as the bottommost portion of the top surface of the object P. A sixth surface P6 and a twelfth surface 12 may be referred to as side surfaces of the object P. Side surfaces are not necessarily parallel to the vertical direction and may be defined as surfaces interconnecting the top surface with the bottom surface.

Figure 1A:
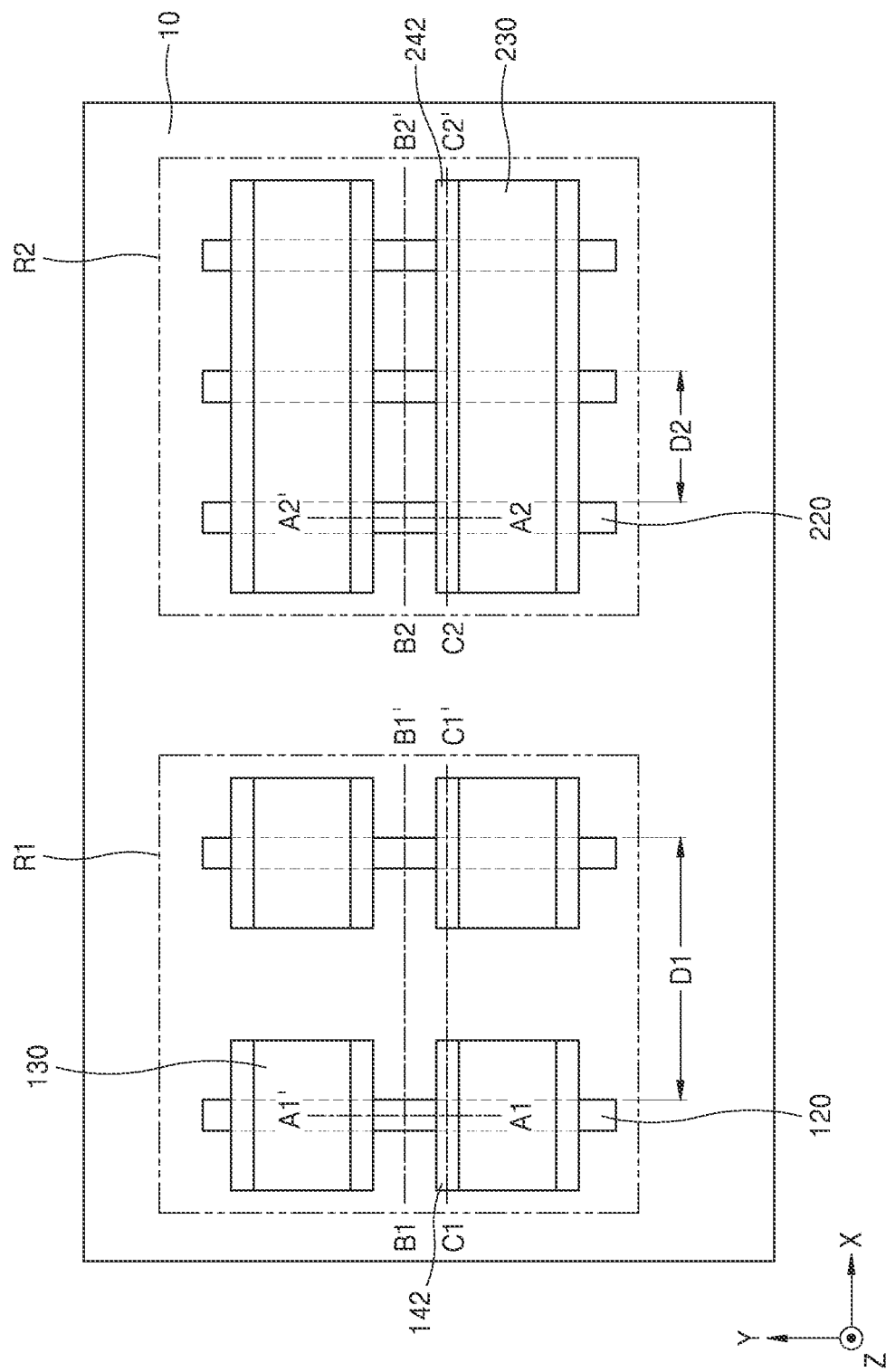
FIG. 1A is a plan view of a semiconductor device according to an embodiment.
Figure 1B:
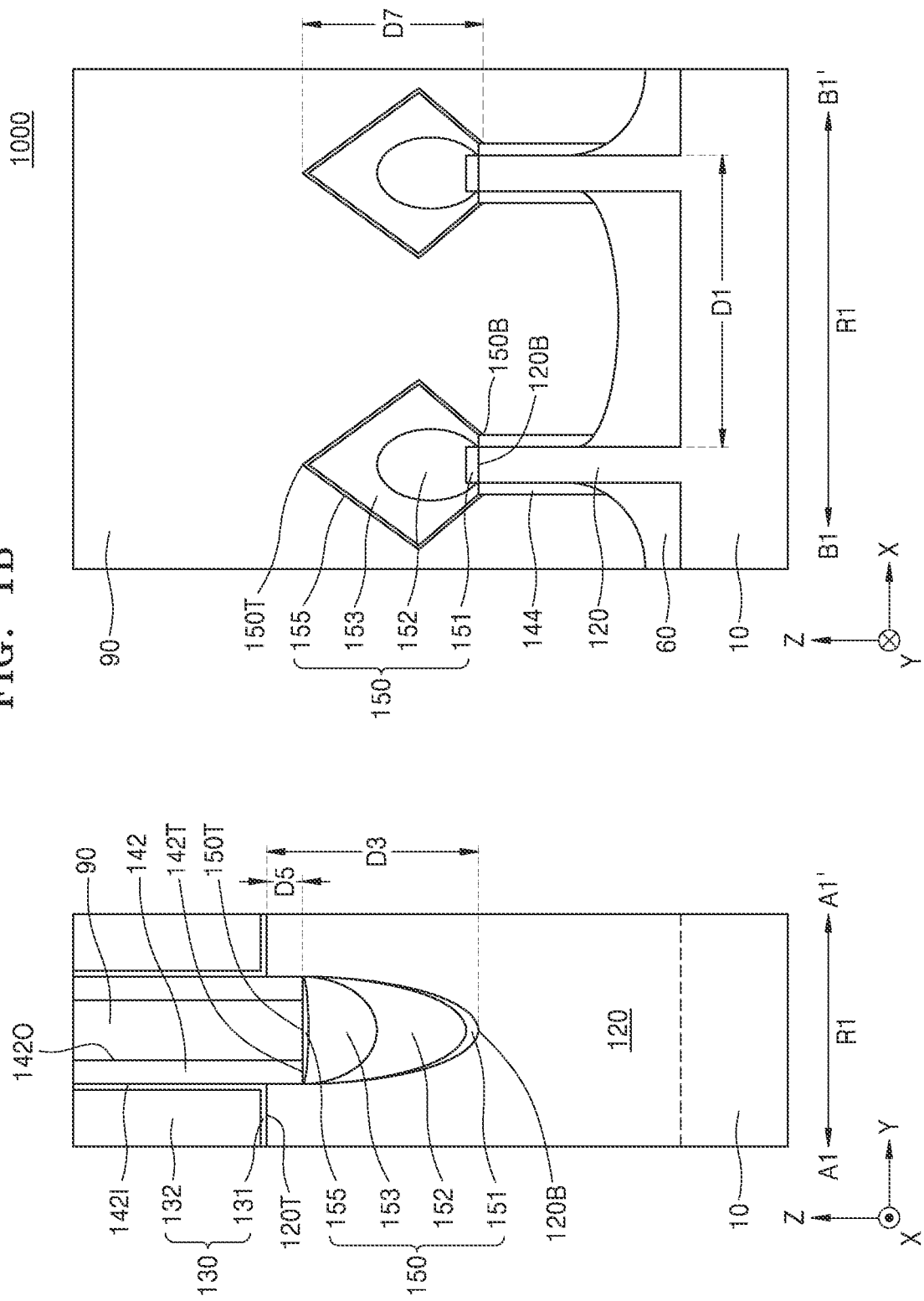
FIG. 1B is a cross-sectional view of a semiconductor device according to an embodiment, taken along lines A1-A1' and B1-B1' of FIG. 1A.
Figure 1D:
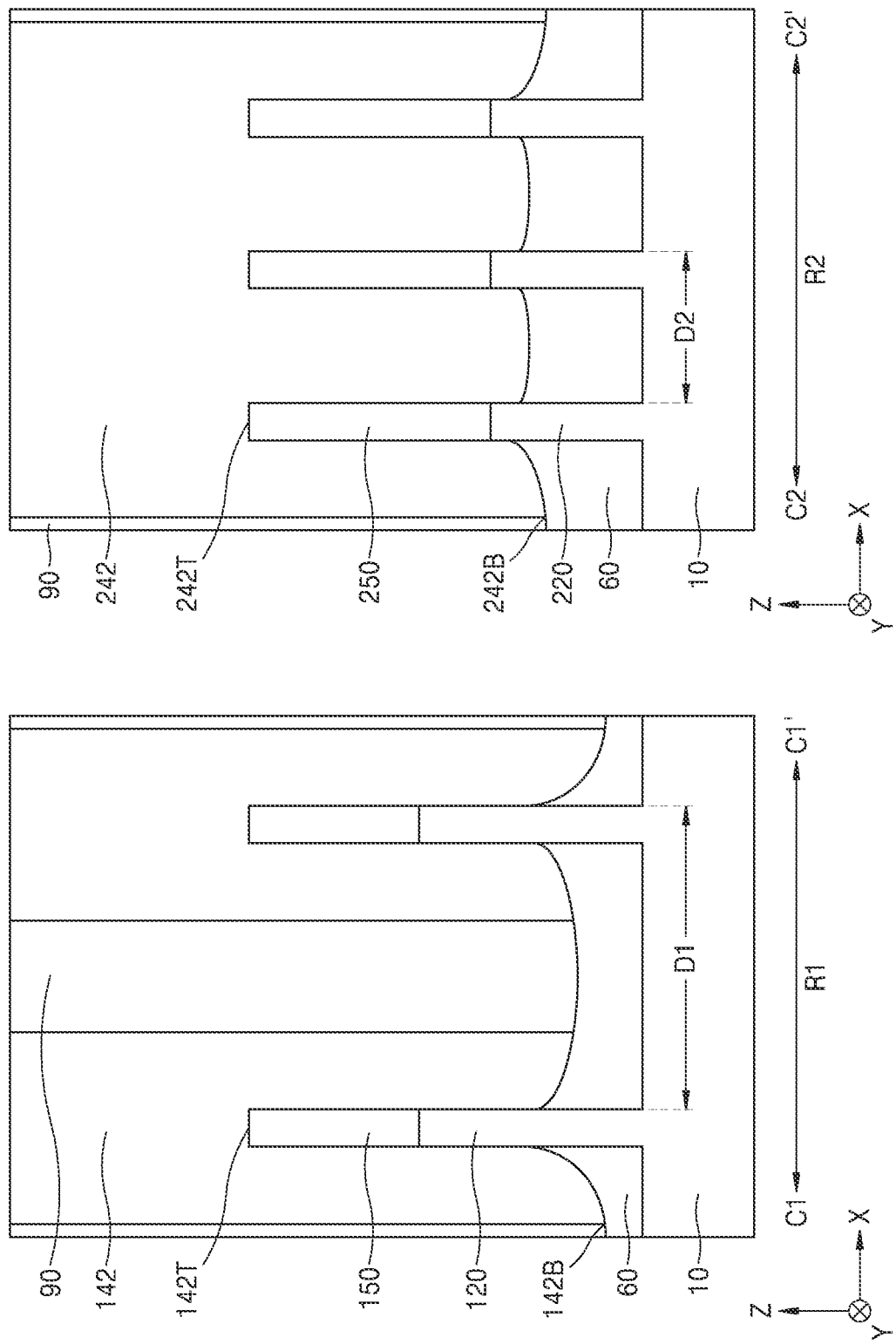
FIG. 1D is a cross-sectional view of the semiconductor device according to an embodiment, taken along lines C1-C1' and C2-C2' of FIG. 1A.

FIG. 1A is a plan view of a semiconductor device according to example embodiments. FIG. 1B is a cross-sectional view of a semiconductor device 1000 according to an embodiment, taken along lines A1-A1' and B1-B1' of FIG. 1A. FIG. 1C is a cross-sectional view of the semiconductor device 1000 according to an embodiment, taken along lines A2-A2' and B2-B2' of FIG. 1A. FIG. 1D is a cross-sectional view of the semiconductor device 1000 according to an embodiment, taken along lines C1-C1' and C2-C2' of FIG. 1A.

Referring to FIGS. 1A to 1D, the semiconductor device 1000 may include a substrate 10, a first fin structure 120 on a first region R1 of the substrate 10, and a first gate structure 130 on the first fin structure 120, first gate spacers 142 on side surfaces of the first gate structure 130, and a first source/drain structure 150 on the first fin structure 120. In some embodiments, the semiconductor device 1000 may include a second fin structure 220 on a second region R2 of the substrate 10, a second gate structure 230 on the second fin structure 220, second gate spacers 242 on side surfaces of the second gate structure 230, and a second source/drain structure 250 on the second fin structure 220.

In some embodiments, the semiconductor device 1000 may include the substrate 10, a plurality of first fin structures 120 on the first region R1 of the substrate 10, a plurality of second fin structures 220 on the second region R2 of the substrate 10, a plurality of first gate structures 130 respectively located on the first fin structures 120, a second gate structure 230 located on the second fin structures 220, a plurality of first gate spacers 142 respectively located on side surfaces of the first gate structures 130, second gate spacers 242 located on side surfaces of the second gate structure 230, a plurality of first source/drain structures 150 respectively located on the first fin structures 120, and a second source/drain structure 250 located on the second fin structures 220.

The substrate 10 may include the first region R1 and the second region R2. In some embodiments, the first region R1 and the second region R2 may also be referred to as a static RAM (SRAM) region and a logic region, respectively, but are not limited thereto. The substrate 10 may include a semiconductor material like a Group IV semiconductor material, a Group III-V semiconductor material, a Group II-VI semiconductor material, or a combination thereof. The Group IV semiconductor material may include, for example, silicon (Si), germanium (Ge), or silicon-germanium (SiGe). The Group III-V semiconductor material may include, for example, gallium arsenide (GaAs), indium phosphorus (InP), gallium phosphorus (GaP), indium arsenic (InAs), indium antimony (InSb), or indium gallium arsenide (InGaAs). The Group II-VI semiconductor material may include, for example, zinc telluride (ZnTe) or cadmium sulfide (CdS). The substrate 10 may include a bulk wafer or an epitaxial layer.

The first fin structure 120 and the second fin structure 220 may be located on the top surface of the substrate 10. In some embodiments, first fin structure 120 and second fin structure 220 may extend in the Y direction as shown in FIGS. 1B-1D. In some embodiments, the first fin structures 120 may extend in the Y direction parallel to one another and may be apart (i.e., separated) from one another in the X direction. The second fin structures 220 may extend in the Y direction parallel to one another and may be apart (i.e., separated) from one another in the X direction. In some embodiments, a horizontal direction (e.g., the X direction) pitch D1 between the first fin structures 120 may be greater than a horizontal direction (e.g., the X direction) pitch D2 between the second fin structures 220. The pitch may also be referred to as a repeating distance. For example, the horizontal direction (e.g., the X direction) pitch D1 between the first fin structures 120 may be about twice the horizontal direction (e.g., the X direction) pitch D2 between the second fin structures 220.

Each of the first fin structures 120 and the second fin structures 220 may be formed from the substrate 10, an epitaxial layer, or a combination thereof. Each of the first fin structures 120 and the second fin structures 220 may include a semiconductor material. In some embodiments, each of the first fin structures 120 and the second fin structures 220 may include the same material as that of the substrate 10.

The topmost portion 120T of the top surface of the first fin structure 120 may contact the first gate structure 130. The bottommost portion 120B of the top surface of the first fin structure 120 may contact the first source/drain structure 150 as shown in FIG. 1B. The topmost portion 220T of the top surface of the first fin structure 220 may contact the second gate structure 230. The bottommost portion 220B of the top surface of the first fin structure 220 may contact the second source/drain structure 250 as shown in FIG. 1C. In some embodiments, a distance D3 from the topmost portion 120T of the top surface of the first fin structure 120 to the bottommost portion 120B of the top surface of the first fin structure 120 in the vertical direction Z may be less than a distance D4 from the topmost portion 220T of the top surface of the second fin structure 220 to the bottommost portion 220B of the top surface of the second fin structure 220, and thus, the first source/drain structure 150 may be smaller than the second source/drain structure 250 in the vertical direction Z.

In some embodiments, the semiconductor device 1000 may further include a device isolation layer 60 on the top surface of the substrate 10. The device isolation layer 60 may surround side surfaces of the lower portion of the first fin structure 120 and side surfaces of the lower portion of the second fin structure 220. The device isolation layer 60 may include a single layer or a plurality of layers. The device isolation layer 60 may include, for example, silicon oxide, silicon nitride, or a combination thereof.

In some embodiments, the semiconductor device 1000 may further include first fin spacers 144 on the side surfaces of the first fin structure 120 and second fin spacers 244 on side surfaces of the second fin structure 220. For example, the first fin spacers 144 may be located on both side surfaces of the first fin structure 120 apart from each other in the X direction as shown in FIG. 1B, and the second fin spacers 244 may be located on both side surfaces of the second fin structure 220 apart from each other in the X direction as shown in FIG. 1C. The first fin spacer 144 and the second fin spacer 244 may include, for example, silicon oxide, silicon nitride, or a combination thereof.

In some embodiments, the first gate structure 130 and the second gate structure 230 may extend in the X direction. The first gate structure 130 may be located on the topmost portion 120T of top surface of the first fin structure 120 as shown in FIG. 1B, and the second gate structure 230 may be located on the topmost portion 220T of top surface of the second fin structure 220 as shown in FIG. 1C. The first gate structure 130 may be located on the top surface of the first fin structure 120 and both side surfaces of the first fin structure 120 apart from each other in the X direction, and the second gate structure 230 may be located on the top surface of the second fin structure 220 and both side surfaces of the second fin structure 220 apart from each other in the X direction.

In some embodiments, the first gate structures 130 are respectively located on the first fin structures 120, whereas a single second gate structure 230 may be located on all of the second fin structures 220. In other words, the single second gate structure 230 may extend throughout and across all of the second fin structures 220. In an embodiment, a plurality of second gate structures 230 may instead be respectively located on the second fin structures 220. Although FIG. 1A shows that the single second gate structure 230 extends throughout three second fin structures 220, the single second gate structure 230 may contact fewer or more than three second fin structures 220.

The first gate structure 130 may include a first gate insulation layer 131 on the first fin structure 120 and a first gate electrode layer 132 on the first gate insulation layer 131. Also, the second gate structure 230 may include a second gate insulation layer 231 on the second fin structure 220 and a second gate electrode layer 232 on the second gate insulation layer 231. The first gate insulation layer 131 and the second gate insulation layer 231 may each include a high-k layer (i.e., a high-dielectric constant layer). The high-k layer may include a high-k material having a higher dielectric constant than that of silicon oxide. The high-k material may include, for example, hafnium oxide, lanthanum oxide, zircon oxide, tantalum oxide, or a combination thereof.

In some embodiments, the first gate insulation layer 131 may further include an interface layer between the high-k layer of the first gate insulation layer 131 and the first fin structure 120, and the second gate insulation layer 231 may further include an interface layer between the high-k layer of the second gate insulation layer 231 and the second fin structure 220. The interface layers of the first gate insulation layer 131 and the second gate insulation layer 231 may each include, for example, silicon oxide, silicon nitride, or a combination thereof.

In some embodiments, the first gate electrode layer 132 and the second gate electrode layer 232 may include threshold voltage control layers, barrier layers, and filling layers sequentially stacked on the first gate insulation layer 131 and the second gate insulation layer 231, respectively. The threshold voltage control layers may include, for example, titanium nitride, titanium aluminum, titanium aluminum oxide, titanium aluminum carbide, titanium aluminum nitride, titanium aluminum oxynitride, titanium aluminum carbonitride, titanium aluminum oxycarbonitride, titanium oxynitride, titanium oxycarbonitride, titanium silicon nitride, titanium silicon oxynitride, tantalum nitride, tantalum oxynitride, tantalum aluminum nitride, tantalum aluminum oxynitride, tungsten nitride, tungsten carbonitride, aluminum oxide, or combinations thereof. The barrier layers may include titanium nitride, tantalum nitride, or a combination thereof. The filling layers may include tungsten, for example.

The first gate spacer 142 and the second gate spacer 242 may each include, for example, silicon oxide, silicon nitride, or a combination thereof. The first gate spacer 142 may be located on both side surfaces of the first gate structure 130 and may be apart from each other in the Y direction, and the second gate spacer 242 may be located on both side surfaces of the second gate structure 230 and may be apart from each other in the Y direction. The first gate spacer 142 may have an inner side surface 142I contacting the first gate structure 130 and an outer side surface 142O opposite to the inner side surface 142I and contacting an interlayer insulation layer 90 to be described below, and the second gate spacer 242 may have an inner side surface 242I contacting the gate structure 230 and an outer side surface 242O opposite to the inner side surface 242I and contacting the interlayer insulation layer 90.

In some embodiments, the topmost portion 142T of the bottom surface of the first gate spacer 142 may contact the first source/drain structure 150 as shown in FIG. 1B, and the bottommost portion 142B of the bottom surface of the first gate spacer 142 may contact the device isolation layer 60 as shown in FIG. 1D. The topmost portion 242T of the bottom surface of the second gate spacer 242 may contact the second source/drain structure 250 as shown in FIG. 1C, and the bottommost portion 242B of the bottom surface of the second gate spacer 242 may contact the device isolation layer 60 as shown in FIG. 1D.

The topmost portion 142T of the bottom surface of the first gate spacer 142 may be lower than the topmost portion 120T of the top surface of the first fin structure 120 as shown in FIG. 1B. For example, a distance D5 from the topmost portion 120T of the top surface of the first fin structure 120 to the topmost portion 142T of the bottom surface of the first gate spacer 142 in the vertical direction Z may be from about 1 nm to about 20 nm, e.g., from about 5 nm to about 15 nm. Therefore, the topmost portion 250T of the top surface of the first source/drain structure 150 may be lower than the topmost portion 120T of the top surface of the first fin structure 120 to prevent abnormal growth of the first source/drain structure 150, and thus first source/drain structures 150 adjacent to one another may be prevented from being merged with one another.

In some embodiments, the topmost portion 242T of the bottom surface of the second gate spacer 242 may be lower than the topmost portion 220T of the top surface of the second fin structure 220 as shown in FIG. 1C. For example, a distance D6 from the topmost portion 220T of the top surface of the second fin structure 220 to the topmost portion 242T of the bottom surface of the second gate spacer 242 in the vertical direction Z may be from about 1 nm to about 20 nm, e.g., from about 5 nm to about 15 nm. In some embodiments, the distance D5 from the topmost portion 120T of the top surface of the first fin structure 120 to the topmost portion 142T of the bottom surface of the first gate spacer 142 in the vertical direction Z may be substantially identical to the distance D6 from the topmost portion 220T of the top surface of the second fin structure 220 to the topmost portion 242T of the bottom surface of the second gate spacer 242 in the vertical direction Z. In other words, a difference between two distances D5 and D6 may be within a difference between etching depths of two structures respectively located on two regions of a substrate, and may be the difference that may occur when the two structures are simultaneously etched under the same etching conditions. In some embodiments, the first fin structure 120 may be etched, such that the topmost portion 142T of the bottom surface of the first gate spacer 142 becomes lower than the topmost portion 120T of the top surface of the first fin structure 120. At this time, the second fin structure 220 may be also etched together, and thus the topmost portion 242T of the bottom surface of the second gate spacer 242 may become lower than the topmost portion 220T of the top surface of the second fin structure 220. In this case, it is not necessary to prevent the second fin structure 220 from being etched, separate operations (e.g., formation of a mask on the second fin structure 220 before etching the first fin structure 120 and removal of the mask after the first fin structure 120 is etched) may not be needed, and thus the overall manufacturing process may become simple and easy.

The topmost portion 142T of the bottom surface of the first gate spacer 142 may be higher than the bottommost portion 120B of the top surface of the first fin structure 120 as shown in FIG. 1B. In other words, after the first gate spacers 142 are formed and before the first source/drain structure 150 is formed, the first fin structure 120 may be further etched. In some embodiments, the topmost portion 242T of the bottom surface of the second gate spacer 242 may be higher than the bottommost portion 220B of the top surface of the second fin structure 220 as shown in FIG. 1C. In other words, after the second gate spacers 242 are formed and before the second source/drain structure 250 is formed, the second fin structure 220 may be further etched.

The first source/drain structures 150 are formed apart from one another, because they may cause a defect of the semiconductor device 1000 when merged. On the other hand, the second source/drain structure 250 may contact all of the second fin structures 220. In other words, the second source/drain structure 250 may extend throughout the second fin structures 220. In other words, the second source/drain structure 250 may have a structure in which respective portions of the source/drain structure 250 that are starting to grow from each of the second fin structures 220 independently are merged with one another. Although FIG. 1A shows that the single second source/drain structure 250 extends throughout the three second fin structures 220, the single second source/drain structure 250 may contact fewer or more than three second fin structures 220. The second source/drain structure 250 may have a merged structure, thereby increasing the mobility of charge carriers and reducing the resistance and the contact resistance of the second source/drain structure 250. Therefore, the performance of the semiconductor device 1000 may be improved. The first source/drain structure 150 may be located on the bottommost portion 120B of the top surface of the first fin structure 120, and the second source/drain structure 250 may be located on the bottommost portion 220B of the top surface of the second fin structure 220. In some embodiments, the bottommost portion 150B of the bottom surface of the first source/drain structure 150 may be lower than the bottommost portion 120B of the top surface of the first fin structure 120 as shown in FIG. 1B. However, in an embodiment, the bottommost portion 150B of the bottom surface of the first source/drain structure 150 may instead be higher than the bottommost portion 120B of the top surface of the first fin structure 120 or may be at the same height as the bottommost portion 120B of the top surface of the first fin structure 120. In the same regard, the bottommost portion 250B of the bottom surface of the second source/drain structure 250 may be lower than the bottommost portion 220B of the top surface of the second fin structure 220 as shown in FIG. 1C. However, in an embodiment, the bottommost portion 250B of the bottom surface of the second source/drain structure 250 may instead be higher than the bottommost portion 220B of the top surface of the second fin structure 220 or may be at the same height as the bottommost portion 220B of the top surface of the second fin structure 220.

When the first source/drain structure 150 reaches the topmost portion 142T of the bottom surface of the first gate spacer 142, the growth of the first source/drain structure 150 may be suppressed. Since the topmost portion 142T of the bottom surface of the first gate spacer 142 is lower than the topmost portion 120T of the top surface of the first fin structure 120, the topmost portion 150T of the top surface of the first source/drain structure 150 may be lower than the topmost portion 120T of the top surface of the first fin structure 120. Therefore, abnormal growth of the first source/drain structure 150 may be prevented, and the first source/drain structures 150 adjacent to one another may be prevented from being merged with one another. In some embodiments, the topmost portion 150T of the top surface of the first source/drain structure 150 may be at the same height as the topmost portion 142T of the bottom surface of the first gate spacer 142, as shown in FIG. 1B. In some embodiments, the topmost portion 150T of the top surface of the first source/drain structure 150 may instead be lower than the topmost portion 142T of the bottom surface of the first gate spacer 142.

In some embodiments, the topmost portion 250T of the top surface of the second source/drain structure 250 may be lower than the topmost portion 220T of the top surface of the second fin structure 220 as shown in FIG. 1C. In some embodiments, the topmost portion 250T of the top surface of the second source/drain structure 250 may be at the same height as the topmost portion 242T of the bottom surface of the second gate spacer 242, as shown in FIG. 1C. In some embodiments, the topmost portion 250T of the top surface of the second source/drain structure 250 may instead be higher or lower than the topmost portion 242T of the bottom surface of the second gate spacer 242.

In some embodiments, a length D7 of the first source/drain structure 150 in the vertical direction Z may be less than a length D8 of the second source/drain structure 250 in the vertical direction Z. The length D7 of the first source/drain structure 150 in the vertical direction Z is defined as the distance from the bottommost portion 150B of the bottom surface of the first source/drain structure 150 to the topmost portion 150T of the top surface of the first source/drain structure 150 in the vertical direction Z, whereas the length D8 of the second source/drain structure 250 in the vertical direction Z is defined as the distance from the bottommost portion 250B of the bottom surface of the second source/drain structure 250 to the topmost portion 250T of the top surface of the second source/drain structure 250 in the vertical direction. When the second source/drain structure 250 is larger than the first source/drain structure 150 in the vertical direction Z, the mobility of charge carriers may be increased and the resistance and the contact resistance of the second source/drain structure 250 may be reduced. Therefore, the semiconductor device 1000 may exhibit improved performance.

In some embodiments, the first source/drain structure 150 may include a portion closer to the first gate structure 130 in the horizontal direction (e.g., the Y direction) than the outer side surface 142O of the first gate spacer 142 is. In other words, a distance from the portion of the first source/drain structure 150 in the Y direction to the first gate structure 130 may be smaller than a distance from the outer side surface 142O of the first gate spacer 142 to the first gate structure 130. In other words, the extension range of at least a portion of the first source/drain structure 150 in the horizontal direction (e.g., the Y direction) may overlap the extension range of the first gate spacer 142 in the horizontal direction (e.g., the Y direction). In some embodiments, the second source/drain structure 250 may include a portion closer to the second gate structure 230 in the horizontal direction (e.g., the Y direction) than the outer side surface 242O of the second gate spacer 242 is. In other words, a distance from the portion of the second source/drain structure 250 in the Y direction to the second gate structure 230 may be smaller than a distance from the outer side surface 242O of the second gate spacer 242 to the second gate structure 230. In other words, the extension range of at least a portion of the second source/drain structure 250 in the horizontal direction (e.g., the Y direction) may overlap the extension range of the second gate spacer 242 in the horizontal direction (e.g., the Y direction).

In some embodiments, the number of layers constituting the first source/drain structure 150 may be less than the number of layers constituting the second source/drain structure 250. For example, the first source/drain structure 150 may include first to third source/drain layers 151 to 153 and a capping layer (i.e., a first capping layer) 155 that are sequentially stacked on the first fin structure 120, and the second source/drain structure 250 may include first to third source/drain layers 251 to 253 sequentially stacked on the second fin structure 220, a fourth source/drain layer 254 on the third source/drain layer 253, and a capping layer (i.e., a second capping layer) 255 on the fourth source/drain layer 254. Although FIG. 1B shows that the first source/drain structure 150 includes four layers (including the capping layer 155) and the second source/drain structure 250 includes five layers (including the capping layer 255), the number of layers constituting the first source/drain structure 150 may be more or less than four and the number of layers constituting the second source/drain structure 250 may be more or less than five.

In some embodiments, the compositions of the first to third source/drain layers 151 to 153 and the capping layer 155 of the first source/drain structure 150 may be substantially the same as the compositions of the first to third source/drain layer 251 to 253 and the capping layer 255 of the second source/drain structure 250. In other words, a difference between concentrations of two layers may be within a difference between compositions of the two layers which may incidentally occur when the two layers are formed respectively on two regions of a substrate at the same time under the same deposition condition.

In some embodiments, the capping layer 155 of the first source/drain structure 150 and the capping layer 255 of the second source/drain structure 250 may include Si. In some embodiments, the first to third source/drain layers 151 to 153 of the first source/drain structure 150 and first to fourth source/drain layers 251 to 254 of the second source/drain structure 250 may include SiGe. Also, the first to third source/drain layers 151 to 153 of the first source/drain structure 150 and the first to fourth source/drain layers 251 to 254 of the second source/drain structure 250 may be doped with a p-type dopant. The p-type dopant may include, for example, B, Al, Ga, In, or a combination thereof.

In some embodiments, the Si concentration of the first to third source/drain layers 151 to 153 of the first source/drain structure 150 may be reduced (i.e., may decrease) from the first source/drain layer 151 to the third source/drain layer 153. For example, the Si concentrations of the first to third source/drain layers 151 to 153 of the first source/drain structure 150 may be from about 70% to about 90%, from about 50% to about 70%, and from about 40% to about 50%, respectively. Also, the dopant concentration of the first to third source/drain layers 151 to 153 of the first source/drain structure 150 may be increased from the first source/drain layer 151 to the third source/drain layer 153. For example, the dopant concentrations of the first to third source/drain layers 151 to 153 of the first source/drain structure 150 may be from about $1.0 \times 10^{18}$ cm$^{-3}$ to about $1.0 \times 10^{19}$ cm$^{-3}$, from about $1.0 \times 10^{20}$ cm$^{-3}$ to about $3.0 \times 10^{20}$ cm$^{-3}$, and from about $3.0 \times 10^{20}$ cm$^{-3}$ to about $5.0 \times 10^{20}$ cm$^{-3}$, respectively.

In some embodiments, the Si concentration of the first to fourth source/drain layers 251 to 254 of the second source/drain structure 250 may be reduced (i.e., may decrease) from the first source/drain layer 251 to the fourth source/drain layer 254. For example, the Si concentrations of the first to fourth source/drain layers 251 to 254 of the second source/drain structure 250 may be from about 70% to about 90%, from about 50% to about 70%, from about 40% to about 50%, and from about 35% to about 45%, respectively. Also, the dopant concentration of the first to fourth source/drain layers 251 to 254 of the second source/drain structure 250 may be increased from the first to fourth source/drain layers 251 to 254. For example, the dopant concentrations of the first to fourth source/drain layers 251 to 254 of the second source/drain structure 250 may be from about $1.0 \times 10^{18}$ cm$^{-3}$ to about $1.0 \times 10^{19}$ cm$^{-3}$, from about $1.0 \times 10^{20}$ cm$^{-3}$ to about $3.0 \times 10^{20}$ cm$^{-3}$, from about $3.0 \times 10^{20}$ cm$^{-3}$ to about $5.0 \times 10^{20}$ cm$^{-3}$, and from about $3.0 \times 10^{20}$ cm$^{-3}$ to about $5.0 \times 10^{20}$ cm$^{-3}$, respectively.

In some embodiments, the Si concentrations of the first to third source/drain layers 151 to 153 of the first source/drain structure 150 may be lower than the Si concentration of the capping layer 155 of the first source/drain structure 150. For example, the Si concentration of the capping layer 155 of the first source/drain structure 150 may be nearly 100% (e.g., 95% or higher or 99% or higher). In some embodiments, the Si concentrations of the first to fourth source/drain layers 251 to 254 of the second source/drain structure 250 may be lower than the Si concentration of the capping layer 255 of the second source/drain structure 250. For example, the Si concentration of the capping layer 255 of the second source/drain structure 250 may be nearly 100% (e.g., 95% or higher or 99% or higher).

In some embodiments, the semiconductor device 1000 may further include an interlayer insulation layer 90. The interlayer insulation layer 90 may be located on the first source/drain structure 150, the second source/drain structure 250, the outer side surface 142O of the first gate spacer 142, the outer side surface 242O of the second gate spacer 242, and the device isolation layer 60. The interlayer insulation layer 90 may include, for example, silicon oxide, silicon nitride, or a combination thereof.

Since the topmost portion 142T of the bottom surface of the first gate spacer 142 of the semiconductor device 1000 may be lower than the topmost portion 120T of the top surface of the first fin structure 120, the topmost portion 150T of the top surface of the first source/drain structure 150 may be lower than the topmost portion 120T of the top surface of the first fin structure 120. Also, growth of the first source/drain structure 150 may be suppressed while the second source/drain structure 250 is being grown. Therefore, abnormal growth and overgrowth of the first source/drain structure 150 may be prevented, and the second source/drain structure 250 may be large. For example, the second source/drain structure 250 may have a merged structure. Therefore, the performance of the semiconductor device 1000 may be improved due to an increase in the size of the second source/drain structure 250 while preventing a defect of the semiconductor device 1000 due to the merging of the first source/drain structures 150.

FIG. 2 is a cross-sectional view of a semiconductor device 1000a according to an embodiment, taken along the lines A1-A1' and B1-B1' of FIG. 1A.

Referring to FIG. 2, the topmost portion 150T of the top surface of the first source/drain structure 150 may be higher than the topmost portion 142T of the bottom surface of the first gate spacer 142, but may still be lower than the topmost portion 120T of the top surface of the first fin structure 120. Since the topmost portion 150T of the top surface of the first source/drain structure 150 is still lower than the topmost portion 120T of the top surface of the first fin structure 120, abnormal growth of the first source/drain structure 150 may be prevented, and thus the first source/drain structures 150 may be prevented from being merged. Therefore, a defect of the semiconductor device 1000a may be prevented.

FIG. 3 is a cross-sectional view of a semiconductor device 1000b according to an embodiment, taken along the lines A2-A2' and B2-B2' of FIG. 1A.

Referring to FIG. 3, the topmost portion 242T of the bottom surface of the second gate spacer 242 may be at the same height of the topmost portion 220T of the top surface of the second fin structure 220 or higher than the topmost portion 220T of the top surface of the second fin structure 220. Therefore, in some embodiments, the topmost portion 250T of the top surface of the second source/drain structure 250 may be at the same height as the topmost portion 220T of the top surface of the second fin structure 220 or higher than the topmost portion 220T of the top surface of the second fin structure 220. Therefore, the second source/drain structure 250 having a larger size may be formed, and thus the semiconductor device 1000b may exhibit improved performance. However, in another embodiments, the topmost portion 250T of the top surface of the second source/drain structure 250 may be lower than the topmost portion 220T of the top surface of the second fin structure 220 as shown, for example, in FIG. 1C.

Figure 4A:
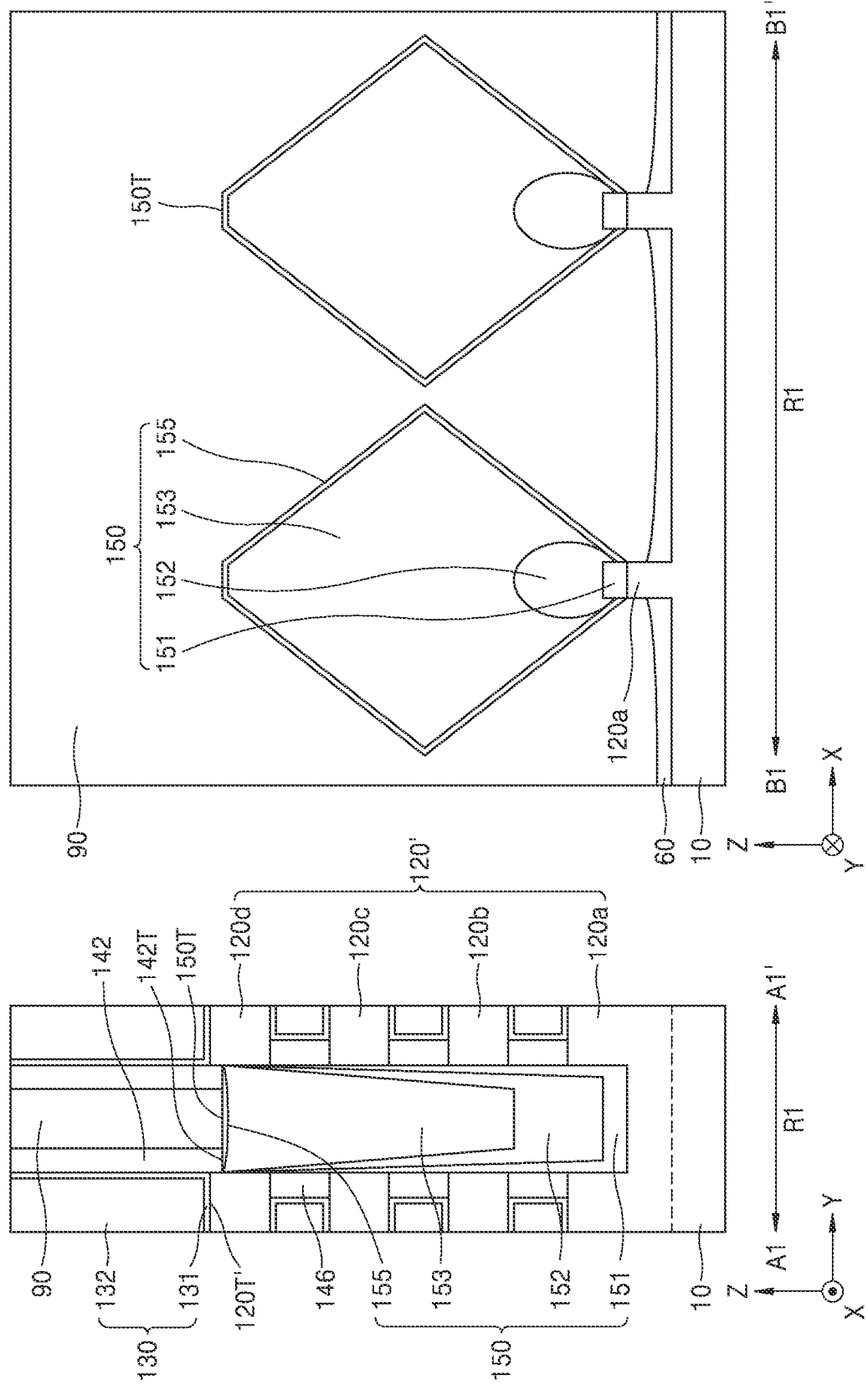
FIG. 4A is a cross-sectional view of a semiconductor device according to an embodiment, taken along the lines A1-A1' and B1-B1' of FIG. 1A.
Figure 4B:
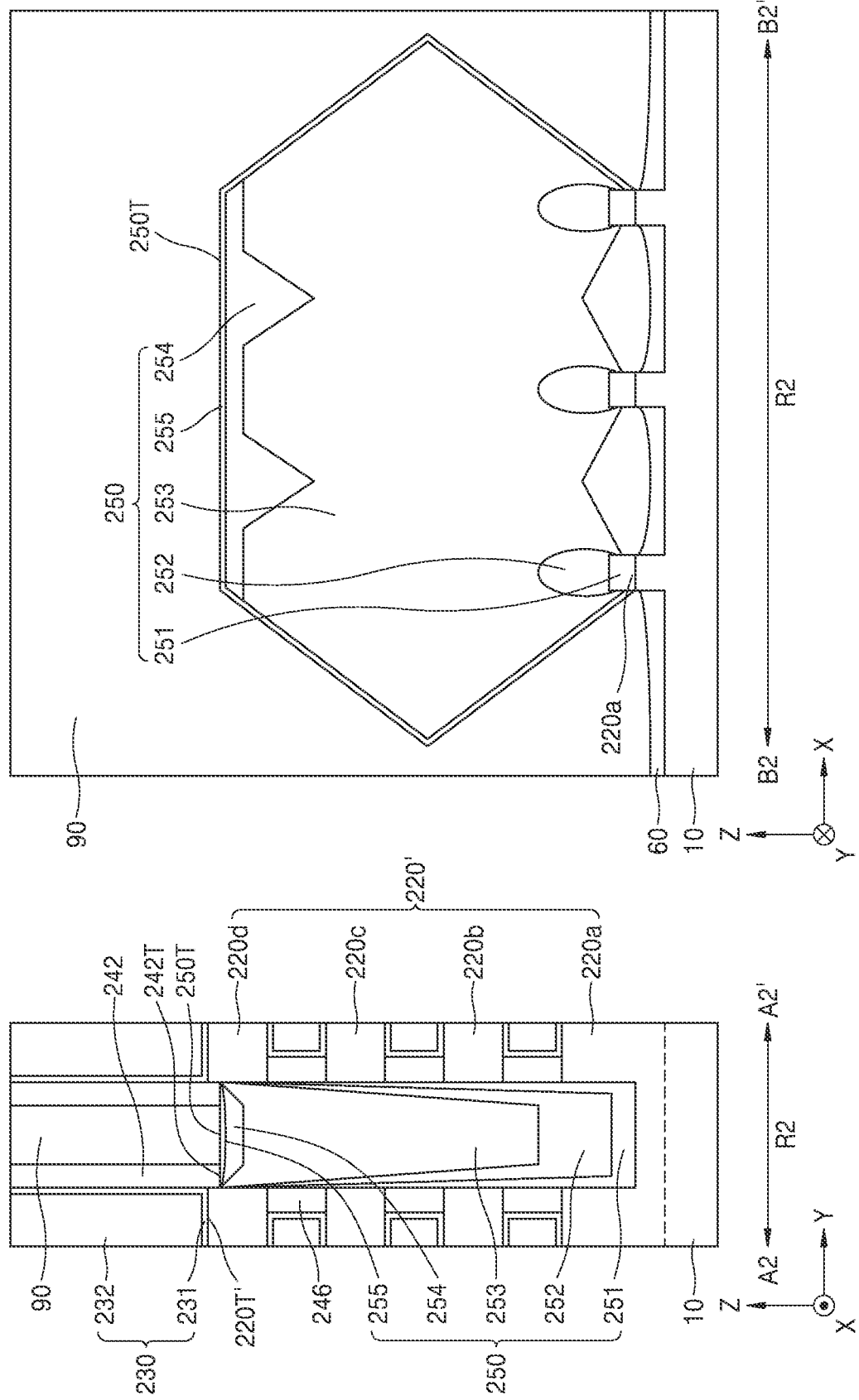
FIG. 4B is a cross-sectional view of the semiconductor device according to an embodiment, taken along the lines A2-A2' and B2-B2' of FIG. 1A.

FIG. 4A is a cross-sectional view of a semiconductor device 2000 according to an embodiment, taken along the lines A1-A1' and B1-B1' of FIG. 1A. FIG. 4B is a cross-sectional view of the semiconductor device 2000 according to an embodiment, taken along the lines A2-A2' and B2-B2' of FIG. 1A.

Referring to FIGS. 4A and 4B, a first fin structure 120' may include a plurality of first channels 120a to 120d apart (i.e., separated) from one another in the vertical direction Z, and a second fin structure 220' may include a plurality of second channels 220a to 220d apart (i.e., separated) from one another in the vertical direction Z. Although in FIGS. 4A and 4B the first fin structure 120' includes four first channels 120a to 120d and the second fin structure 220' includes four second channels 220a to 220d, the first fin structure 120' may include more or fewer than four first channels and the second fin structure 220' may include more or fewer than four second channels.

The first gate structure 130 may contact the top surface of a bottommost first channel, that is, the first channel 120a, and both the bottom surfaces and the top surfaces of the remaining first channels, the first channels 120b to 120d, whereas the second gate structure 230 may contact the top surface of a second bottommost channel, that is, the second channel 220a, and both the bottom surfaces and top surfaces of remaining second channels 220b to 220d. The first gate structure 130 may further contact both side surfaces of the first channels 120a to 120d, the side surfaces being apart from each other in the X direction, and the second gate structure 230 may further contact both side surfaces of the second channels 220a to 220d, the side surfaces being apart from each other in the X direction. In other words, the first gate structure 130 may surround the first channels 120a to 120d, and the second gate structure 230 may surround the second channels 220a to 220d.

The first gate insulation layer 131 may contact the top surface of the bottommost first channel, that is, the first channel 120a, the bottom surfaces and the top surfaces of the remaining first channels, that is, the first channels 120b to 120d, and the both side surfaces of the first channels 120a to 120d, the side surfaces being apart from each other in the X direction, whereas the second gate insulation layer 231 may contact the top surface of the bottommost second channel, that is, the second channel 220a, the bottom surfaces and the top surfaces of the remaining second channels, that is, the second channels 220b to 220d, and the both side surfaces of the second channels 220a to 220d, the side surfaces being apart from each other in the X direction. The first gate electrode layer 132 may be located on the first gate insulation layer 131, and the second gate electrode layer 232 may be located on the second gate insulation layer 231.

The first gate spacers 142 may be located on the side surfaces of a portion of the first gate structure 130 that is located on the top surface of a topmost first channel, that is, the first channel 120d. The topmost portion 142T of the bottom surface of the first gate spacer 142 may be lower than the topmost portion 120T' of the top surface of the topmost first channel, that is, the first channel 120d. The second gate spacers 242 may be located on the side surfaces of a portion of the second gate structure 230 that is on the top surface of a topmost second channel, that is, the second channel 220d. In some embodiments, the topmost portion 242T of the bottom surface of the second gate spacer 242 may be lower than the topmost portion 220T' of the top surface of the topmost second channel, that is, the second channel 220d. In an embodiment, the topmost portion 242T of the bottom surface of the second gate spacer 242 may instead be at the same height as the topmost portion 220T' of the top surface of the topmost second channel, that is, the second channel 220d, or may be higher than the topmost portion 220T' of the top surface of the topmost second channel, that is, the second channel 220d.

The first source/drain structure 150 may contact the first channels 120a to 120d of the first fin structure 120', and the second source/drain structure 250 may contact the second channels 220a to 220d of the second fin structure 220'. The topmost portion 150T of the top surface of the first source/drain structure 150 may be lower than the topmost portion 120T' of the top surface of the topmost first channel, that is, the first channel 120d. In some embodiments, the topmost portion 250T of the top surface of the second source/drain structure 250 may be lower than the topmost portion 220T' of the top surface of the topmost second channel, that is, the second channel 220d. In an embodiment, the topmost portion 250T of the top surface of the second source/drain structure 250 may instead be at the same height as the topmost portion 220T' of the top surface of the topmost second channel, that is, the second channel 220d or higher than the topmost portion 220T' of the top surface of the topmost second channel, that is, the second channel 220d.

In some embodiments, the semiconductor device 2000 may further include a plurality of first inner spacers 146 located between respective portions of the first gate structure 130, that are located between the first channels 120a to 120d, and the first source/drain structure 150. Also, the semiconductor device 2000 may further include a plurality of second inner spacers 246 located between respective portions of the second gate structure 230, that are located between the second channels 120a to 120d, and the second source/drain structure 250. The first inner spacers 146 and the second inner spacers 246 may include, for example, silicon oxide, silicon nitride, or a combination thereof.

FIGS. 5A to 14B are diagrams showing a method of manufacturing a semiconductor device according to an embodiment.

Figure 5B:
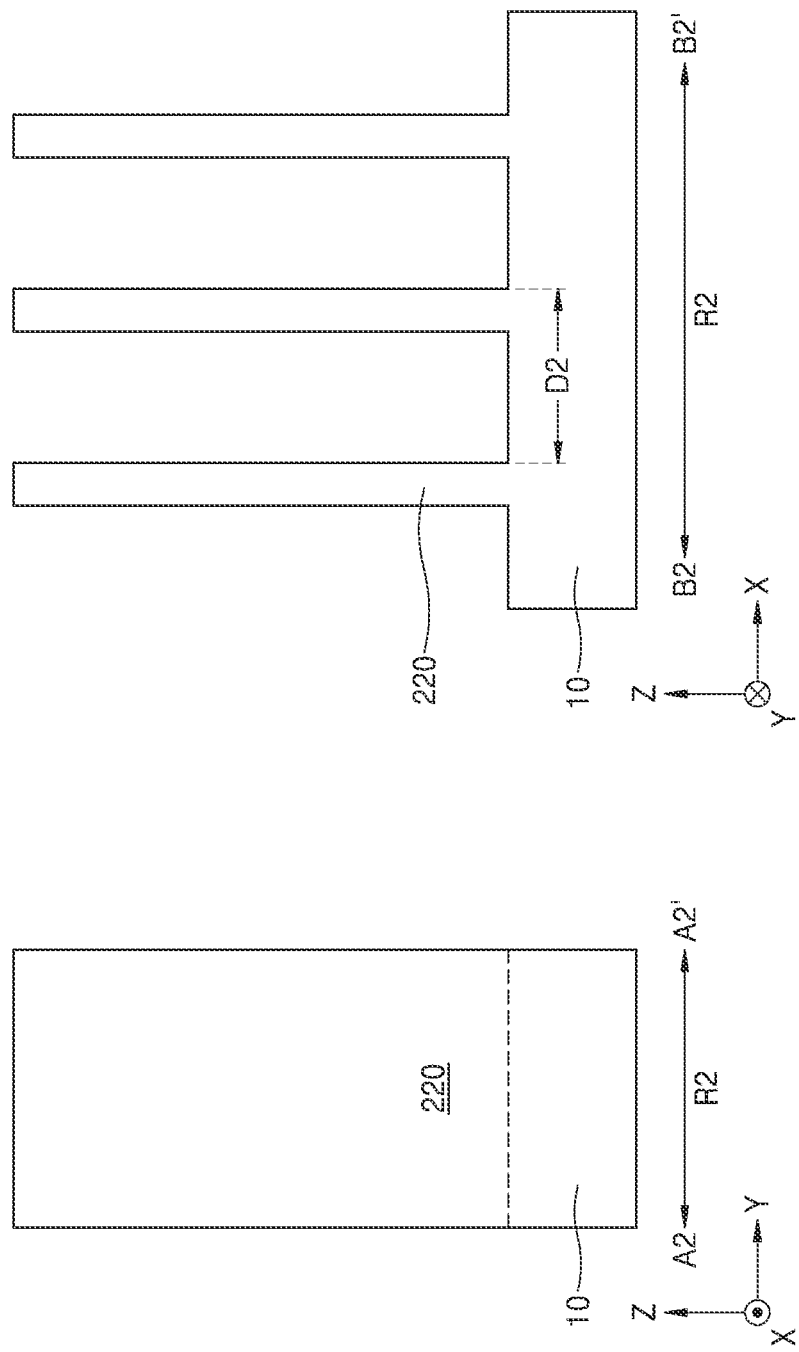

Referring to FIGS. 5A and 5B, the first fin structure 120 may be formed on the first region R1 of the substrate 10, and the second fin structure 220 may be formed on the second region R2 of the substrate 10. The first fin structure 120 and the second fin structure 220 may be formed by etching the substrate 10 or may be formed by forming an epitaxial layer on the substrate 10 and then etching the epitaxial layer. In some embodiments, a pitch D1 of the first fin structures 120 may be greater than a pitch D2 of the second fin structures 220 as shown in FIGS. 5A and 5B. For example, the pitch D1 of the first fin structures 120 may be about twice the pitch D2 of the second fin structures 220.

Figure 6A:
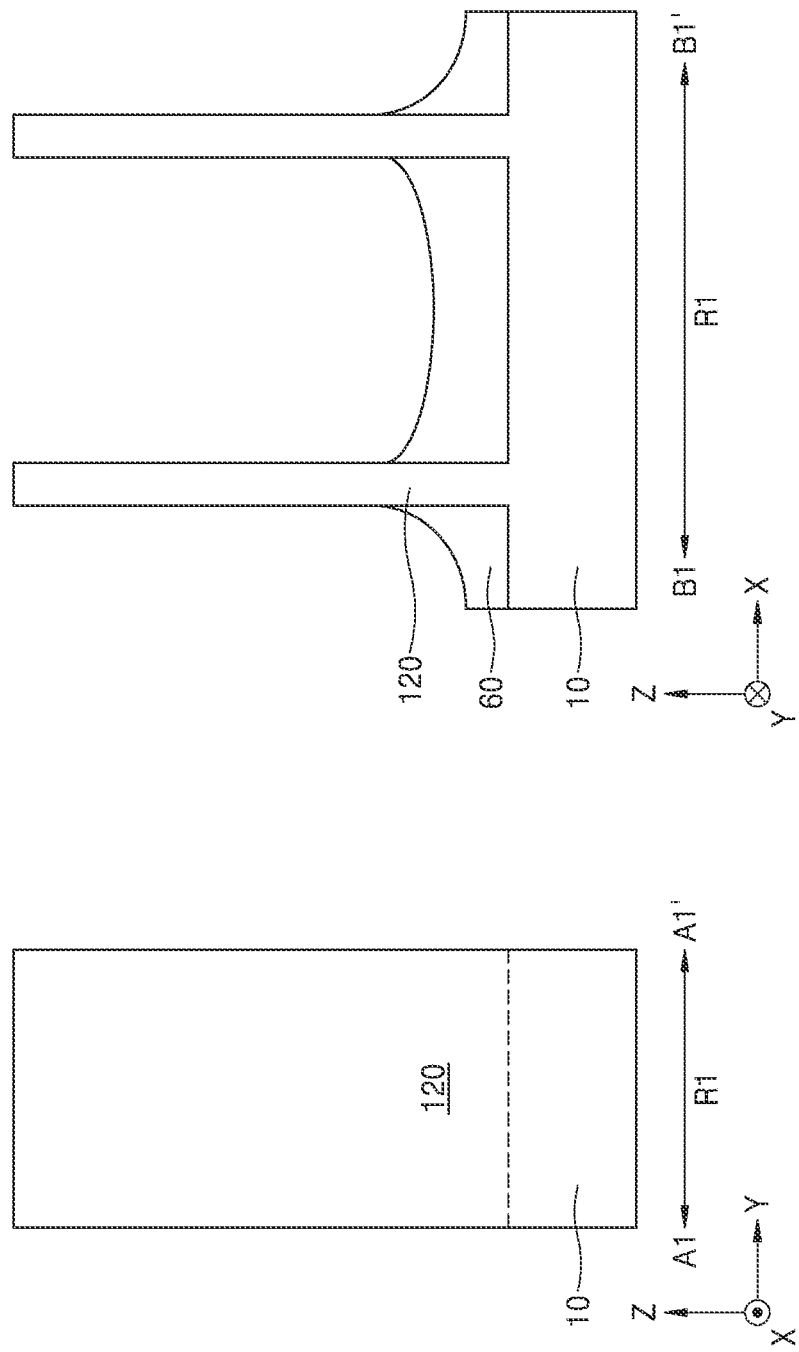
Figure 6B:
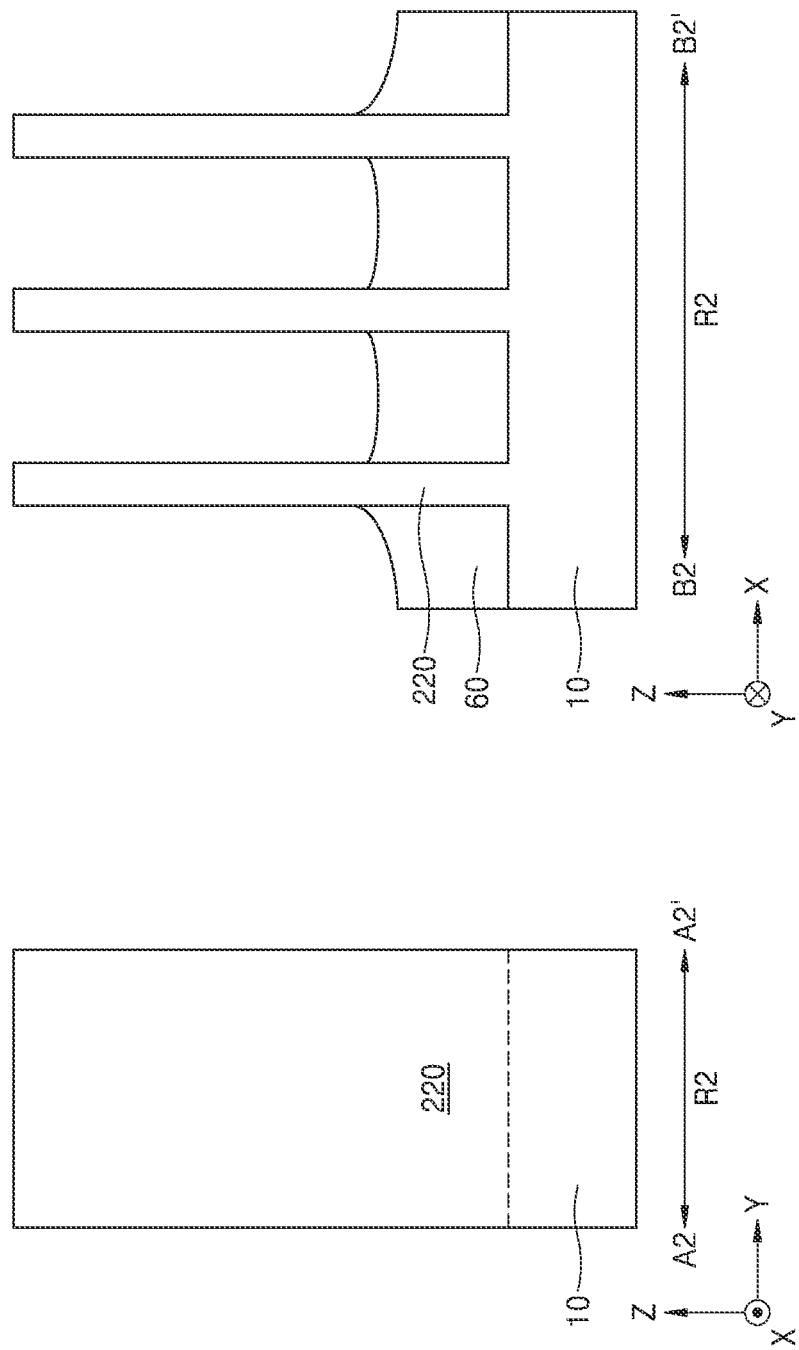

Referring to FIGS. 6A and 6B, the device isolation layer 60 surrounding the side surfaces of the lower portions of the first fin structure 120 and the side surfaces of the lower portions of the second fin structure 220 may be formed on the substrate 10. For example, the device isolation layer 60 may be formed on the top surface of the substrate 10, on side and top surfaces of the first fin structure 120, and on side and top surfaces of the second fin structure 220. Next, the device isolation layer 60 may be planarized to expose the top surface of the first fin structure 120 and the top surface of the second fin structure 220. Next, the upper portion of the remaining device isolation layer 60 may be etched.

Figure 7B:
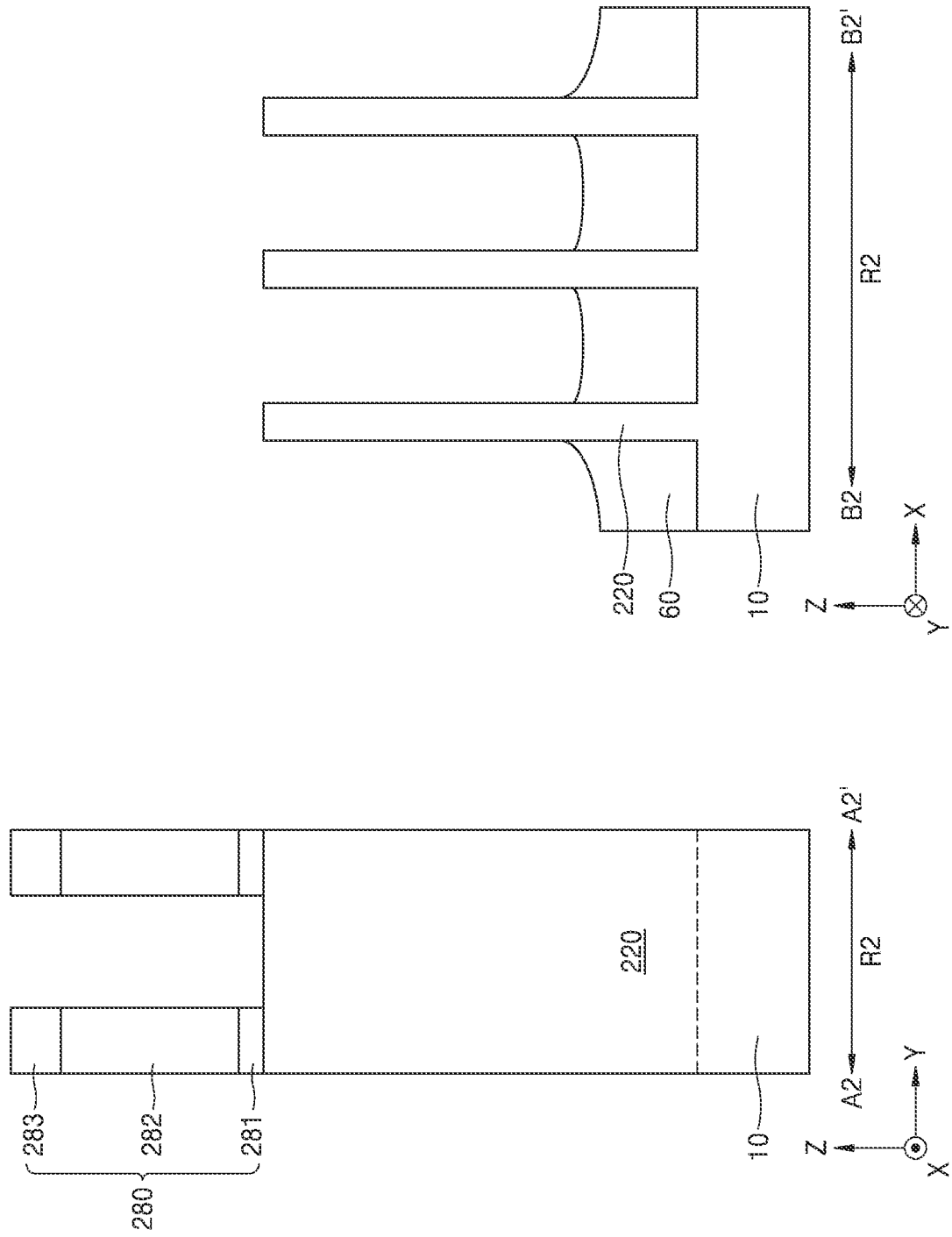

Referring to FIGS. 7A and 7B, first dummy gate structures 180 may be formed on the first fin structure 120, and second dummy gate structures 280 may be formed on the second fin structures 220. In some embodiments, the first dummy gate structures 180 may extend parallel to one another in the X direction and may be apart from one another in the Y direction. The second dummy gate structures 280 may extend parallel to one another in the X direction and may be apart from one another in the Y direction.

The first dummy gate structure 180 may include a first dummy gate insulation layer 181, a first dummy gate electrode layer 182, and a first dummy gate mask layer 183 that are sequentially stacked. The second dummy gate structure 280 may include a second dummy gate insulation layer 281, a second dummy gate electrode layer 282, and a second dummy gate mask layer 283 that are sequentially stacked. The first dummy gate insulation layer 181 and the second dummy gate insulation layer 281 may each include, for example, silicon oxide, silicon nitride, or a combination thereof. The first dummy gate electrode layer 182 and the second dummy gate electrode layer 282 may include a semiconductor material, for example. The first dummy gate mask layer 183 and the second dummy gate mask layer 283 may each include, for example, silicon oxide, silicon nitride, or a combination thereof.

For example, a dummy gate insulation layer, a dummy gate electrode layer, and a dummy gate mask layer are sequentially formed on the first fin structure 120 and the second fin structure 220, and the dummy gate mask layer is patterned. The first dummy gate structure 180 and the second dummy gate structure 280 may be formed by sequentially etching the dummy gate electrode layer and the dummy gate insulation layer by using the dummy gate mask layer as an etching mask.

Figure 8B:
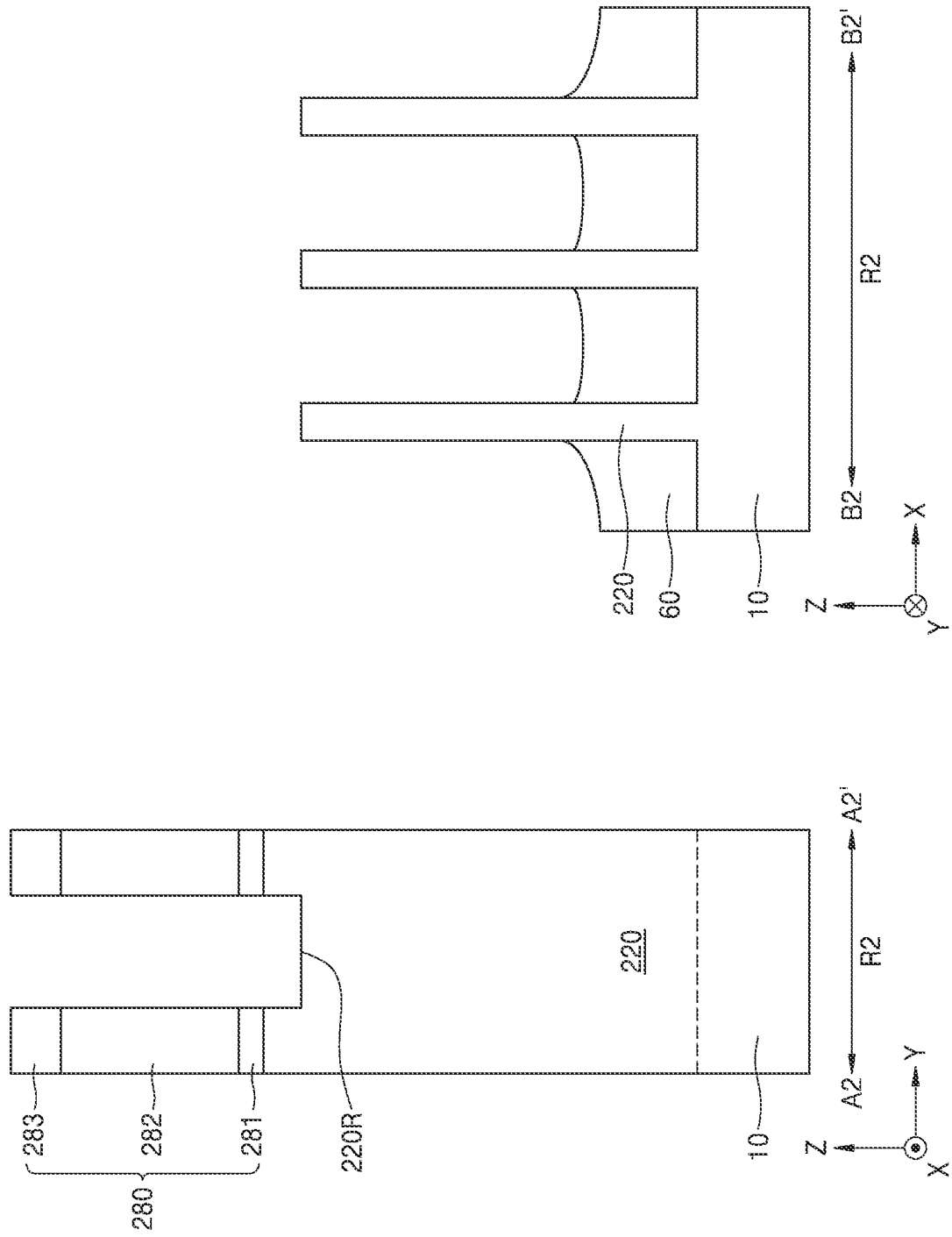

Referring to FIGS. 8A and 8B, a first recess 120R may be formed in the first fin structure 120 by etching the upper portion of the first fin structure 120 by using the first dummy gate structure 180 as an etching mask. In some embodiments, a second recess 220R may be formed in the second fin structure 220 by etching the upper portion of the second fin structure 220 by using the second dummy gate structure 280 as an etching mask.

Figure 9A:
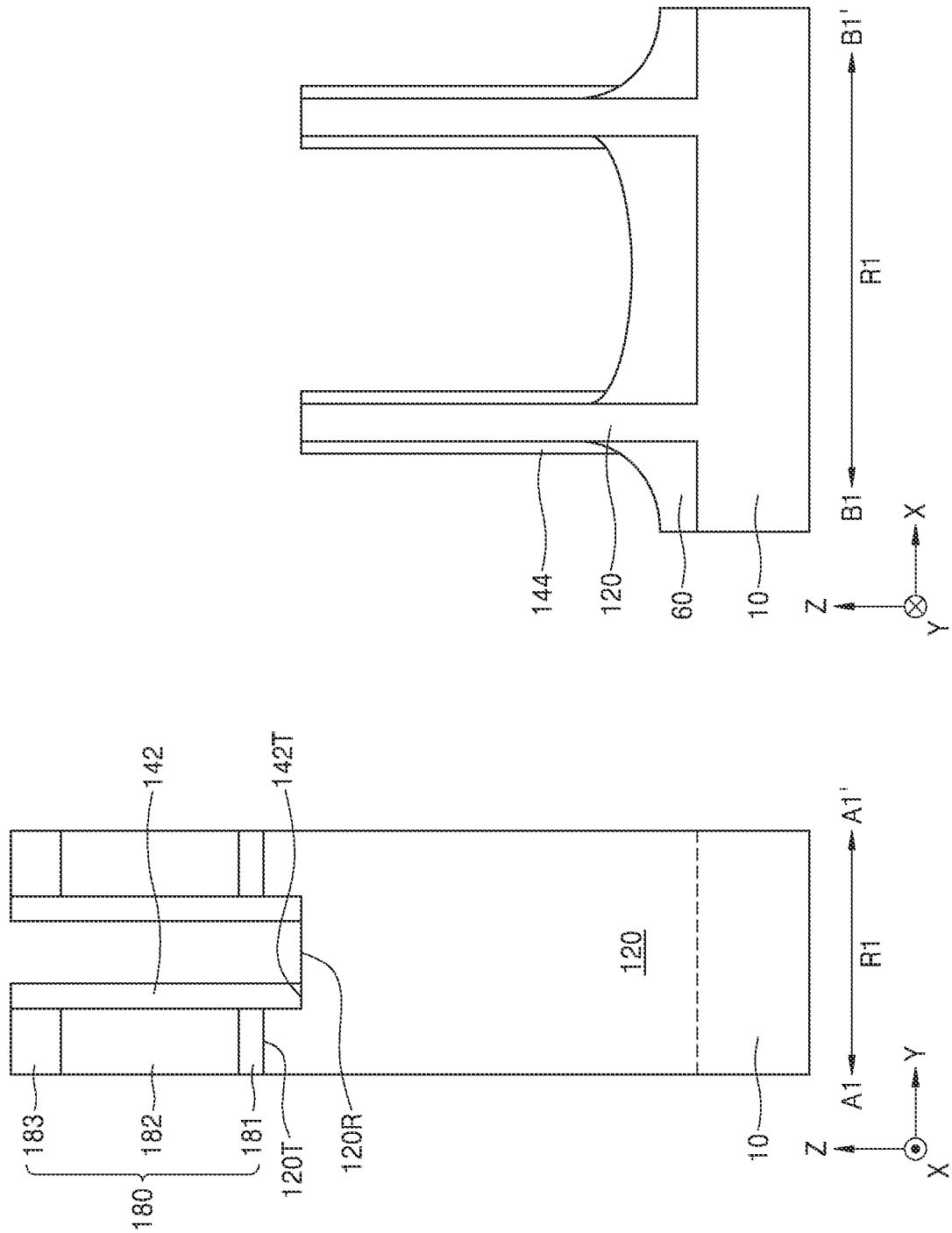
Figure 9B:
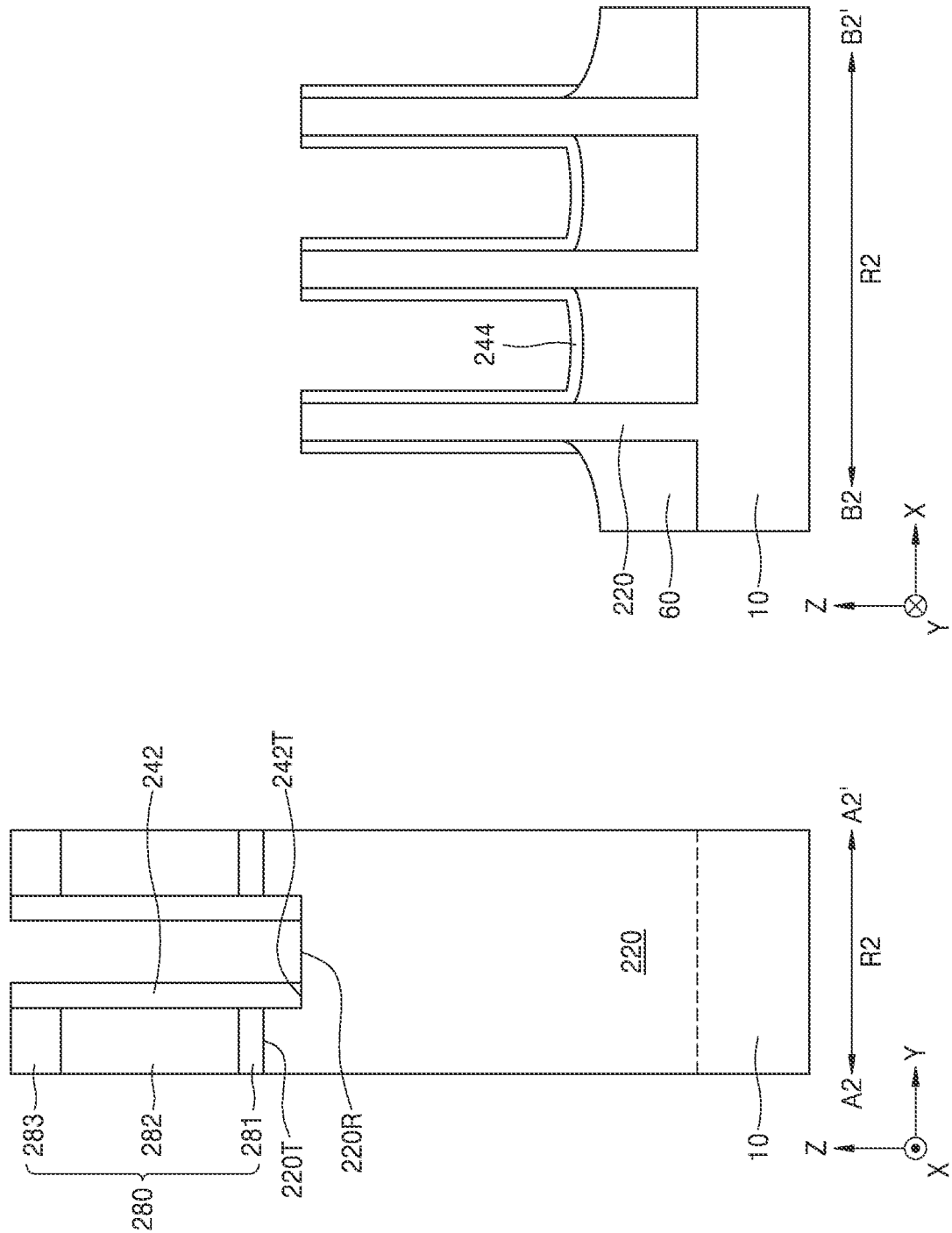

Referring to FIGS. 9A and 9B, first gate spacers 142 on side surfaces of the first dummy gate structure 180, first fin spacers 144 on the side surfaces of the first fin structure 120, second gate spacers 242 on side surfaces of the second dummy gate structure 280, and second fin spacers 244 on the side surfaces of the second fin structure 220 may be formed. For example, a spacer layer may be formed on all of the first dummy gate structure 180, the first fin structure 120, the second dummy gate structure 280, the second fin structure 220, and the device isolation layer 60, and then the spacer layer may be anisotropically etched, thereby forming the first gate spacers 142, the first fin spacers 144, the second gate spacers 242, and the second fin spacers 244. In some embodiments, the first fin spacers 144 and the second fin spacers 244 may be removed.

Due to the first recess 120R of the first fin structure 120, the topmost portion 142T of the bottom surface of the first gate spacer 142 may be formed lower than the topmost portion 120T of the top surface of the first fin structure 120. In some embodiments, due to the second recess 220R of the second fin structure 220, the topmost portion 242T of the bottom surface of the second gate spacer 242 may be formed lower than the topmost portion 220T of the top surface of the second fin structure 220.

Figure 10A:
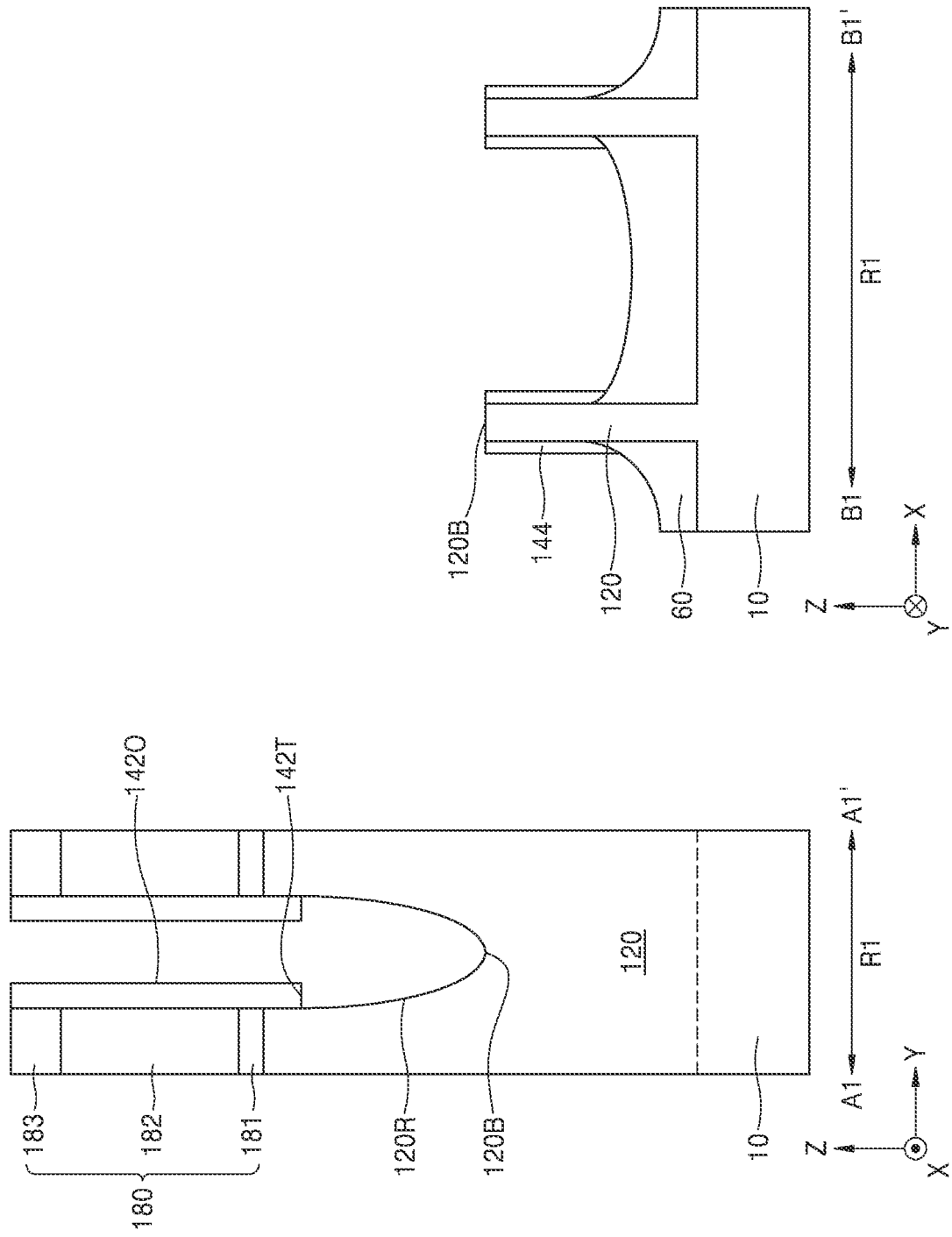
Figure 10B:
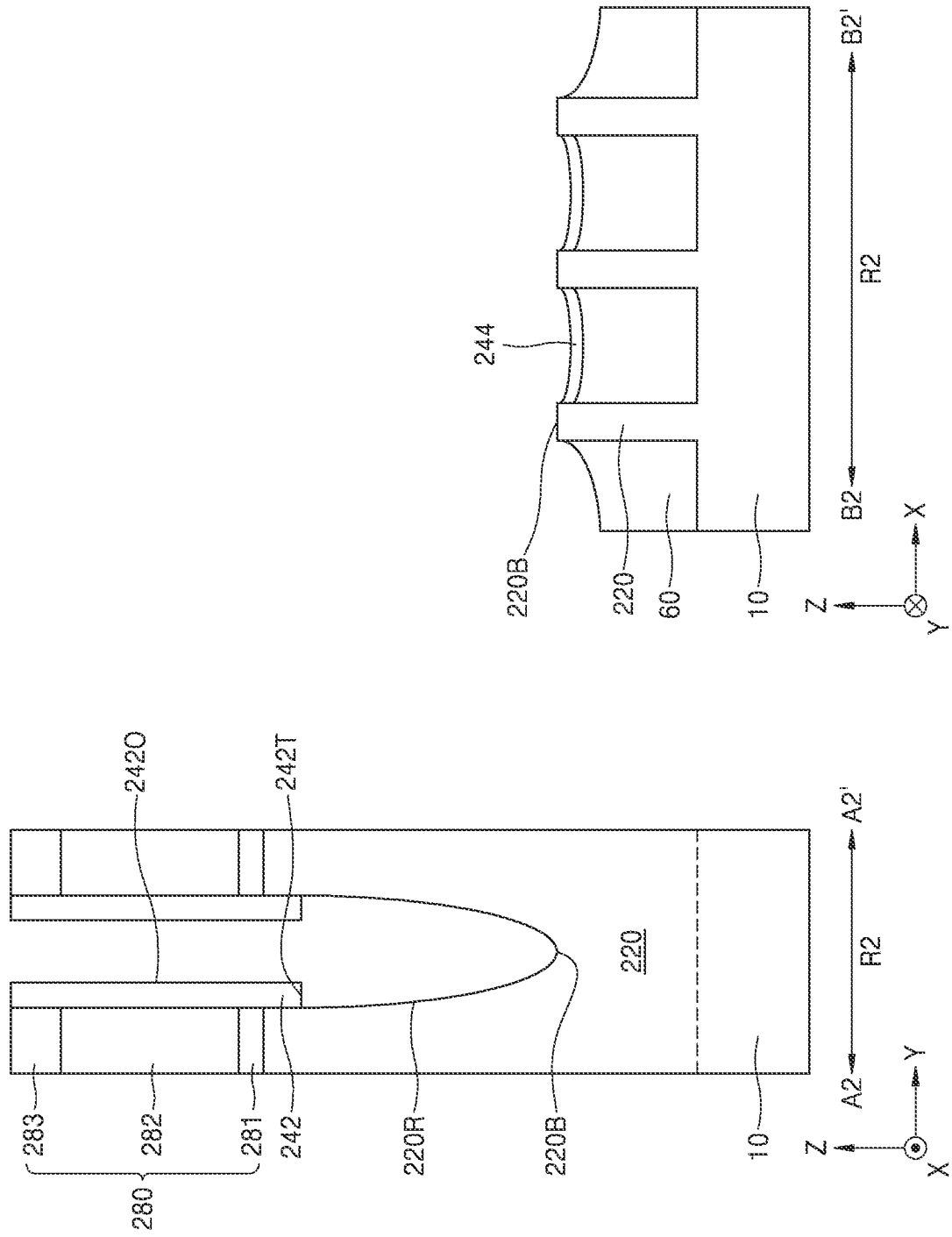

Referring to FIGS. 10A and 10B, after the spacer layers are formed, the first fin structure 120 may be further etched to extend the first recess 120R in the vertical direction, such that the bottommost portion 120B of the top surface of the first fin structure 120 becomes lower than the topmost portion 142T of the bottom surface of the first gate spacer 142. In some embodiments, the first fin structure 120 may be further etched in a horizontal direction (e.g., the Y direction), such that at least some of side surfaces of the first recess 120R are formed closer to the first dummy gate structure 180 in the horizontal direction (the Y direction) than the outer side surface 142O of the first gate spacer 142 is. In other words, a distance from at least some side surfaces of the first recess 120R to the first dummy gate structure 180 may be smaller than a distance from the outer side surface 142O of the first gate spacer 142 to the first dummy gate structure 180 in the horizontal direction. In other words, anisotropic etching and isotropic etching may be performed to the first recess 120R.

Also, the second fin structure 220 may be further etched in the vertical direction, such that the bottommost portion 220B of the top surface of the second fin structure 220 becomes lower than the topmost portion 242T of the bottom surface of the second gate spacer 242. In some embodiments, the second recess 220R may be deeper than first recess 120R. In other words, the bottommost portion 220B of the top surface of the second fin structure 220 may be formed lower than the bottommost portion 120B of the top surface of the first fin structure 120. In some embodiments, the second fin structure 220 may be further etched in a horizontal direction (e.g., the Y direction), such that at least some of side surfaces of the second recess 220R are formed closer to the second dummy gate structure 280 in the horizontal direction (the Y direction) than the outer side surface 242O of the second gate spacer 242 is. In other words, a distance from at least some side surfaces of the second recess 220R to the second dummy gate structure 280 may be smaller than a distance from the outer side surface 242O of the second gate spacer 242 to the second dummy gate structure 280 in the horizontal direction. In other words, anisotropic etching and isotropic etching may be performed to the second recess 220R.

Figure 11B:
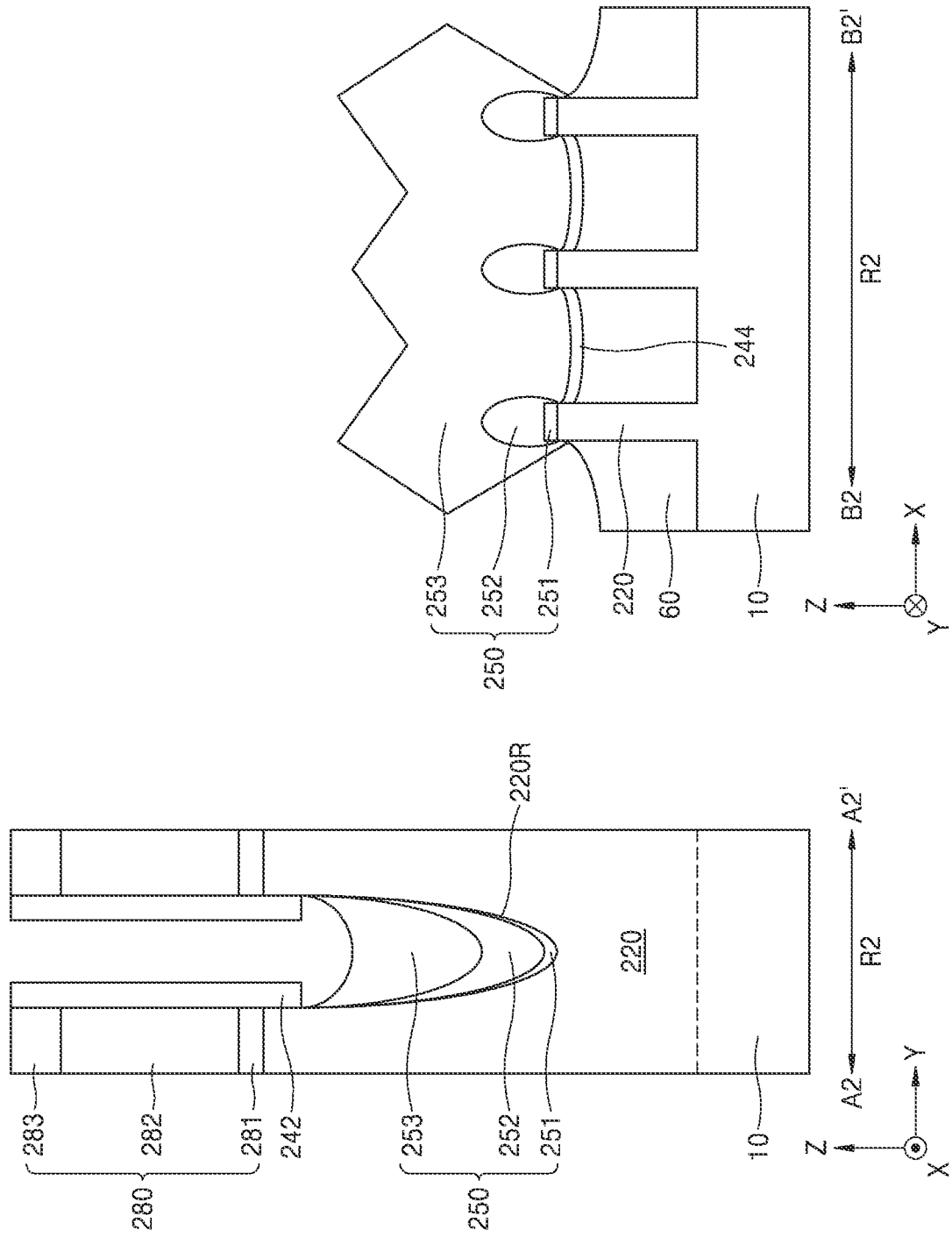

Referring to FIGS. 11A and 11B, the first source/drain structure 150 in the first recess 120R of the first fin structure 120 and the second source/drain structure 250 in the second recess 220R of the second fin structure 220 may be formed through selective epitaxial growth (SEG). In some embodiments, the first source/drain structure 150 and the second source/drain structure 250 may be formed through a plurality of SEG operations. For example, a first source/drain layer 151 in the first recess 120R and a first source/drain layer 251 in the second recess 220R may be formed through a first SEG operation, a second source/drain layer 152 in the first recess 120R and a second source/drain layer 252 in the second recess 220R may be formed through a second SEG operation, and a third source/drain layer 153 in the first recess 120R and a third source/drain layer 253 in the second recess 220R may be formed through a third SEG operation.

Figure 11C:
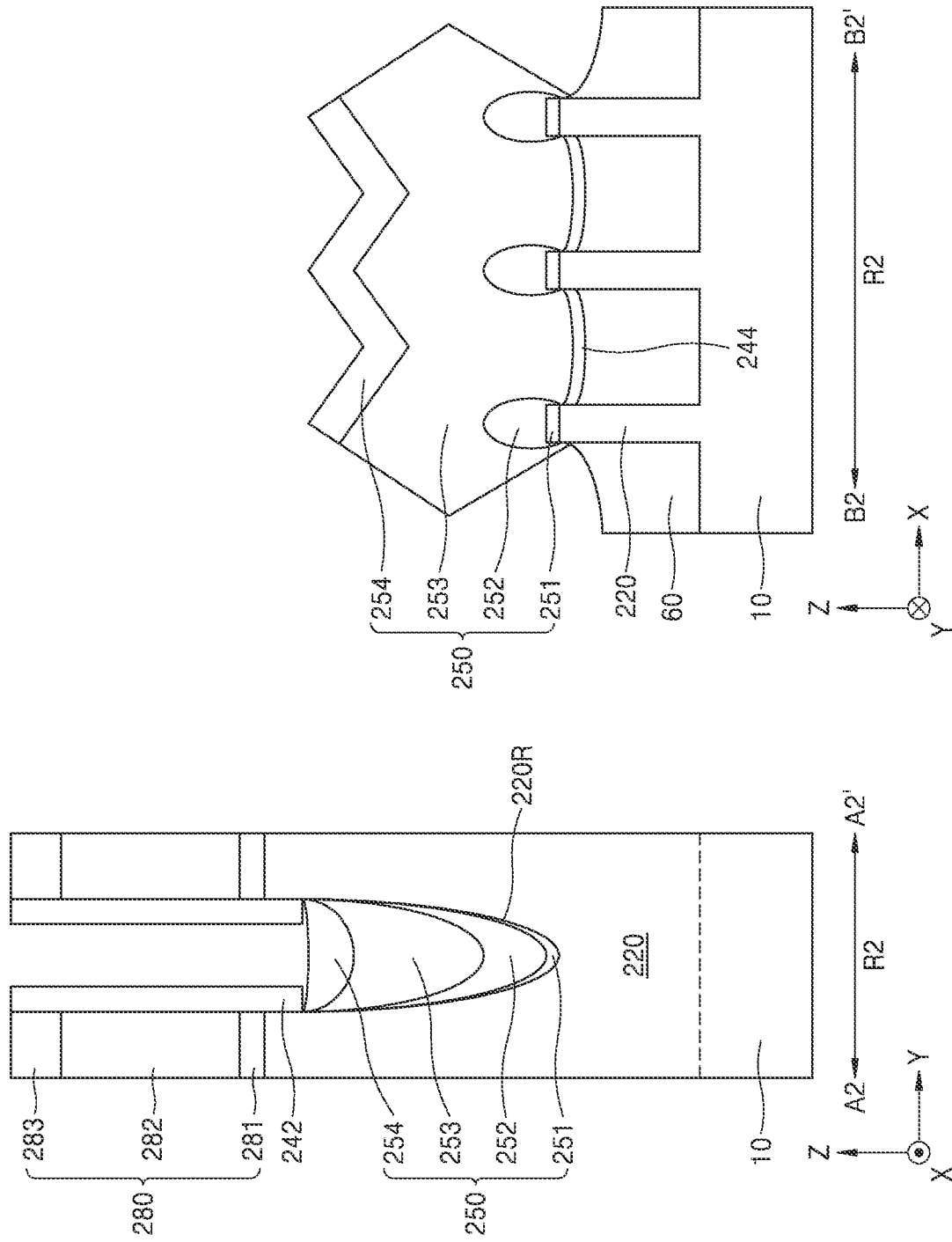

Referring to FIG. 11C, in some embodiments, the second source/drain structure 250 may be further grown through SEG. For example, a fourth source/drain layer 254 may be formed in the second recess 220R of the second fin structure 220, e.g., on the third source/drain layer 253. Growth of the first source/drain structure 150 may be suppressed while the second source/drain structure 250 is being grown, that is, while the fourth source/drain layer 254 is being formed. For example, by using a source gas that does not include Cl (e.g., SiH4) as a Si source gas and using a relatively low flow rate carrier gas (e.g., H2 gas), growth of the first source/drain structure 150 may be suppressed while the second source/drain structure 250 is being grown. Therefore, the second source/drain structure 250 may be grown large to improve the performance of a semiconductor device, and the first source/drain structures 150 may be prevented from being overgrown and merged with one another.

Figure 12A:
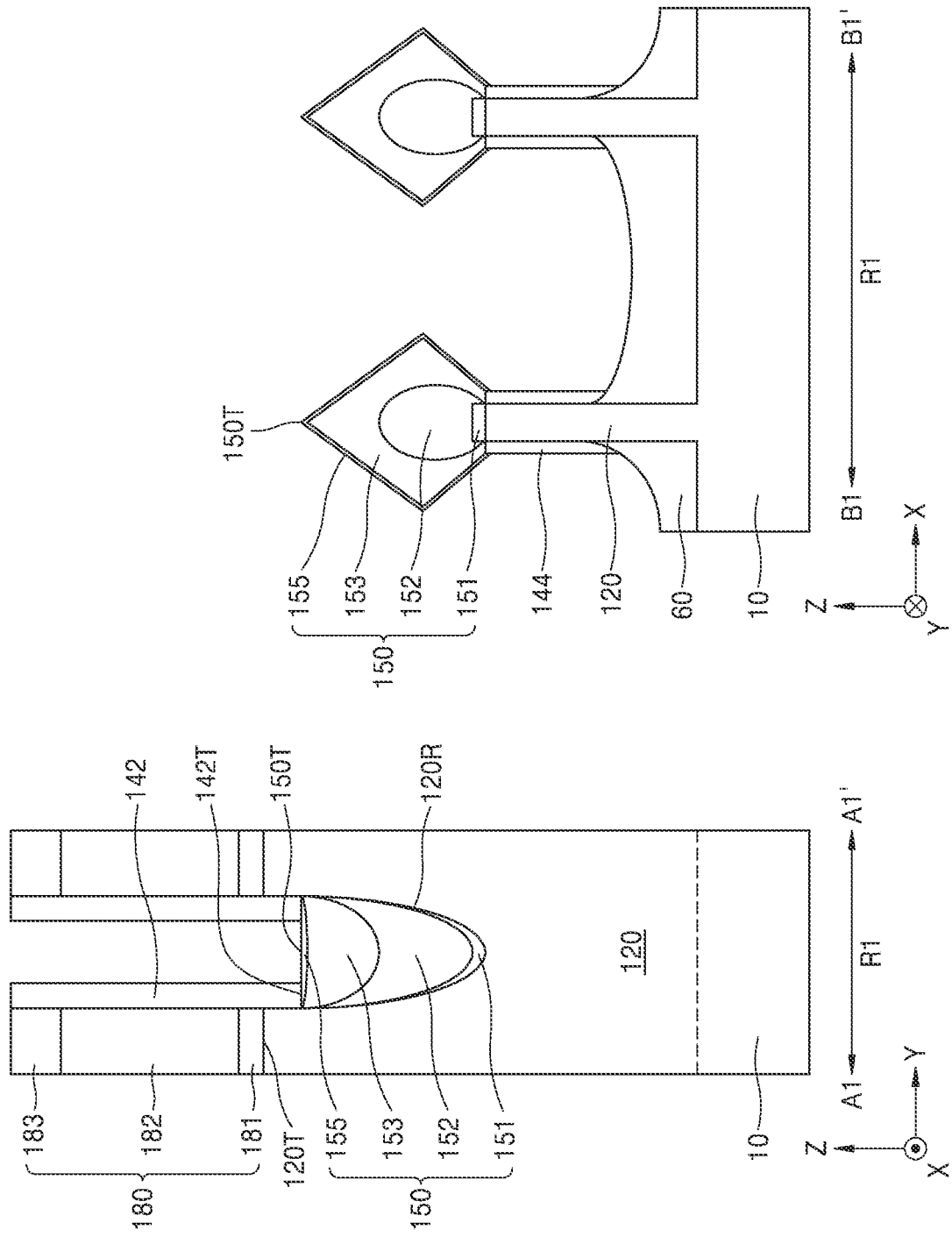
Figure 12B:
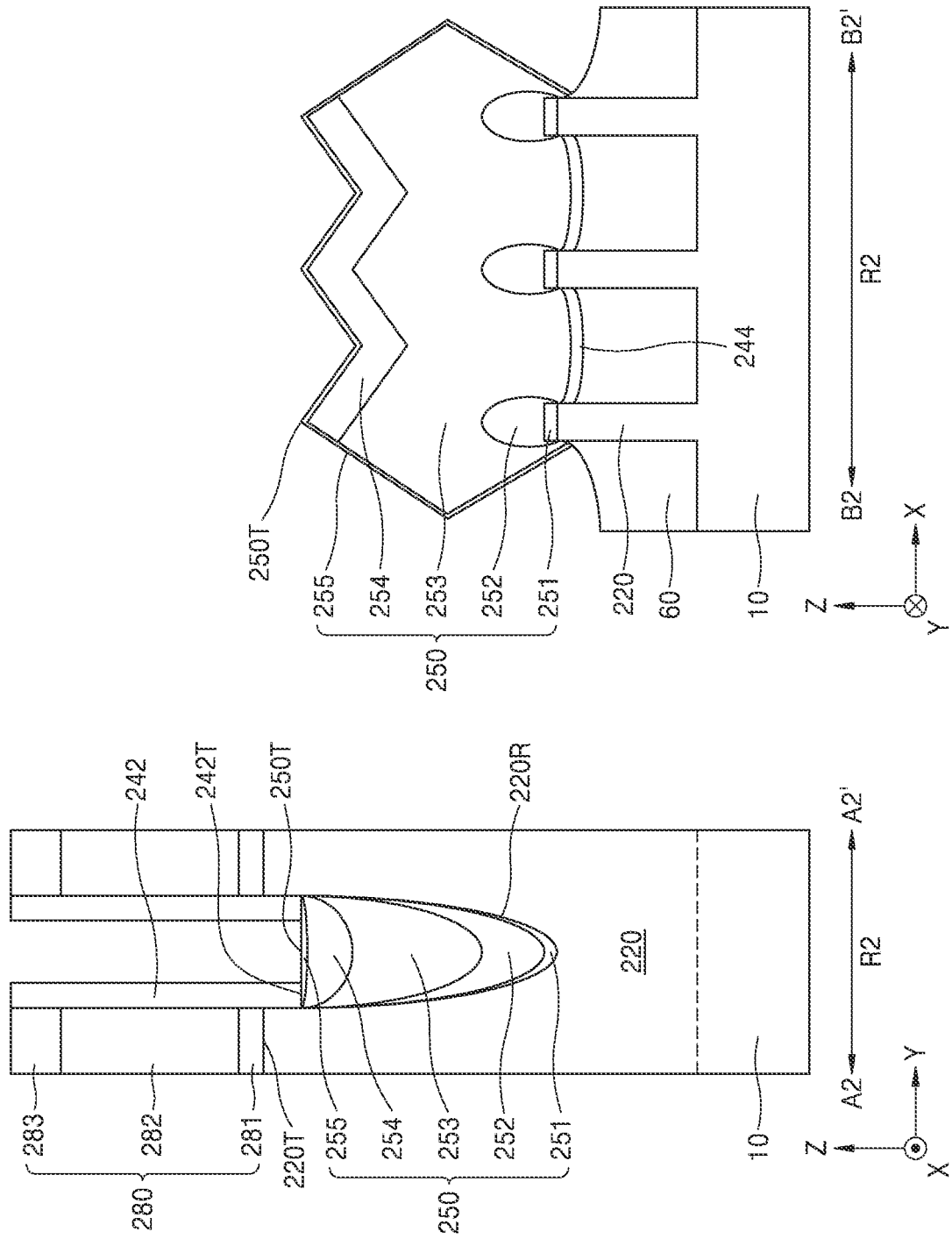

Referring to FIGS. 12A and 12B, in some embodiments, the first source/drain structure 150 and the second source/drain structure 250 may be further grown through SEG. For example, a capping layer 155 in the first recess 120R and a capping layer 255 in the second recess 220R may be formed.

When the first source/drain structure 150 contacts the first gate spacer 120 during the growth of the first source/drain structure 150 described above with reference to FIGS. 11A and 12A, the growth of the first source/drain structure 150 may be suppressed. Therefore, the first source/drain structure 150 may be prevented from growing up above the topmost portion 142T of the bottom surface of the first gate spacer 142. Since the topmost portion 142T of the bottom surface of the first gate spacer 142 is lower than the topmost portion 120T of the top surface of the first fin structure 120, the topmost portion 150T of the top surface of the first source/drain structure 150 may be lower than the topmost portion 120T of the top surface of the first fin structure 120.

As shown in FIG. 2, even when the topmost portion 150T of the top surface of the first source/drain structure 150 grows higher than the topmost portion 142T of the bottom surface of the first gate spacer 142, the growth rate of the first source/drain structure 150 is significantly reduced after the topmost portion 150T of the top surface of the drain structure 150 is grown to the topmost portion 142T of the bottom surface of the first gate spacer 142, and thus growth of the first source/drain structure 150 may stop before the topmost portion 150T of the top surface of the first source/drain structure 150 reaches the topmost portion 120T of the top surface of the first fin structure 120. Therefore, the topmost portion 150T of the top surface of the first source/drain structure 150 may be formed lower than the topmost portion 120T of the top surface of the first fin structure 120.

When the topmost portion 150T of the top surface of the first source/drain structure 150 is formed lower than the topmost portion 120T of the top surface of the first fin structure 120, abnormal growth of the first source/drain structure 150 may be prevented, and the first source/drain structures 150 may be prevented from being merged with one another. Therefore, it is possible to prevent a defect of the semiconductor device that occurs as the first source/drain structures 150 are merged with one another.

In some embodiments, for example, when the topmost portion 242T of the bottom surface of the second gate spacer 242 is formed lower than the topmost portion 220T of the top surface of the second fin structure 220, the topmost portion 250T of the top surface of the second source/drain structure 250 may be formed lower than the topmost portion 220T of the top surface of the second fin structure 220. However, since the second recess 220R is deeper than the first recess 120R, the second source/drain structure 250 may be formed larger than the first source/drain structure 150 in the vertical direction and the horizontal direction (e.g., the X direction), and the pitch D2 (refer to FIG. 5B) of the second fin structures 220 is smaller than the pitch D1 (refer to FIG. 5A) of the first fin structures 120. Therefore, portions of the second source/drain structure 250 respectively grown from each of the second fin structures 220 may be merged with one another. Although FIG. 11B shows that merging occurs while the third source/drain layer 253 is being formed, merging may also occur while another source/drain layer is being formed. For example, merging may occur while the second source/drain layer 252 or the fourth source/drain layer 254 is being formed. By growing the second source/drain structure 250 largely to cause the merging of the second source/drain structure 250, the mobility of charge carriers may be increased and the resistance and the contact resistance of the second source/drain structure 250 may be reduced. Therefore, a semiconductor device with improved performance may be manufactured.

Referring to FIGS. 13A and 13B, the interlayer insulation layer 90 may be formed on the first source/drain structure 150, the second source/drain structure 250, the first gate spacer 142, the second gate spacer 242, and the device isolation layer 60. The interlayer insulation layer 90 may then be planarized to expose top surfaces of the first dummy gate electrode layer 182 of the first dummy gate structure 180 and the second dummy gate electrode layer 282 of the second dummy gate structure 280. During the planarization, the first dummy gate mask layer 183 (refer to FIG. 12A) and the second dummy gate mask layer 283 (refer to FIG. 12B) may also be removed.

Figure 14B:
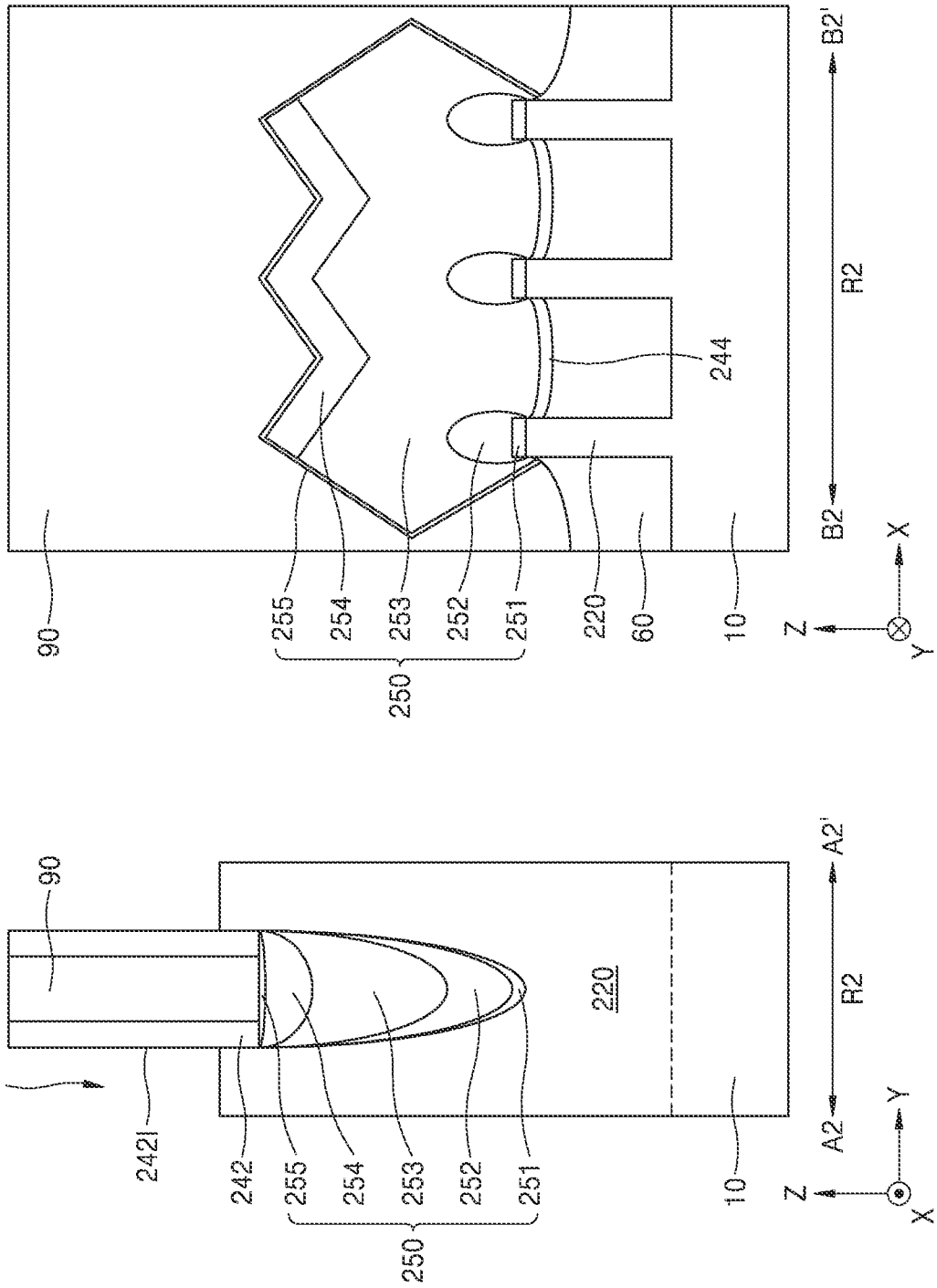

Referring to FIGS. 14A and 14B, a first opening OP1 and a second opening OP2 may be formed by removing the first dummy gate structure 180 (refer to FIG. 13A) and the second dummy gate structure 280 (refer to FIG. 13B), respectively. The first opening OP1 may expose the first fin structure 120 and the inner side surface 142I of the first gate spacer 142. The second opening OP2 may expose the second fin structure 220 and the inner side surface 242I of the second gate spacer 242.

The first gate structure 130 (refer to FIG. 2B) may be formed in the first opening OP1, and the second gate structure 230 (refer to FIG. 2C) may be formed in the second opening OP2. For example, gate insulation layers and gate electrode layers are sequentially formed on a portion of the first fin structure 120 and a portion of the inner side surface 142I of the first gate spacer 142 that are exposed in the first opening OP1 and a portion of the second fin structure and a portion of the inner side surface 242I of the second gate spacer 242 that are exposed in the second opening OP2 and the gate insulation layers and the gate electrode layers are planarized to expose the interlayer insulation layer 90, and thus the first gate structure 130 (refer to FIG. 2B) and the second gate structure 230 (refer to FIG. 2C) may be formed.

According to the method described above with reference to FIGS. 5A to 14B, the semiconductor device 1000 described above with reference to FIGS. 1B and 1C or the semiconductor device 1000a described above with reference to FIG. 2 may be manufactured.

In some embodiments, the formation of the second recess 220R in the second fin structure 220 shown in FIG. 8B may be omitted before the formation of the second gate spacer 242 shown in FIG. 9B. Therefore, as shown in FIG. 3, the topmost portion 242T of the bottom surface of the second gate spacer 242 may be formed at the same height as the topmost portion 220T of the top surface of the second fin structure 220. The topmost portion 242T of the bottom surface of the second gate spacer 242 is formed at the same height as the topmost portion 220T of the top surface of the second fin structure 220, and thus, in some embodiments, the topmost portion 250T of the second source/drain structure 250 may be formed at the same height as the topmost portion 220T of the top surface of the second fin structure 220 or higher than the topmost portion 220T of the top surface of the second fin structure 220. In this regard, the semiconductor device 1000b described above with reference to FIG. 3 may be manufactured.

FIGS. 15A to 26B are diagrams showing a method of manufacturing a semiconductor device according to an embodiment.

Figure 15A:
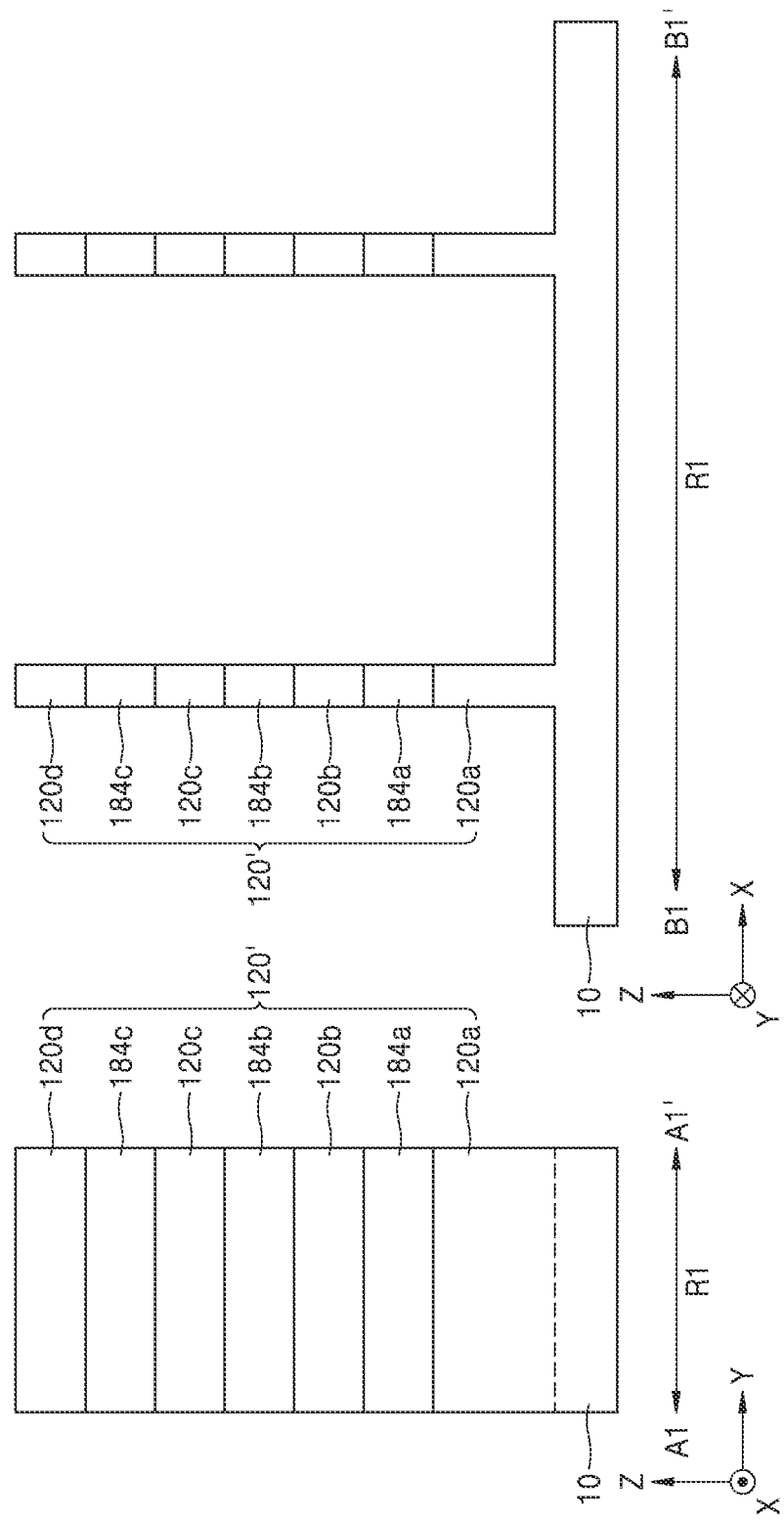
Figure 15B:
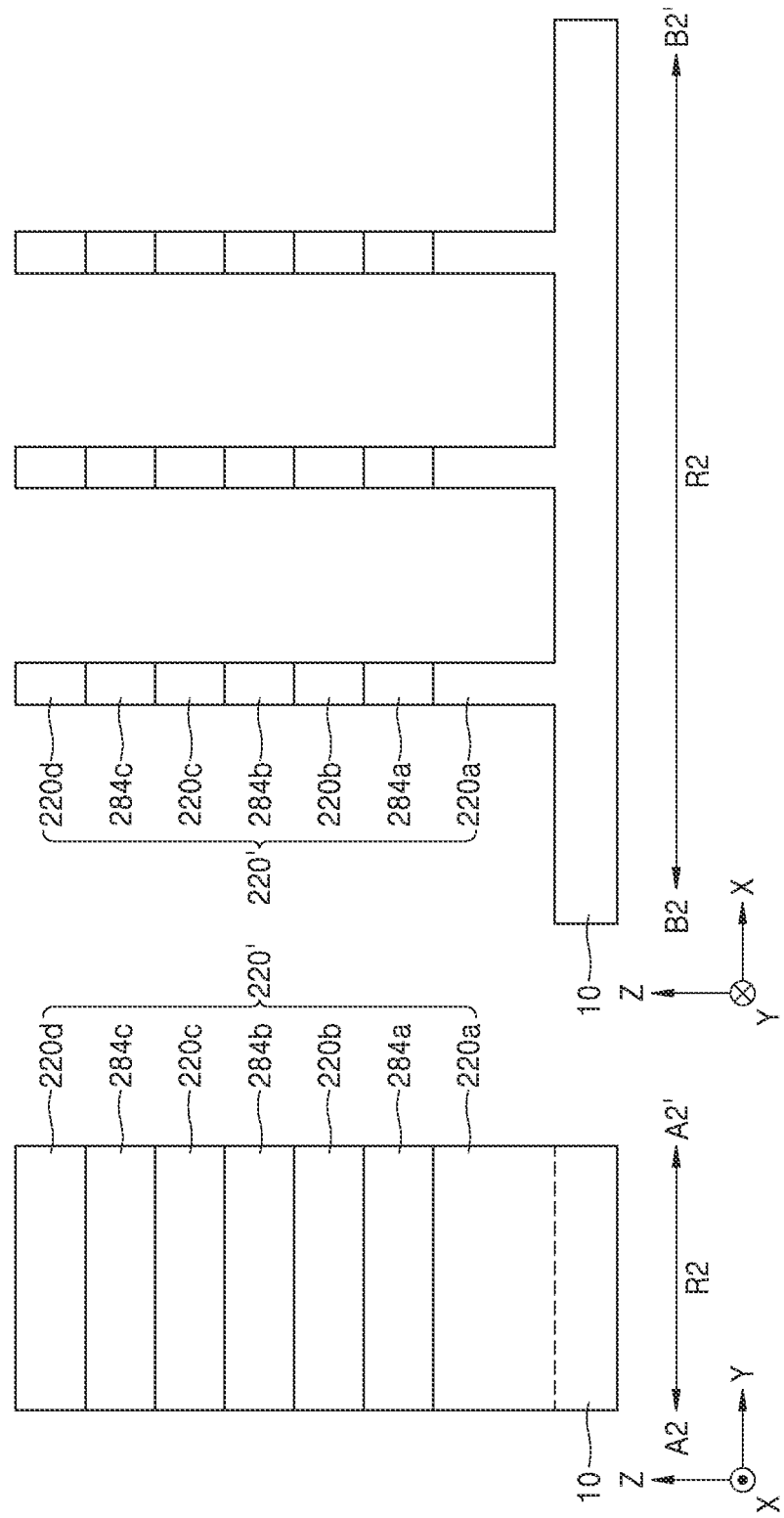

Referring to FIGS. 15A and 15B, a first fin structure 120' may be formed on the first region R1 of the substrate 10, and a second fin structure 220' may be formed on the second region R2 of the substrate 10. The first fin structure 120' may include a plurality of first channels 120a to 120d apart (i.e., separated) from one another in the vertical direction and a plurality of first sacrificial layers 184a to 184c respectively located between adjacent pairs of first channels 120a to 120d. The second fin structure 220' may include a plurality of second channels 220a to 220d apart from one another in the vertical direction and a plurality of second sacrificial layers 284a to 284c respectively located between adjacent pairs of second channels 220a to 220d. The first channels 120a to 120d and the second channels 220a to 220d may include a semiconductor material, and the first sacrificial layers 184a to 184c and the second sacrificial layers 284a to 284c may include another semiconductor material. For example, the first channels 120a to 120d and the second channels 220a to 220d may include Si, whereas the first sacrificial layers 184a to 184c and the second sacrificial layers 284a to 284c may include SiGe.

For example, a plurality of sacrificial layers and a plurality of channel layers may be alternately stacked on the first region R1 and the second region R2 of the substrate 10 through epitaxial growth, and upper portions of the sacrificial layers, the channel layers, and the substrate 10 may be etched, thereby forming the first fin structure 120' and the second fin structure 220'.

Figure 16B:
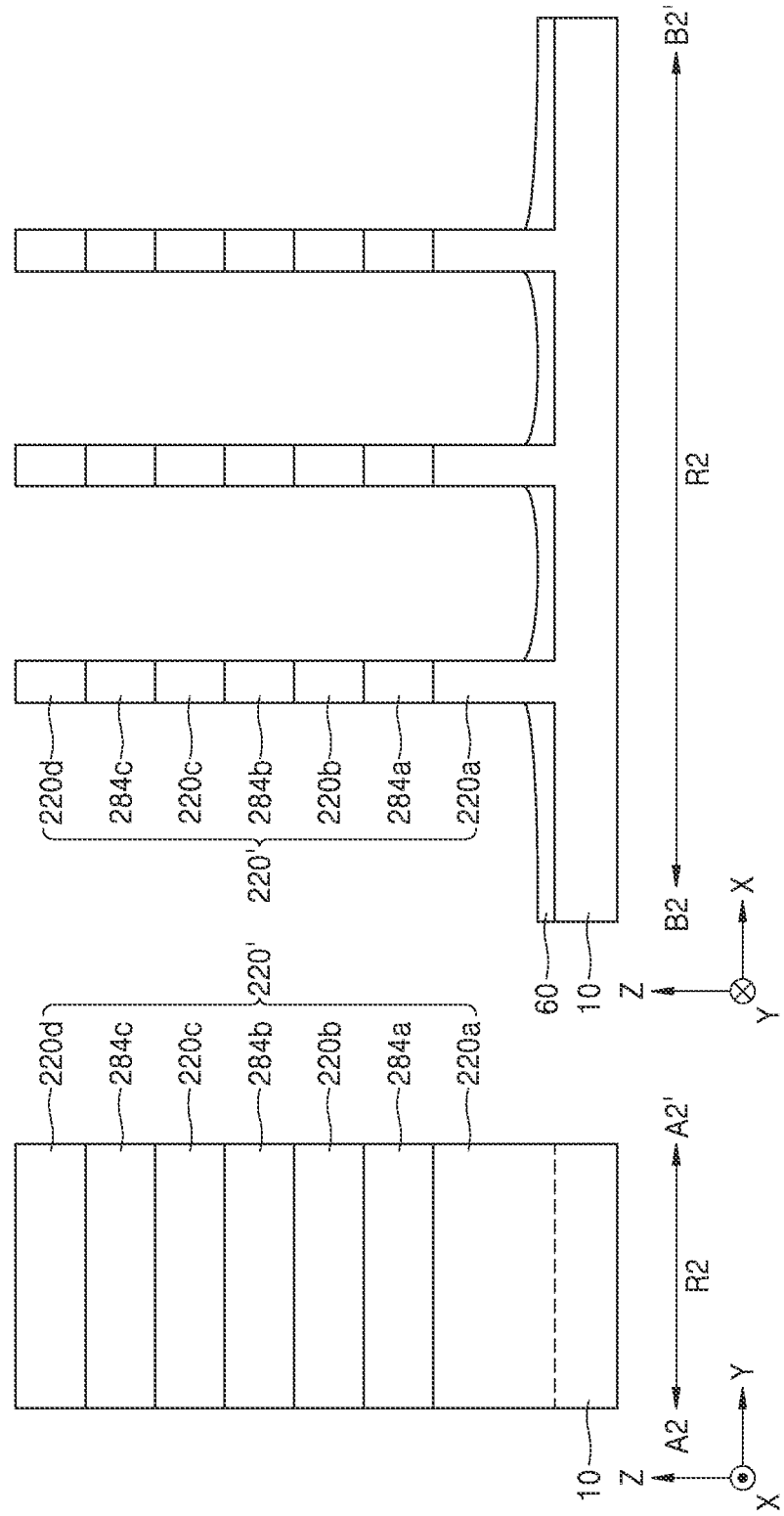

Referring to FIGS. 16A and 16B, the device isolation layer 60 surrounding the side surfaces of the lower portions of the first fin structure 120' and the side surfaces of the lower portions of the second fin structure 220' may be formed on the substrate 10. An operation for forming the device isolation layer 60 is the same as the operation described above with reference to FIGS. 6A and 6B.

Figure 17B:
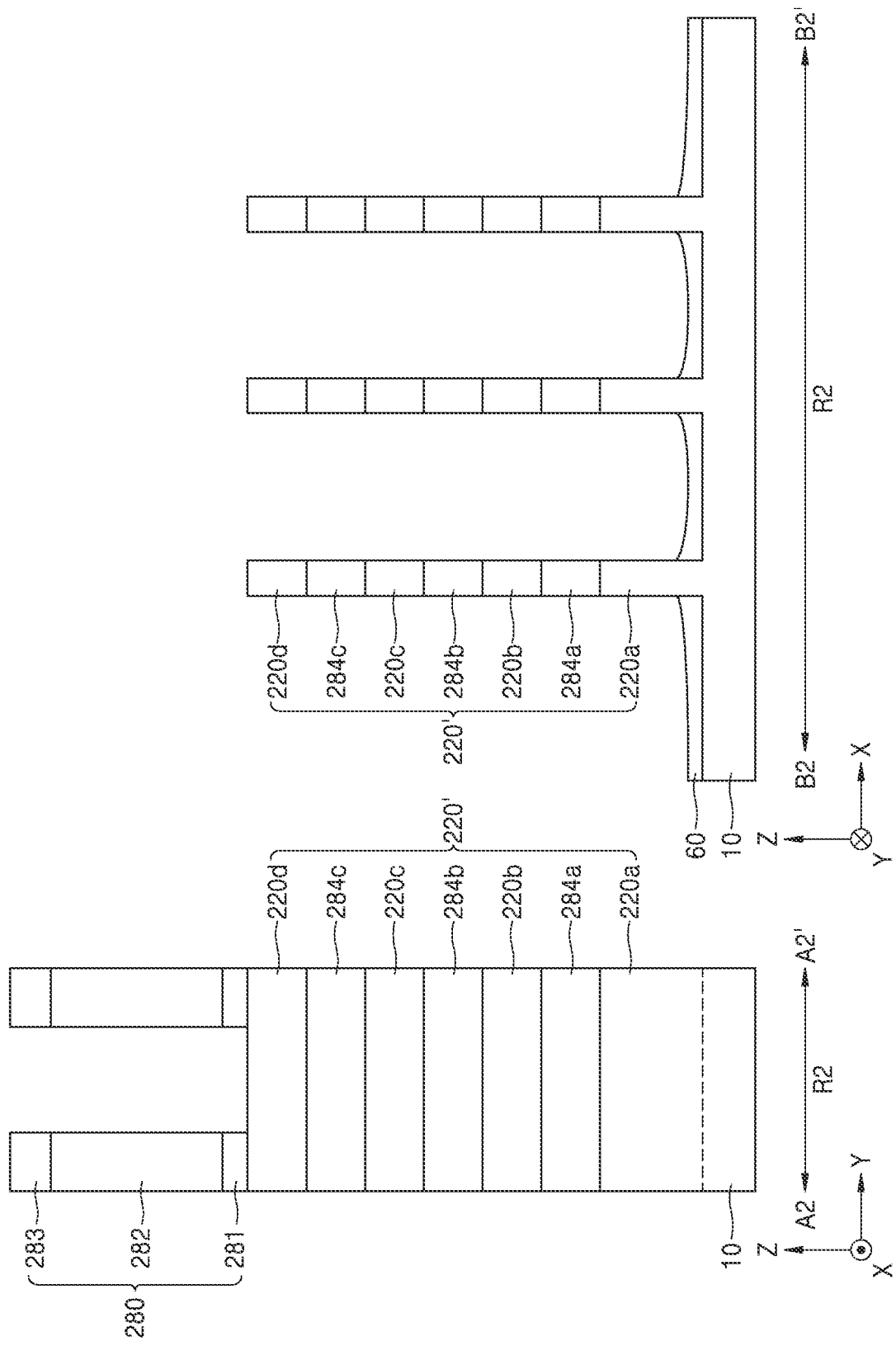

Referring to FIGS. 17A and 17B, the first dummy gate structures 180 may be formed on the first fin structure 120', and the second dummy gate structures 280 may be formed on the second fin structures 220'. Operations for forming the first dummy gate structures 180 and the second dummy gate structures 280 are the same as the operations described above with reference to FIGS. 7A and 7B.

Figure 18A:
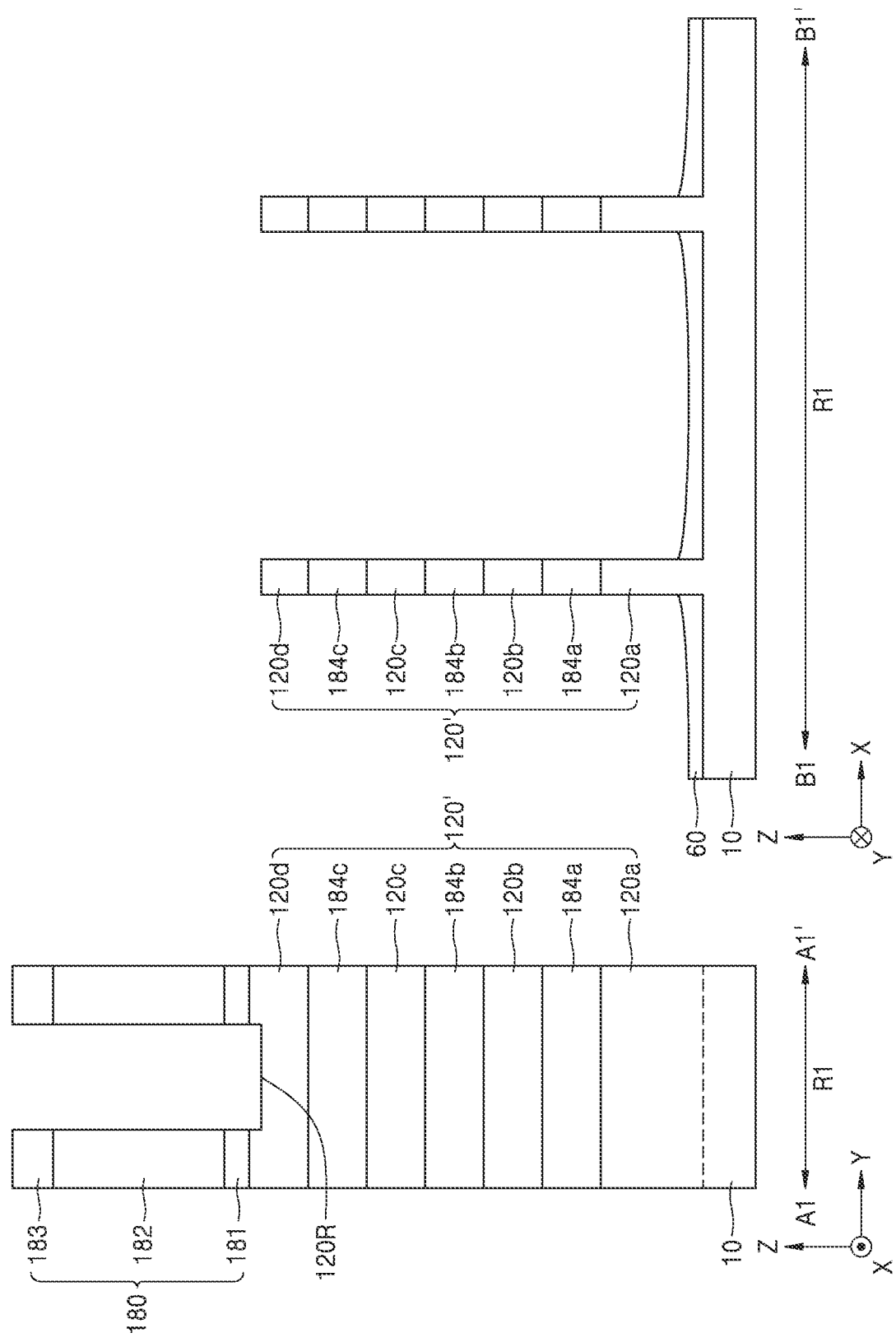
Figure 18B:
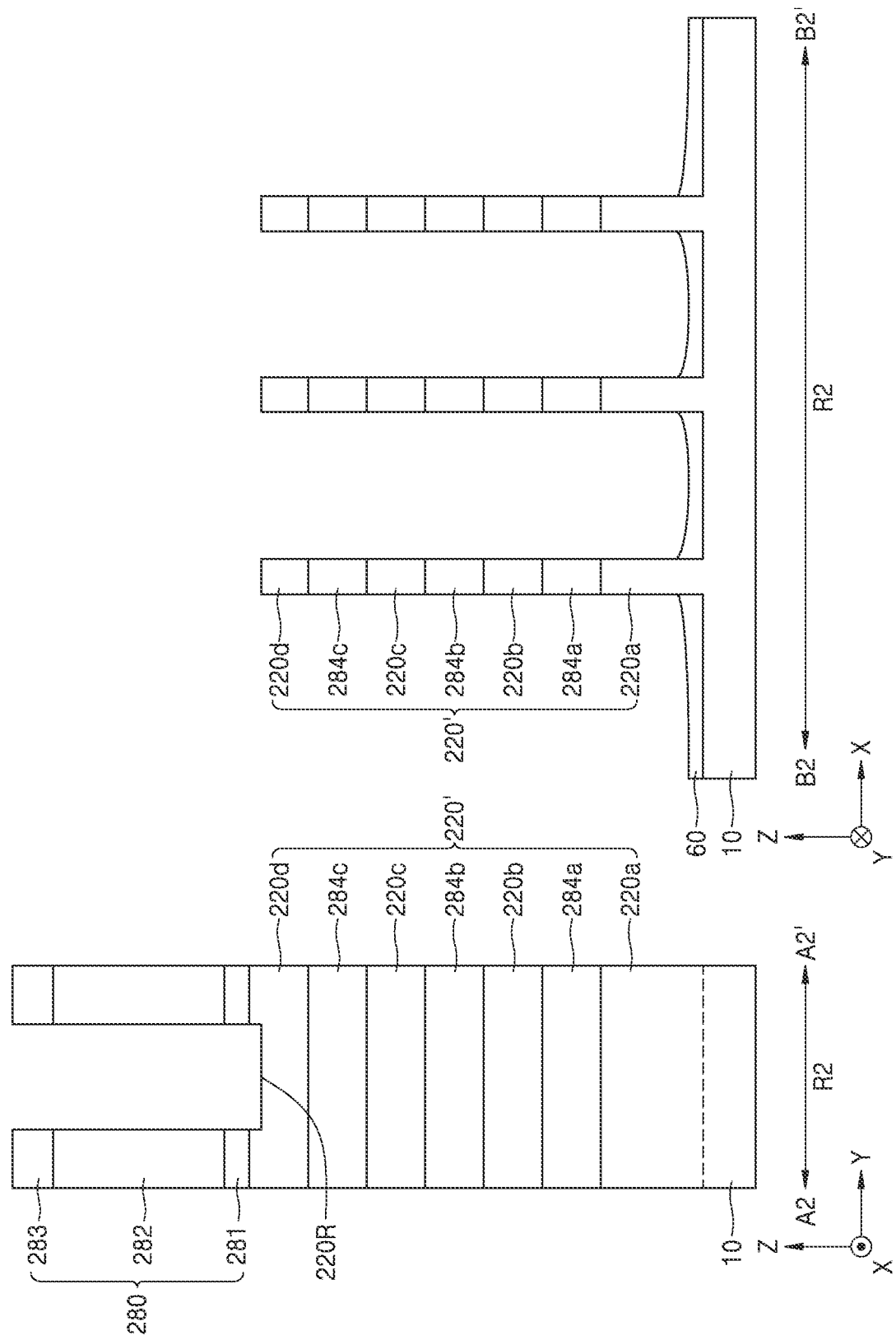

Referring to FIGS. 18A and 18B, the first recess 120R may be formed in a topmost first channel, that is, the first channel 120d by etching the upper portion of the topmost first channel, that is, the first channel 120d by using the first dummy gate structure 180 as an etching mask. In some embodiments, the second recess 220R may be formed in a topmost second channel, that is, the second channel 220d, by etching the upper portion of the topmost second channel, that is, the second channel 220d by using the second dummy gate structure 280 as an etching mask. In another embodiment, the formation of the second recess 220R may be omitted.

Figure 19B:
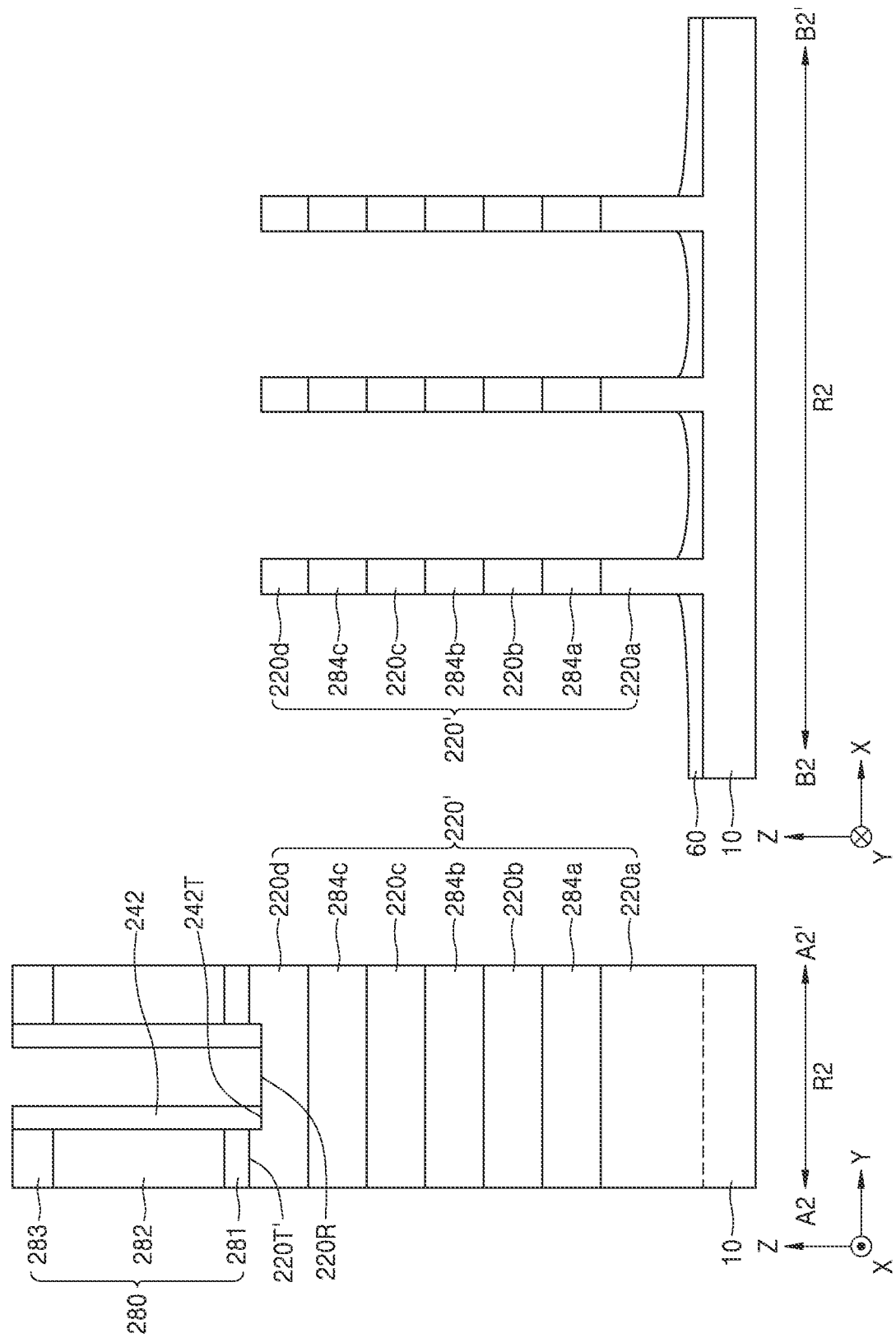

Referring to FIGS. 19A and 19B, the first gate spacers 142 on the side surfaces of the first dummy gate structure 180 and the second gate spacers 242 on the side surfaces of the second dummy gate structure 280 may be formed. For example, a spacer layer may be formed on the first dummy gate structure 180, the first fin structure 120', the second dummy gate structure 280, the second fin structure 220', and the device isolation layer 60, and then the spacer layer may be anisotropically etched, thereby forming the first gate spacers 142 and the second gate spacers 242. In some embodiments, first fin spacers on the side surfaces of the first fin structure 120' and second fin spacers on the side surfaces of the second fin structure 220' may be further formed.

Due to the first recess 120R, the topmost portion 142T of the bottom surface of the first gate spacer 142 may be formed lower than the topmost portion 120T' of the top surface of the topmost first channel, that is, the first channel 120d. In some embodiments, due to the second recess 220R, the topmost portion 242T of the bottom surface of the second gate spacer 242 may be formed lower than the topmost portion 220T' of the top surface of the topmost second channel, that is, the second channel 220d. In another embodiment where the formation of the second recess 220R is omitted, the topmost portion 242T of the bottom surface of the second gate spacer 242 may be formed at the same height as the topmost portion 220T' of the top surface of the topmost second channel, that is, the second channel 220d.

Figure 20A:
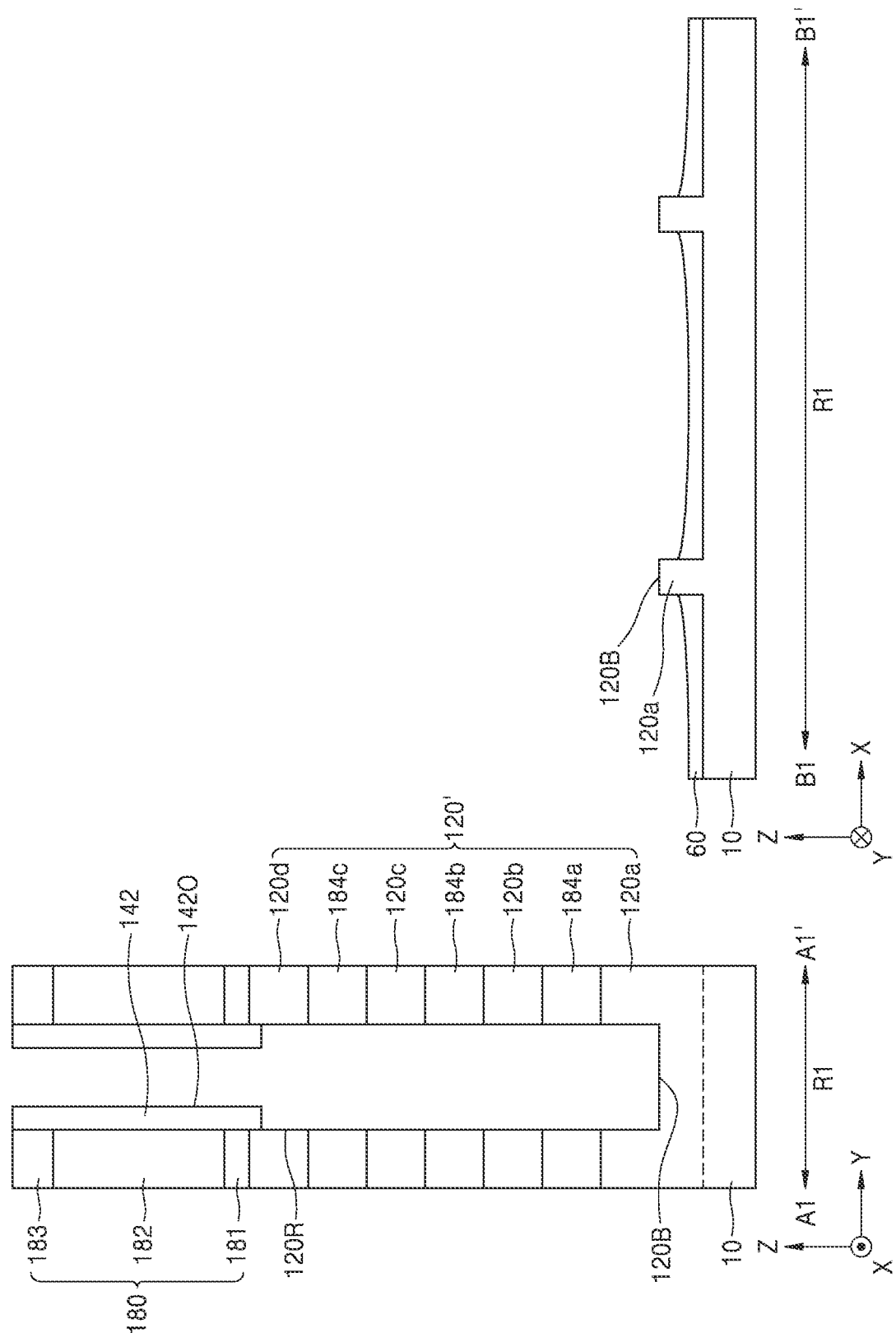
Figure 20B:
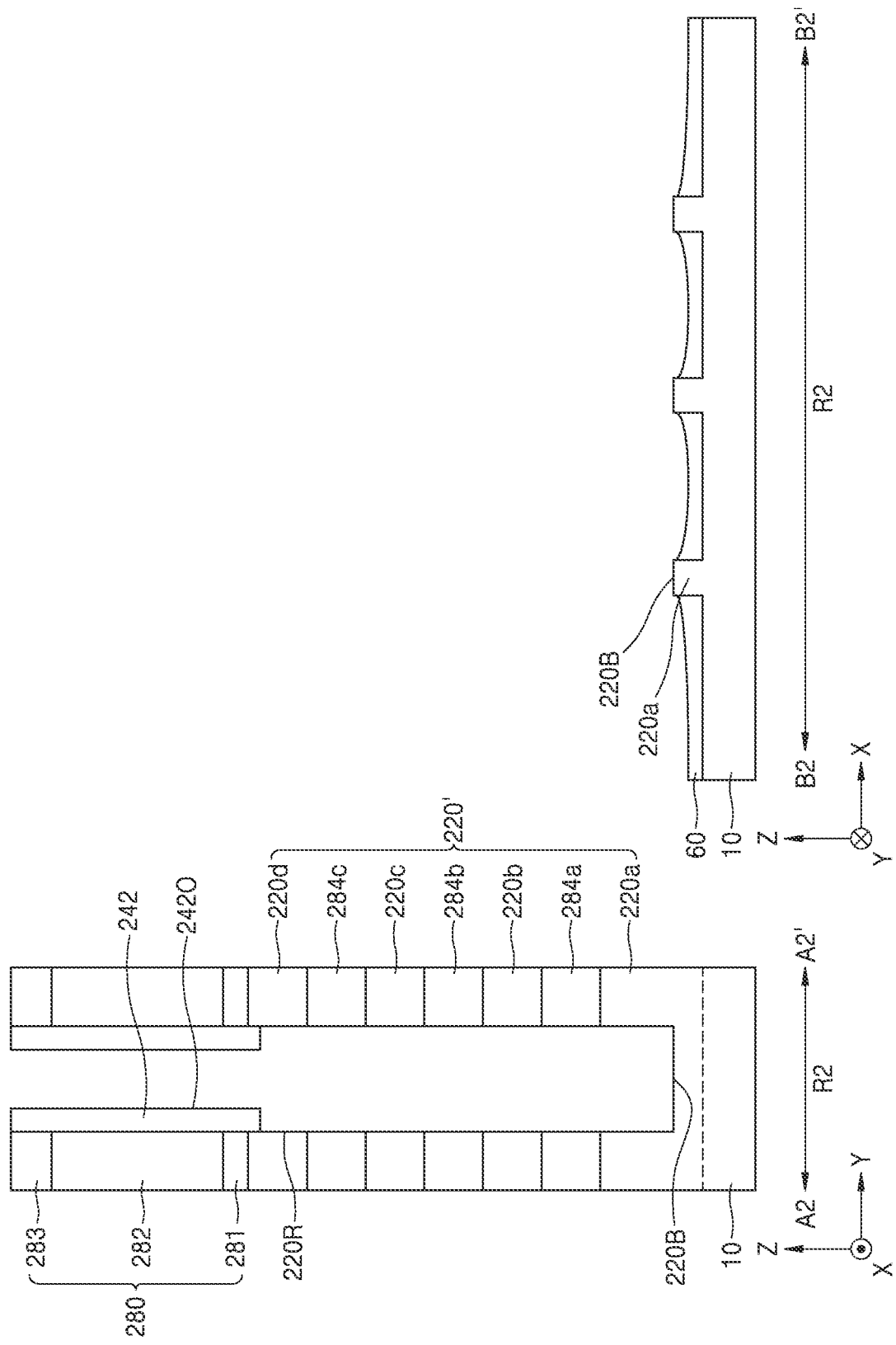

Referring to FIGS. 20A and 20B, the first fin structure 120' may be further etched in the vertical direction, such that the first recess 120R extends to below the top surface of a bottommost first channel, that is, the first channel 120a. In some embodiments, the first fin structure 120' may be further etched in a horizontal direction (e.g., the Y direction), such that at least some of side surfaces of the first recess 120R are formed closer to the first dummy gate structure 180 in the horizontal direction (the Y direction) than the outer side surface 142O of the first gate spacer 142 is. In other words, a distance from at least some side surfaces of the first recess 120R to the first dummy gate structure 180 may be smaller than a distance from the outer side surface 142O of the first gate spacer 142 to the first dummy gate structure 180 in the horizontal direction. In other words, anisotropic etching and isotropic etching may be performed to the first recess 120R.

Also, the second fin structure 220' may be further etched in the vertical direction, such that the second recess 220R extends to below the top surface of a bottommost second channel, that is, the second channel 220a. In some embodiments, the second recess 220R may be deeper than first recess 120R. In other words, the second fin structure 220' may be etched, such that the bottommost portion 220B of the top surface of the second fin structure 220' becomes lower than the bottommost portion 120B of the top surface of the first fin structure 120'. In some embodiments, the second fin structure 220' may be further etched in a horizontal direction (e.g., the Y direction), such that at least some of side surfaces of the second recess 220R are formed closer to the second dummy gate structure 280 in the horizontal direction (the Y direction) than the outer side surface 242O of the second gate spacer 242 is. In other words, a distance from at least some side surfaces of the second recess 220R to the second dummy gate structure 280 may be smaller than a distance from the outer side surface 242O of the second gate spacer 242 to the second dummy gate structure 280 in the horizontal direction. In other words, anisotropic etching and isotropic etching may be performed to the second recess 220R.

Figure 21A:
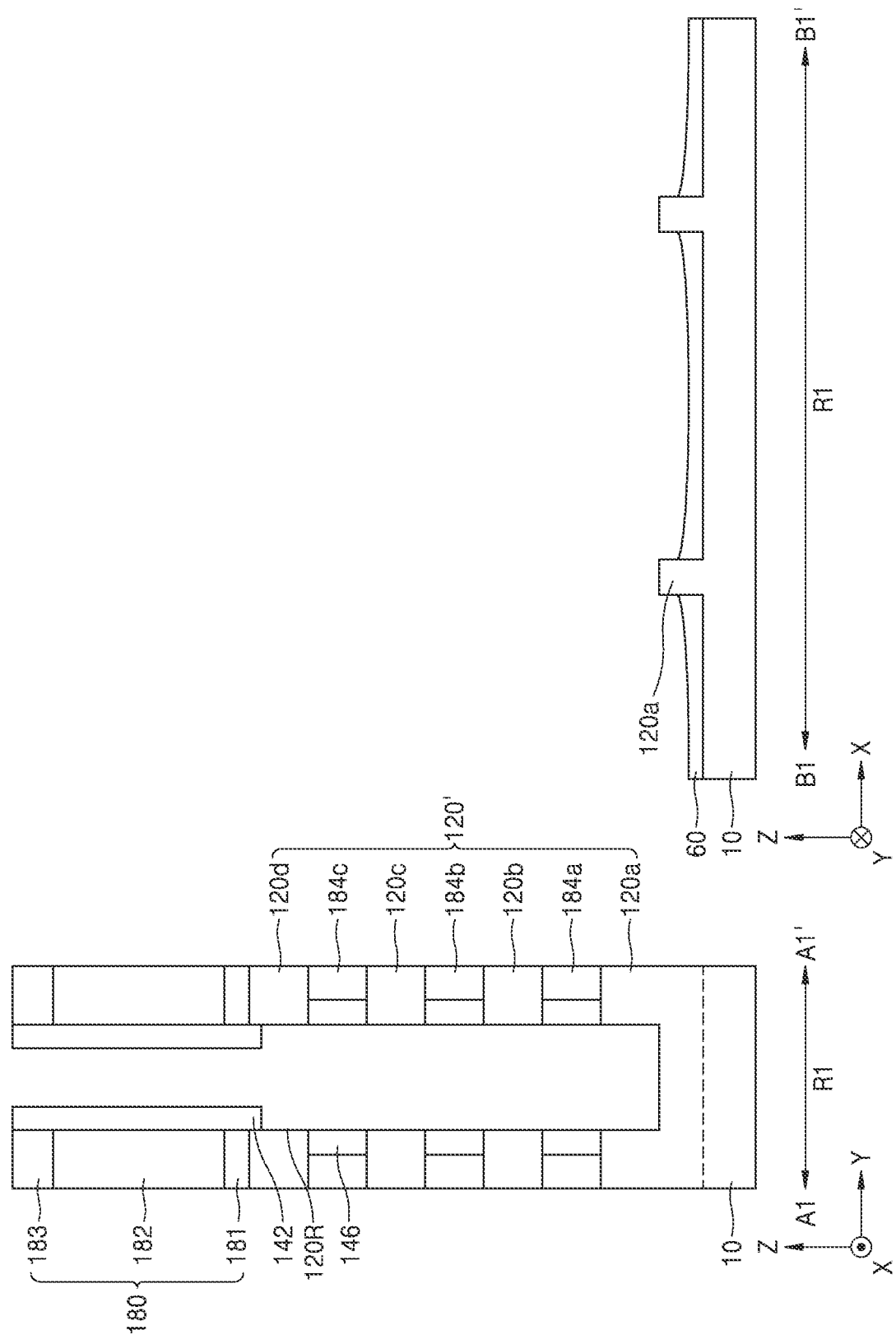
Figure 21B:
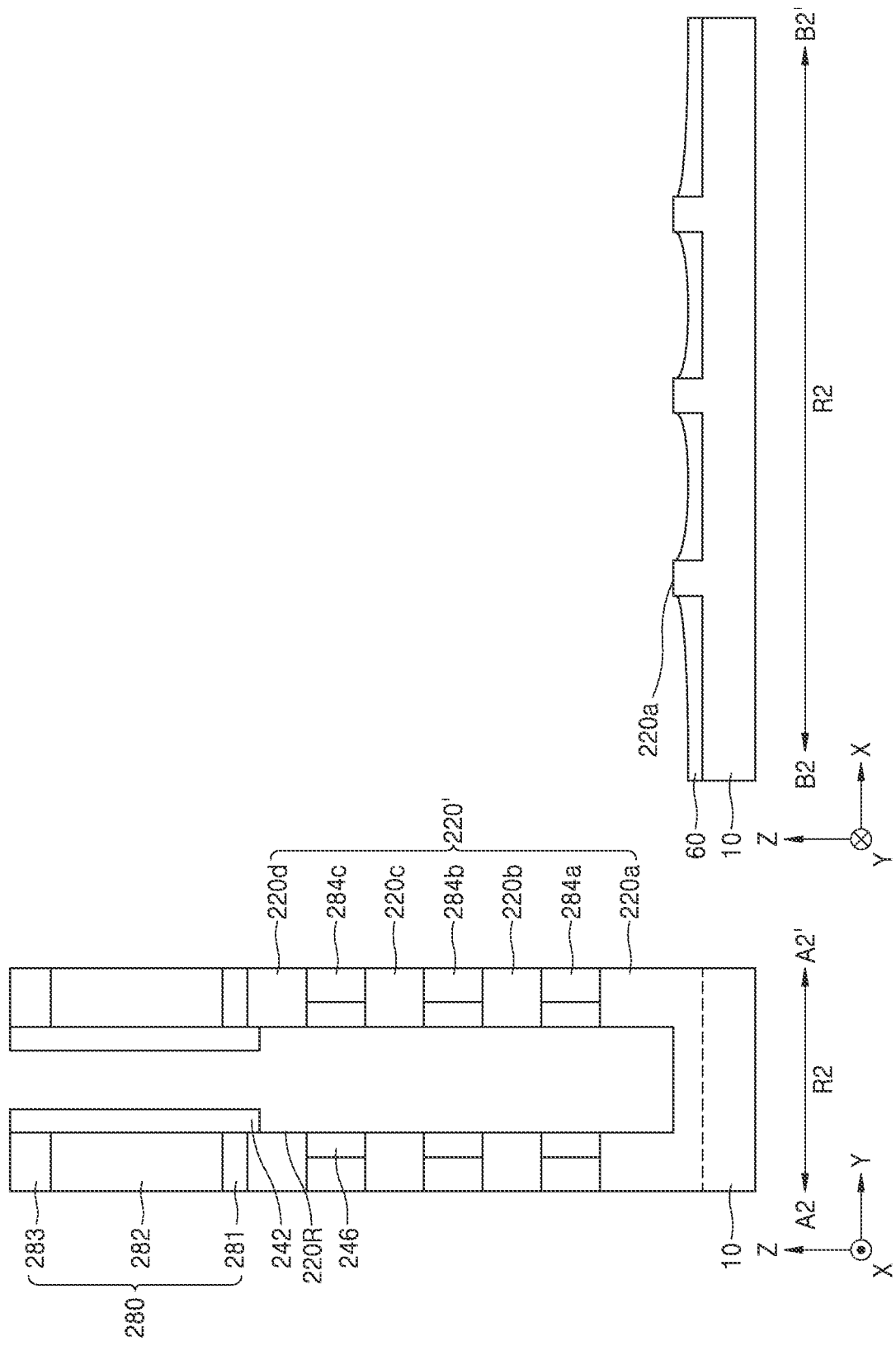

Referring to FIGS. 21A and 21B, a plurality of first openings exposing the top surfaces of first channels 120a to 120c, the bottom surfaces of first channels 120b to 120d, and the side surfaces of the first sacrificial layers 184a to 184c may be formed by etching side portions of the first sacrificial layers 184a to 184c, and first inner spacers 146 may be formed in the first openings, respectively. For example, a bottommost first opening from among the first openings may expose the top surface of the bottommost first channel, that is, the first channel 120a, the bottom surface of a first channel 120b adjacent to and above the bottommost first channel 120a, and the side surfaces of a bottommost first sacrificial layer, that is, a first sacrificial layer 184a. A topmost first opening from among the first openings may expose the bottom surface of the topmost first channel, that is, the first channel 120d, the top surface of a first channel 120c adjacent to and below the topmost first channel, that is, the first channel 120d, and the side surfaces of a topmost first sacrificial layer, that is, a first sacrificial layer 184c.

In the same regard, a plurality of second openings exposing the top surfaces of second channels 220a to 220c, the bottom surfaces of second channels 220b to 220d, and the side surfaces of the second sacrificial layers 284a to 284c may be formed by etching side portions of the second sacrificial layers 284a to 284c, and second inner spacers 246 may be formed in the second openings, respectively. For example, a bottommost second opening from among the second openings may expose the top surface of the bottommost second channel, that is, the second channel 220a, the bottom surface of a second channel 220b adjacent to and above the bottommost second channel, that is, the second channel 220a, and the side surfaces of a bottommost second sacrificial layer, that is, a second sacrificial layer 284a. A topmost second opening from among the second openings may expose the bottom surface of the topmost second channel, that is, the second channel 220d, that is, the second channel 220d, the top surface of a second channel 220c adjacent to and below the topmost second channel, that is, the second channel 220d, and the side surfaces of a topmost second sacrificial layer, that is, a second sacrificial layer 284c.

Figure 22A:
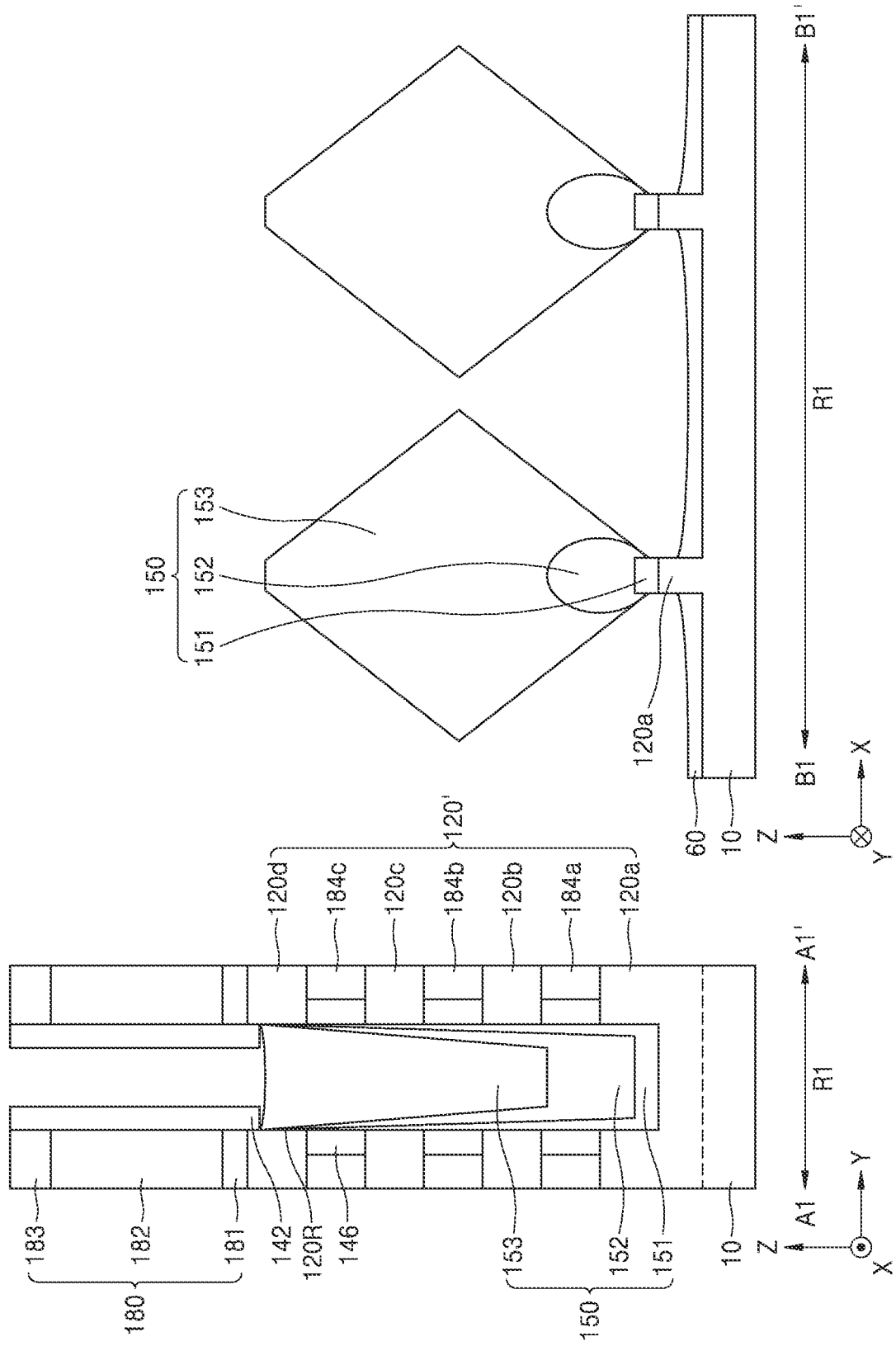
Figure 22B:
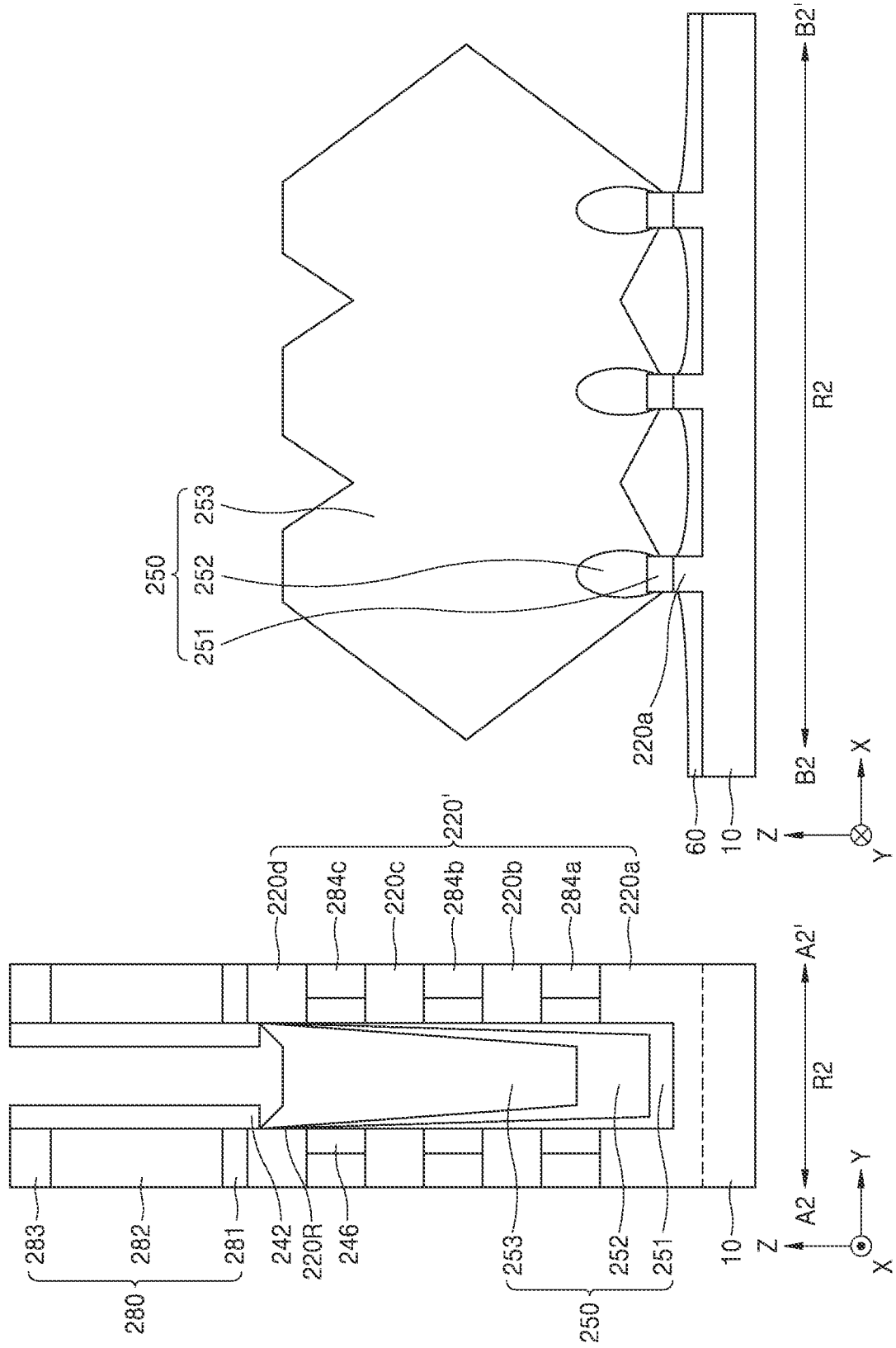

Referring to FIGS. 22A and 22B, the first source/drain structure 150 in the first recess 120R of the first fin structure 120' and the second source/drain structure 250 in the second recess 220R of the second fin structure 220' may be formed through SEG. For example, the first to third source/drain layers 151 to 153 may be formed in the first recess 120R, and the first to third source/drain layers 251 to 253 may be formed in the second recess 220R.

Referring to FIG. 23, in some embodiments, the second source/drain structure 250 may be further grown through SEG. For example, a fourth source/drain layer 254 may be formed in the second recess 220R of the second fin structure 220', e.g., on the third source/drain layer 253. Growth of the first source/drain structure 150 may be suppressed while the second source/drain structure 250 is being further grown.

Figure 24A:
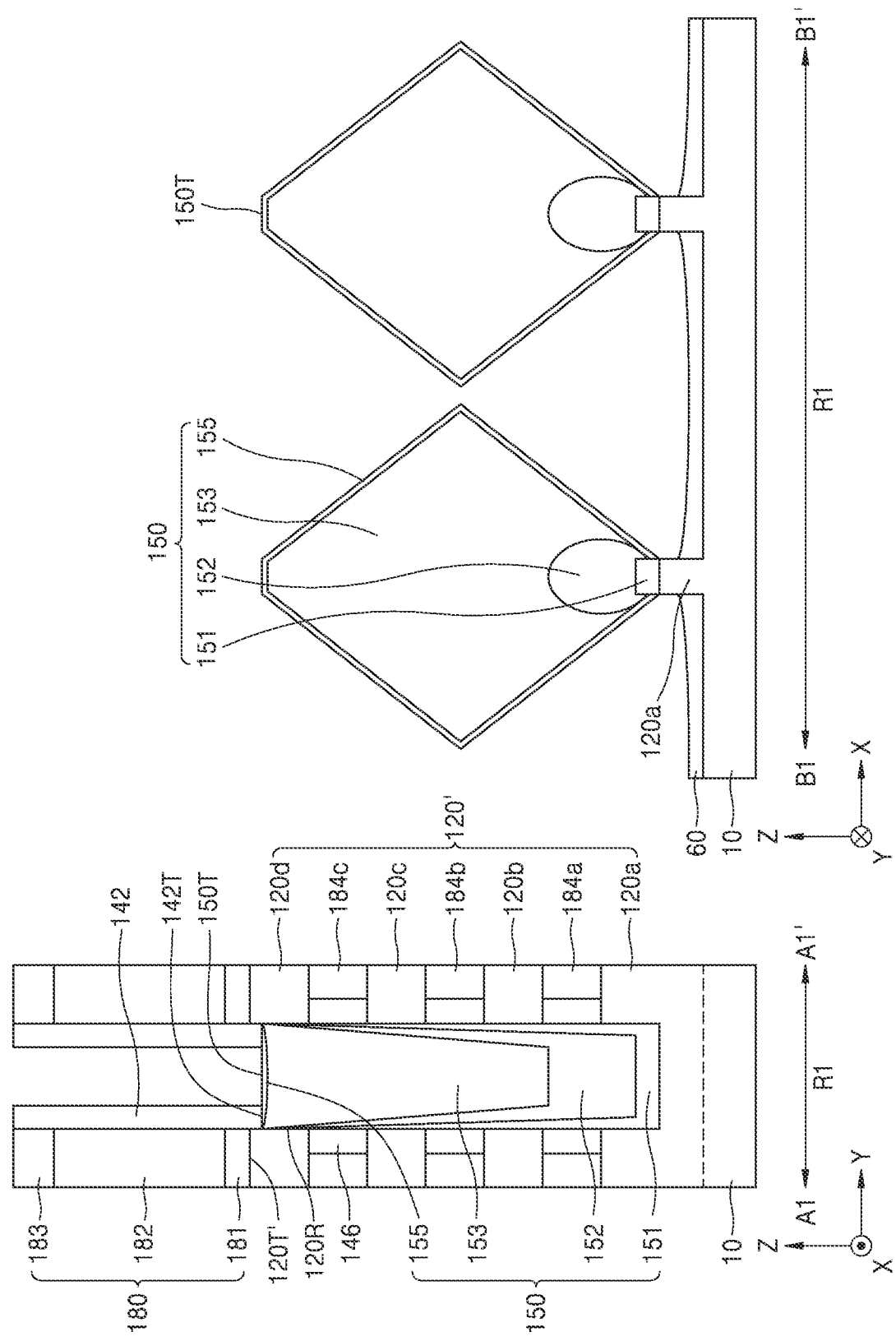
Figure 24B:
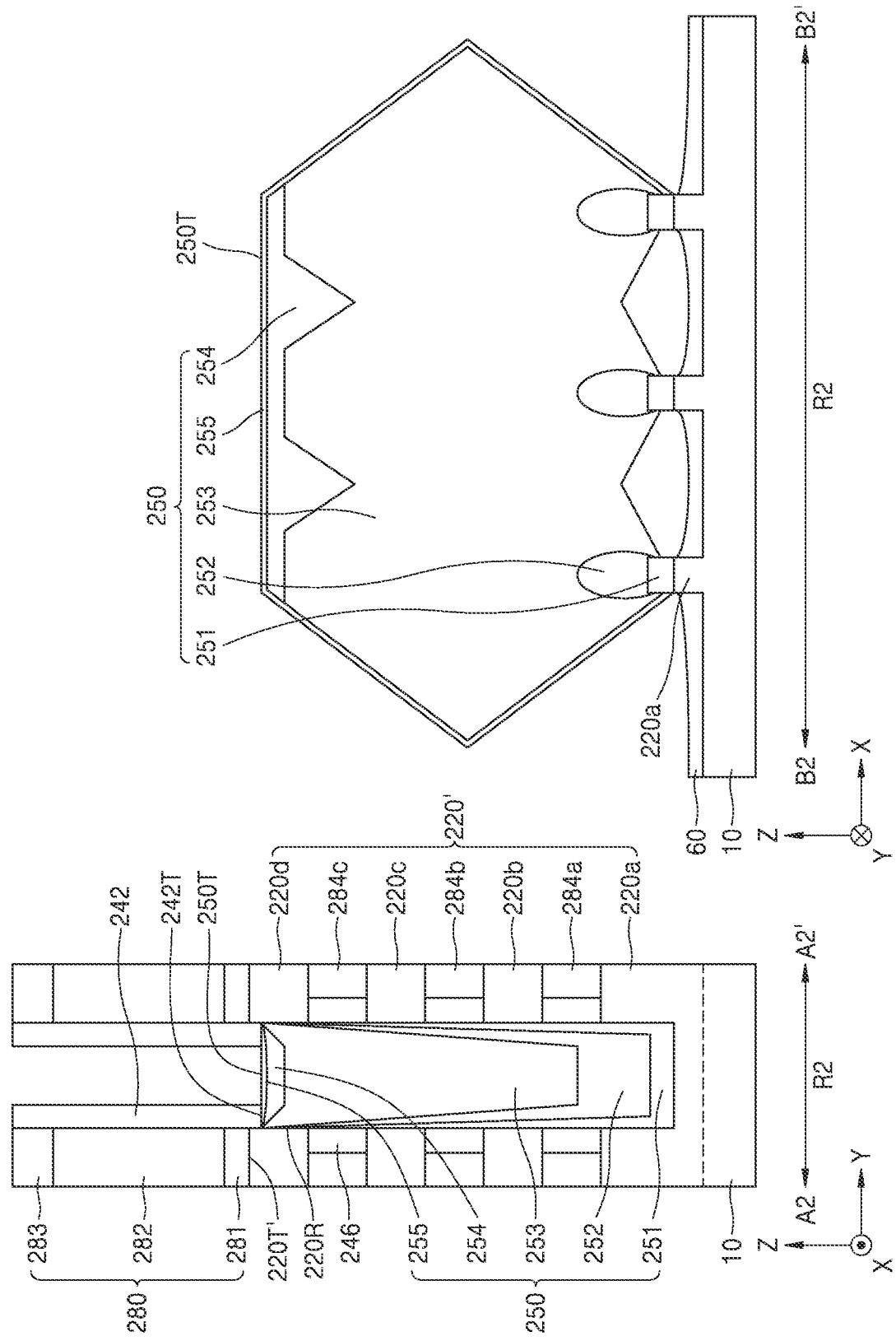

Referring to FIGS. 24A and 24B, in some embodiments, the first source/drain structure 150 and the second source/drain structure 250 may be further grown through SEG. For example, a capping layer 155 in the first recess 120R and a capping layer 255 in the second recess 220R may be formed.

Since the topmost portion 142T of the bottom surface of the first gate spacer 142 is lower than the topmost portion 120T' of the top surface of the topmost first channel, that is, the first channel 120d, the topmost portion 150T of the top surface of the first source/drain structure 150 may be lower than the topmost portion 120T' of the top surface of the topmost first channel, that is, the first channel 120d. In some embodiments, for example, when the topmost portion 242T of the bottom surface of the second gate spacer 242 is formed lower than the topmost portion 220T' of the top surface of the topmost second channel, that is, the second channel 220d, the topmost portion 250T of the top surface of the second source/drain structure 250 may be formed lower than the topmost portion 220T' of the top surface of the topmost second channel, that is, the second channel 220d. In an embodiment in which the topmost portion 242T of the bottom surface of the second gate spacer 242 is instead formed at the same height as the topmost portion 220T of the top surface of the topmost second channel, that is, the second channel 220d, the topmost portion 250T of the second source/drain structure 250 may be formed at the same height as the topmost portion 220T of the top surface of the topmost second channel, that is, the second channel 220d or higher than the topmost portion 220T of the top surface of the topmost second channel, that is, the second channel 220d. Operations for growing the first source/drain structure 150 and the second source/drain structure 250 are the same as the operations described above with reference to FIGS. 11A to 12B.

Figure 25B:
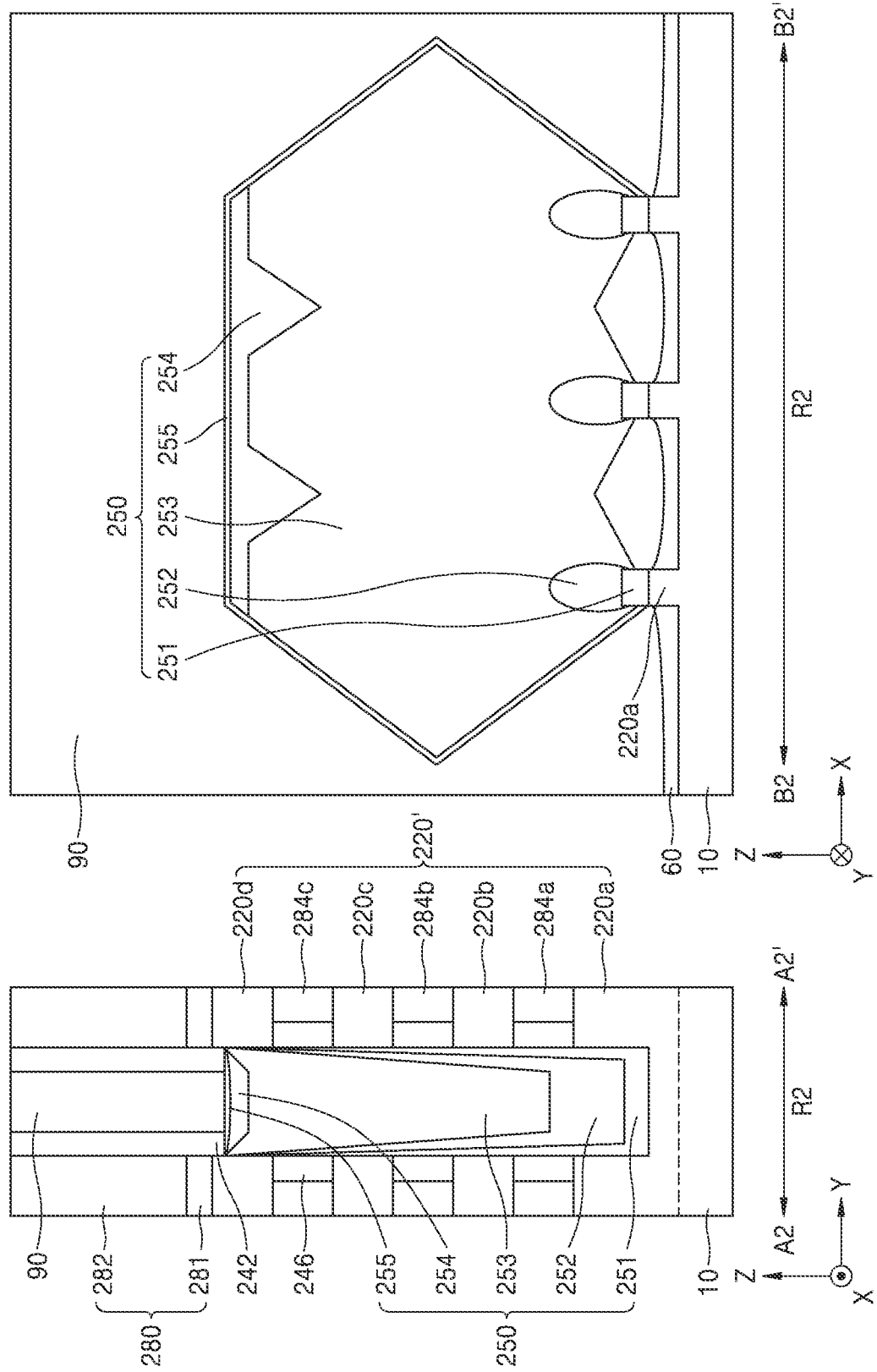

Referring to FIGS. 25A and 25B, the interlayer insulation layer 90 may be formed on the first source/drain structure 150, the second source/drain structure 250, the first gate spacer 142, the second gate spacer 242, and the device isolation layer 60. While the interlayer insulation layer 90 is being formed, the first dummy gate mask layer 183 (refer to FIG. 24A) and the second dummy gate mask layer 283 (refer to FIG. 24B) may also be removed. An operation for forming the interlayer insulation layer 90 is the same as the operation described above with reference to FIGS. 13A and 13B.

Figure 26B:
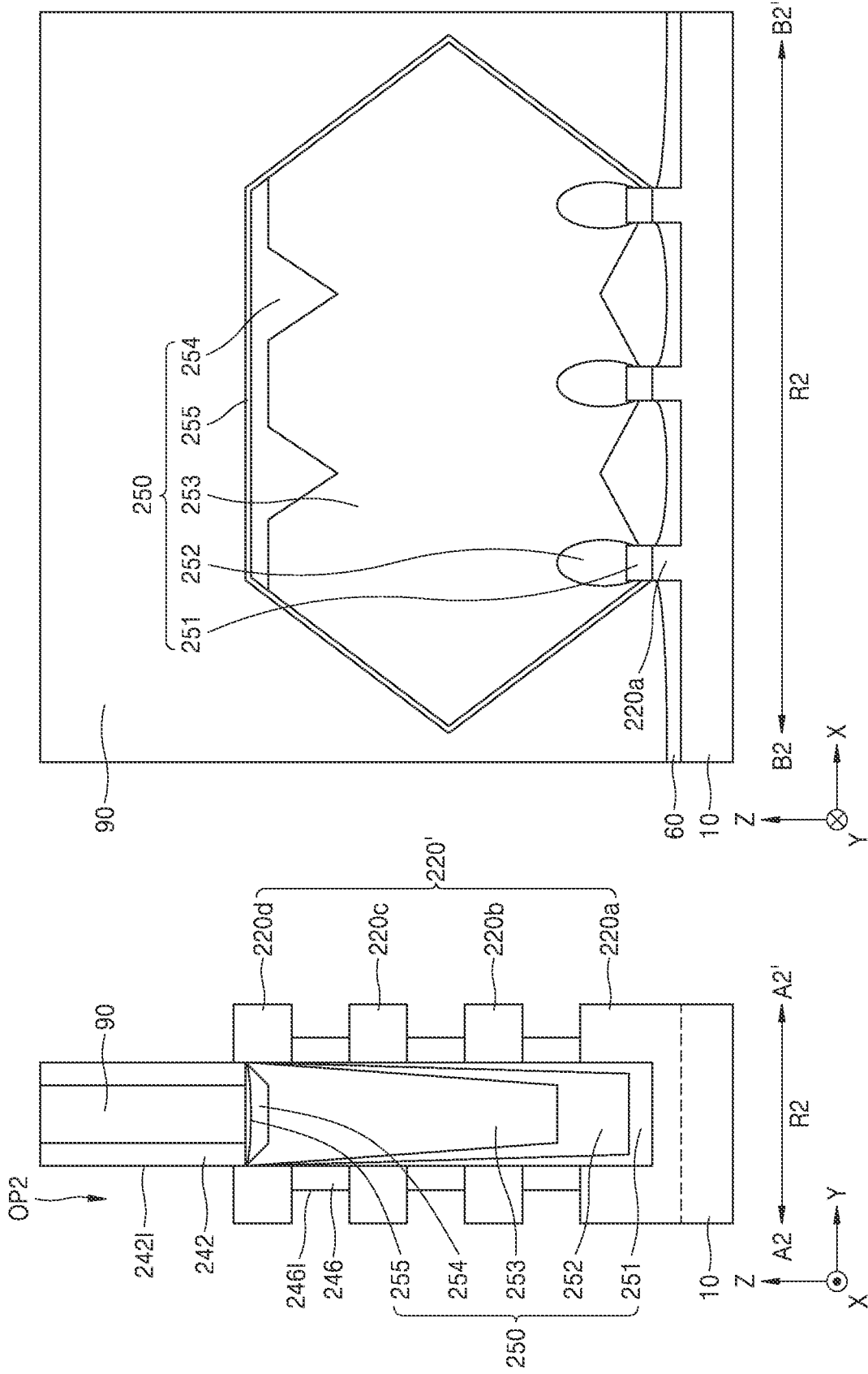

Referring to FIGS. 26A and 26B, the first opening OP1 may be formed by removing the first dummy gate structure 180 (refer to FIG. 25A) and the first sacrificial layers 184a to 184c (refer to FIG. 25A), and the second opening OP2 may be formed by removing the second dummy gate structure 280 (refer to FIG. 25B) and the second sacrificial layers 284a to 284c (refer to FIG. 25B). The first opening OP1 may expose the top surfaces of the first channels 120a to 120d, the bottom surfaces of the first channels 120b to 120d, the inner side surfaces 142I of the first gate spacers 142, and inner side surfaces 146I of the first inner spacers 146, and the second opening OP2 may expose the top surfaces of the second channels 220a to 220d, the bottom surfaces of the second channels 220b to 120d, the inner side surfaces 242I of the second gate spacers 242, and inner side surfaces 246I of the second inner spacers 246.

The first gate structure 130 (refer to FIG. 4A) may be formed in the first opening OP1, and the second gate structure 230 (refer to FIG. 4B) may be formed in the second opening OP2. For example, the gate insulation layers and the gate electrode layers may be sequentially formed on the portions of the first channels 120a to 120d, the portions of the first gate spacers 142, and the inner side surfaces 146I of the first inner spacers 146 that are exposed in the first opening OP1 and the portions of the second channels 220a to 220d, the portions of the second gate spacers 242, and the inner side surfaces 246I of the second inner spacers 246 that are exposed in the second opening OP2 and the gate insulation layers and the gate electrode layers may be planarized to expose the interlayer insulation layer 90, thereby forming the first gate structure 130 (refer to FIG. 4A) and the second gate structure 230 (refer to FIG. 4B).

According to the method described above with reference to FIGS. 15A to 26B, the semiconductor device 2000 described above with reference to FIGS. 4A and 4B may be manufactured.

While the disclosure has been particularly shown and described with reference to embodiments thereof, it will be understood that various changes in form and details may be made therein without departing from the spirit and scope of the following claims.

What is claimed is:
1. A semiconductor device comprising:
a substrate;
a plurality of channels on the substrate apart from one another in a vertical direction;
a gate structure contacting the plurality of channels;
a gate spacer on at least one side surface of the gate structure; and a source/drain structure contacting the plurality of channels, the source/drain structure comprising one of a source structure and a drain structure,
wherein a topmost portion of a bottom surface of the gate spacer is lower than a topmost portion of a top surface of a topmost channel from among the plurality of channels,
a topmost portion of a top surface of the source/drain structure is lower than the topmost portion of the top surface of the topmost channel, and
wherein the topmost portion of the bottom surface of the gate spacer contacts the source/drain structure.

2. The semiconductor device of claim 1, wherein
the gate spacer comprises an inner side surface contacting the gate structure and an outer side surface opposite to the inner side surface, and
the source/drain structure comprises a portion such that a distance from the portion of the source/drain structure to the gate structure in a horizontal direction is smaller than a distance from the outer side surface of the gate spacer to the gate structure in the horizontal direction.

3. The semiconductor device of claim 1, wherein
the topmost portion of the bottom surface of the gate spacer is higher than a bottommost portion of a top surface of a bottommost channel from among the plurality of channels.

4. The semiconductor device of claim 1, wherein the source/drain structure is doped with a p-type dopant.

5. The semiconductor device of claim 1, wherein
a bottom surface of the gate structure contacts the topmost portion of the top surface of the topmost channel.

6. The semiconductor device of claim 1, wherein
the topmost portion of the bottom surface of the gate spacer is higher than a bottom surface of the topmost channel from among the plurality of channels.

7. A semiconductor device comprising:
a substrate comprising a first region and a second region;
a plurality of first channels on the first region apart from one another in a vertical direction;
a plurality of second channels on the second region apart from one another in the vertical direction;
a first gate structure contacting the plurality of first channels;
a second gate structure contacting the plurality of second channels;
a first gate spacer on at least one side surface of the first gate structure;
a second gate spacer on at least one side surface of the second gate structure;
a first source/drain structure contacting the plurality of first channels; and
a second source/drain structure contacting the plurality of second channels,
wherein a topmost portion of a bottom surface of the first gate spacer is lower than a topmost portion of a top surface of a topmost first channel from among the plurality of first channels,
wherein a topmost portion of a top surface of the first source/drain structure is lower than the topmost portion of the top surface of the topmost first channel, and
wherein the topmost portion of a bottom surface of the first gate spacer contacts the first source/drain structure.

8. The semiconductor device of claim 7, wherein
the first source/drain structure comprises a first source/drain layer and a first capping layer directly on the first source/drain layer, and
the second source/drain structure comprises a second source/drain layer, a third source/drain layer on the second source/drain layer, and a second capping layer on the third source/drain layer.

9. The semiconductor device of claim 8, wherein a Si concentration of the first source/drain layer is lower than a Si concentration of the first capping layer, and
wherein a Si concentration of the second source/drain layer is lower than a Si concentration of the second capping layer.

10. The semiconductor device of claim 8, wherein
a Si concentration of the third source/drain layer is lower than a Si concentration of the second source/drain layer.

11. The semiconductor device of claim 8, wherein
the first source/drain layer and the second source/drain layer comprise a substantially same first composition, and
the first capping layer and the second capping layer comprise a substantially same second composition.

12. The semiconductor device of claim 8, wherein
the first source/drain layer, the second source/drain layer, and the third source/drain layer comprise SiGe.

13. The semiconductor device of claim 8, wherein
the first source/drain layer, the second source/drain layer, and the third source/drain layer comprise a p-type dopant.

14. The semiconductor device of claim 7, wherein
a distance from the topmost portion of the top surface of the topmost first channel to a bottommost portion of a top surface of a bottommost first channel from among the plurality of first channels in the vertical direction is less than a distance from a topmost portion of a top surface of a topmost second channel to a bottommost portion of a top surface of a bottommost second channel from among the plurality of second channels in the vertical direction.

15. The semiconductor device of claim 7, wherein
a topmost portion of a bottom surface of the second gate spacer is lower than a topmost portion of a top surface of a topmost second channel from among the plurality of second channels.

16. The semiconductor device of claim 7, wherein
a height of a topmost portion of a bottom surface of the second gate spacer is greater than or equal to a height of a bottommost portion of a top surface of a bottommost second channel from among the plurality of second channels.

17. A semiconductor device comprising:
a substrate comprising a first region and a second region;
a plurality of first channels on the first region apart from one another in a vertical direction;
a plurality of second channels on the first region apart from one another in the vertical direction;
a plurality of third channels on the second region apart from one another in the vertical direction;
a plurality of fourth channels on the second region apart from one another in the vertical direction;
a first gate structure contacting the plurality of first channels;
a second gate structure contacting the plurality of second channels;
a third gate structure contacting the plurality of third channels and the plurality of fourth channels;
a first gate spacer on a side surface of the first gate structure;

a second gate spacer on a side surface of the second gate structure;

a third gate spacer on a side surface of the third gate structure;

a first source/drain structure contacting the plurality of first channels;

a second source/drain structure contacting the plurality of second channels; and a third source/drain structure contacting the plurality of third channels and the plurality of fourth channels, wherein a topmost portion of a bottom surface of the first gate spacer is lower than a topmost portion of a top surface of a topmost first channel from among the plurality of first channels, a topmost portion of a top surface of the first source/drain structure is lower than the topmost portion of the top surface of the topmost first channel, and wherein the topmost portion of a bottom surface of the first gate spacer contacts the first source/drain structure.

18. The semiconductor device of claim 17, wherein
the first source/drain structure and the second source/drain structure are separated from one another, and
the third source/drain structure contacts the plurality of third channels and the plurality of fourth channels.

19. The semiconductor device of claim 17, wherein
a horizontal distance between the plurality of first channels and the plurality of second channels is greater than a horizontal distance between the plurality of third channels and the plurality of fourth channels.

20. The semiconductor device of claim 17, wherein
a length of the first source/drain structure in the vertical direction is less than a length of the third source/drain structure in the vertical direction.

21. The semiconductor device of claim 17, wherein
the first source/drain structure comprises a first predetermined number of layers, and
the third source/drain structure comprises a second predetermined number of layers, the second predetermined number being greater than the first predetermined number.

* * * * *